(12) United States Patent  (10) Patent No.: US 10,655,792 B2
Jiang  (45) Date of Patent: May 19, 2020

(54) LED BULB LAMP

(71) Applicant: ZHEJIANG SUPER LIGHTING ELECTRIC APPLIANCE CO., LTD., Zhejiang (CN)

(72) Inventor: Tao Jiang, Zhejiang (CN)

(73) Assignee: ZHEJIANG SUPER LIGHTING ELECTRIC APPLIANCE CO., LTD., Zhejiang (CN)

( * ) Notice: Subject to any disclaimer, the term of this patent is extended or adjusted under 35 U.S.C. 154(b) by 207 days.

(21) Appl. No.: 15/723,297

(22) Filed: Oct. 3, 2017

(65) Prior Publication Data

US 2018/0045379 A1  Feb. 15, 2018

Related U.S. Application Data

(63) Continuation-in-part of application No. 15/308,995, filed on Nov. 4, 2016, which is a continuation-in-part
(Continued)

(30) Foreign Application Priority Data

Sep. 28, 2014  (CN) .......................... 2014 1 0510593
Feb. 2, 2015  (CN) .......................... 2015 1 0053077
(Continued)

(51) Int. Cl.
*F21K 9/232*  (2016.01)
*F21K 9/68*  (2016.01)
(Continued)

(52) U.S. Cl.
CPC ................ *F21K 9/232* (2016.08); *F21K 9/61* (2016.08); *F21K 9/68* (2016.08); *F21V 23/06* (2013.01);
(Continued)

(58) Field of Classification Search
CPC ... F21K 9/232; F21K 9/61; F21K 9/68; F21V 23/06
See application file for complete search history.

(56) References Cited

U.S. PATENT DOCUMENTS 8,455,895 B2  6/2013  Chai et al.
8,933,619 B1  1/2015  Ou
(Continued)

FOREIGN PATENT DOCUMENTS

CN  201448620 U  5/2010
CN  101826588 A  9/2010
(Continued)

*Primary Examiner* — Thien M Le
*Assistant Examiner* — Asifa Habib
(74) *Attorney, Agent, or Firm* — Andrew M. Calderon; Roberts Calderon Safran & Cole, P.C.

(57) ABSTRACT

An LED filament includes LED chips in an array, two conductive electrodes, conductive wires, an enclosure coating, and an auxiliary piece. The chips are connected with one another. The electrodes are corresponding to the chips. Each electrode is connected to a corresponding LED chip at an end of the array. The wires connect the chips and the electrodes. The wires are respectively between every two adjacent chips and between each of the electrodes and the corresponding chip at an end of the array. The coating is on two or more sides of the array and the two electrodes. A portion of each of the electrodes is exposed from the coating. The auxiliary piece is in the coating and overlaps one of the wires between each of the electrodes and the corresponding one of the two chips respectively at two ends of the array on a radial direction of the filament.

37 Claims, 33 Drawing Sheets

Related U.S. Application Data of application No. PCT/CN2015/090815, filed on Sep. 25, 2015, application No. 15/723,297, filed on Oct. 3, 2017, which is a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093, application No. 15/723,297, filed on Oct. 3, 2017, which is a continuation-in-part of application No. 15/168,541, filed on May 31, 2016, now Pat. No. 9,995,474.

(30) Foreign Application Priority Data

| Date | | Number |
|---|---|---|
| Jun. 10, 2015 | (CN) | 2015 1 0316656 |
| Jun. 19, 2015 | (CN) | 2015 1 0347410 |
| Aug. 7, 2015 | (CN) | 2015 1 0489363 |
| Aug. 17, 2015 | (CN) | 2015 1 0502630 |
| Sep. 2, 2015 | (CN) | 2015 1 0555889 |
| Dec. 19, 2015 | (CN) | 2015 1 0966906 |
| Jan. 22, 2016 | (CN) | 2016 1 0041667 |
| Apr. 27, 2016 | (CN) | 2016 1 0272153 |
| Apr. 29, 2016 | (CN) | 2016 1 0281600 |
| Jun. 3, 2016 | (CN) | 2016 1 0394610 |
| Jul. 7, 2016 | (CN) | 2016 1 0544049 |
| Jul. 22, 2016 | (CN) | 2016 1 0586388 |
| Nov. 1, 2016 | (CN) | 2016 1 0936171 |
| Dec. 6, 2016 | (CN) | 2016 1 1108722 |
| Jan. 13, 2017 | (CN) | 2017 1 0024877 |
| Feb. 14, 2017 | (CN) | 2017 1 0079423 |
| Mar. 9, 2017 | (CN) | 2017 1 0138009 |
| Mar. 23, 2017 | (CN) | 2017 1 0180574 |
| Apr. 11, 2017 | (CN) | 2017 1 0234618 |
| May 8, 2017 | (CN) | 2017 1 0316641 |
| Sep. 18, 2017 | (CN) | 2017 1 0839083 |
| Sep. 26, 2017 | (CN) | 2017 1 0883625 |

(51) Int. Cl.

| | |
|---|---|
| *F21V 23/06* | (2006.01) |
| *F21K 9/61* | (2016.01) |
| *F21Y 115/10* | (2016.01) |
| *F21V 29/503* | (2015.01) |
| *F21Y 107/70* | (2016.01) |
| *F21Y 109/00* | (2016.01) |

(52) U.S. Cl.

CPC ......... *F21V 29/503* (2015.01); *F21Y 2107/70* (2016.08); *F21Y 2109/00* (2016.08); *F21Y 2115/10* (2016.08)

(56) References Cited

U.S. PATENT DOCUMENTS

| | | | |
|---|---|---|---|
| 9,016,900 | B2 | 4/2015 | Takeuchi et al. |
| 9,761,765 | B2 | 9/2017 | Basin et al. |
| 9,982,854 | B2 | 5/2018 | Ma et al. |
| 10,281,129 | B1* | 5/2019 | Lai ............... F21K 9/232 |
| 2013/0058080 | A1 | 3/2013 | Ge et al. |
| 2013/0058580 | A1 | 3/2013 | Ge et al. |
| 2013/0147348 | A1 | 6/2013 | Motoya et al. |
| 2013/0235592 | A1* | 9/2013 | Takeuchi et al. ..... F21V 23/002 362/363 |
| 2013/0293098 | A1 | 11/2013 | Li et al. |
| 2014/0268779 | A1 | 9/2014 | Sorensen et al. |
| 2014/0369036 | A1 | 12/2014 | Feng |
| 2015/0069442 | A1 | 3/2015 | Liu et al. |
| 2015/0070871 | A1 | 3/2015 | Chen et al. |
| 2015/0211723 | A1* | 7/2015 | Athalye ............... F21V 29/2225 9/135 |
| 2015/0255440 | A1* | 9/2015 | Hsieh .................. F21K 9/232 257/88 |
| 2016/0223180 | A1 | 8/2016 | Jiang |
| 2016/0223182 | A1 | 8/2016 | Jiang |
| 2016/0238199 | A1* | 8/2016 | Yeung et al. ......... F21K 9/1355 |
| 2016/0363267 | A1 | 12/2016 | Jiang et al. |
| 2017/0012177 | A1 | 1/2017 | Trottier |
| 2017/0016582 | A1 | 1/2017 | Yang et al. |
| 2017/0051878 | A1 | 2/2017 | Jiang et al. |
| 2017/0074462 | A1 | 3/2017 | Jiang et al. |
| 2017/0084809 | A1 | 3/2017 | Jiang et al. |
| 2017/0130906 | A1 | 5/2017 | Jiang et al. |

FOREIGN PATENT DOCUMENTS

| | | |
|---|---|---|
| CN | 101834263 | 9/2010 |
| CN | 102121576 A | 7/2011 |
| CN | 102364710 | 2/2012 |
| CN | 202209551 U | 5/2012 |
| CN | 202252991 | 5/2012 |
| CN | 202252991 U | 5/2012 |
| CN | 202253168 U | 5/2012 |
| CN | 102751274 | 10/2012 |
| CN | 102751274 A | 10/2012 |
| CN | 202719450 U | 2/2013 |
| CN | 101968181 B | 3/2013 |
| CN | 202834823 U | 3/2013 |
| CN | 103123949 | 5/2013 |
| CN | 103123949 A | 5/2013 |
| CN | 203367275 | 12/2013 |
| CN | 203367275 U | 12/2013 |
| CN | 203367375 U | 12/2013 |
| CN | 103560128 | 2/2014 |
| CN | 103560128 A | 2/2014 |
| CN | 103682042 A | 3/2014 |
| CN | 203477967 U | 3/2014 |
| CN | 103890481 A | 6/2014 |
| CN | 203628311 U | 6/2014 |
| CN | 203628391 | 6/2014 |
| CN | 203628391 U | 6/2014 |
| CN | 203628400 U | 6/2014 |
| CN | 203656627 U | 6/2014 |
| CN | 203671312 U | 6/2014 |
| CN | 103939758 | 7/2014 |
| CN | 103939758 A | 7/2014 |
| CN | 103956421 A | 7/2014 |
| CN | 103972364 | 8/2014 |
| CN | 103972364 A | 8/2014 |
| CN | 103994349 | 8/2014 |
| CN | 103994349 A | 8/2014 |
| CN | 203771136 U | 8/2014 |
| CN | 203857313 U | 10/2014 |
| CN | 203880468 U | 10/2014 |
| CN | 203910792 U | 10/2014 |
| CN | 204062539 U | 12/2014 |
| CN | 104295945 A | 1/2015 |
| CN | 104319345 | 1/2015 |
| CN | 104319345 A | 1/2015 |
| CN | 204083941 | 1/2015 |
| CN | 204083941 U | 1/2015 |
| CN | 204153513 U | 2/2015 |
| CN | 104456165 | 3/2015 |
| CN | 104456165 A | 3/2015 |
| CN | 204289439 | 4/2015 |
| CN | 204289439 U | 4/2015 |
| CN | 104600174 | 5/2015 |
| CN | 104600174 A | 5/2015 |
| CN | 104600181 A | 5/2015 |
| CN | 204328550 U | 5/2015 |
| CN | 104716247 A | 6/2015 |
| CN | 204387765 | 6/2015 |
| CN | 204387765 U | 6/2015 |
| CN | 104913217 A | 9/2015 |

(56) References Cited

FOREIGN PATENT DOCUMENTS

| | | |
|---|---|---|
| CN | 204678100 | 9/2015 |
| CN | 105042354 A | 11/2015 |
| CN | 105090789 A | 11/2015 |
| CN | 105098032 A | 11/2015 |
| CN | 105140381 | 12/2015 |
| CN | 105140381 A | 12/2015 |
| CN | 105161608 | 12/2015 |
| CN | 105161608 A | 12/2015 |
| CN | 105371243 | 3/2016 |
| CN | 105371243 A | 3/2016 |
| CN | 205081145 U | 3/2016 |
| CN | 105609621 | 5/2016 |
| CN | 105609621 A | 5/2016 |
| CN | 106468405 A | 3/2017 |
| CN | 106898681 A | 6/2017 |
| CN | 107123641 A | 9/2017 |
| CN | 107170733 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |
| CN | 105090782 B | 7/2018 |
| CN | 207849021 U | 9/2018 |
| EP | 2535640 A1 | 12/2012 |
| EP | 2567145 A1 | 3/2013 |
| EP | 2760057 | 7/2014 |
| EP | 2760057 A1 | 7/2014 |
| GB | 2547085 A | 8/2017 |
| JP | 3075689 | 2/2001 |
| JP | 3075689 U | 2/2001 |
| JP | 2001126510 A | 5/2001 |
| JP | 2003037239 A | 2/2003 |
| JP | 2013225587 A | 10/2013 |
| WO | 2011137662 | 11/2011 |
| WO | 2012053134 A1 | 4/2012 |
| WO | 2014012346 A1 | 1/2014 |
| WO | 2014167458 | 10/2014 |
| WO | 2014167458 A1 | 10/2014 |
| WO | 2017037010 | 3/2017 |
| WO | 2017037010 A1 | 3/2017 |

\* cited by examiner

LED BULB LAMP

CROSS-REFERENCE TO RELATED APPLICATIONS

This application is a continuation-in-part application claiming benefits of U.S. application Ser. No. 15/308,995 filed on 2016 Nov. 4, U.S. application Ser. No. 15/168,541 filed on 2016 May 31, and U.S. application Ser. No. 15/499,143 filed on 2017 Apr. 27, which is hereby incorporated by reference in their entirety.

This application claims priority to Chinese Patent Applications No. 201410510593.6 filed on 2014 Sep. 28; No. 201510053077.X filed on 2015 Feb. 2; No. 201510489363.0 filed on 2015 Aug. 7; No. 201510555889.4 filed on 2015 Sep. 2; No. 201510316656.9 filed on 2015 Jun. 10; No. 201510347410.8 filed on 2015 Jun. 19; No. 201510502630.3 filed on 2015 Aug. 17; No. 201510966906.3 filed on 2015 Dec. 19; No. 201610041667.5 filed on 2016 Jan. 22; No. 201610281600.9 filed on 2016 Apr. 29; No. 201610272153.0 filed on 2016 Apr. 27; No. 201610394610.3 filed on 2016 Jun. 3; No. 201610586388.7 filed on 2016 Jul. 22; No. 201610544049.2 filed on 2016 Jul. 7; No. 201610936171.4 filed on 2016 Nov. 1; No. 201611108722.4 filed on 2016 Dec. 6; No. 201610281600.9 filed on 2016 Apr. 29; No. 201710024877.8 filed on 2017 Jan. 13; No. 201710079423.0 filed on 2017 Feb. 14; No. 201710138009.2 filed on 2017 Mar. 9; No. 201710180574.5 filed on 2017 Mar. 23; No. 201710234618.8 filed on 2017 Apr. 11; No. 201710316641.1 filed on 2017 May 8; No. 201710839083.7 filed on 2017 Sep. 18; and No. 201710883625.0 filed on 2017 Sep. 26, which is hereby incorporated by reference in their entirety.

FIELD OF THE INVENTION

The disclosure relates to a lighting field, in particular, to Led filaments and LED light bulbs.

BACKGROUND

LED lamps have the advantages of long service life, small size and environmental protection, etc., so their applications are increasing more and more. However, the light emitting surface of the LED lamps generally is small due to the LED packaging holder and the substrate which blocks the light, and the LED lamps presents the status of lighting in half of circumference where the angle of the light distribution is less than 180 degree.

To achieve a similar light distribution with incandescent lamp of which the light distribution is more than 180 degree, some LED bulb lamps adopt COB (Chip On Board) integrated light sources and is configured with light distribution lens, and some adopt SMD (Surface Mount Technology) light sources arranged on the substrate in an encircling manner. Nevertheless, the light shape curves of these LED bulb lamps are not smooth and have higher local jitter, which result in a situation in which the brightness transits unevenly.

In addition, the traditional LED bulb lamp generally has a glass lamp housing which is fragile and the glass fragments can hurt users easily, further, after being broken, the exposed and charged part in the lamp body, such as the light source, solder joints on the substrate or the wires on the lamp substrate etc., will lead to an accident of electric shock easily and result in the risk of personal safety.

Recently, LED light bulbs each of which has an LED filament for emitting light are commercially available. The LED filament includes a substrate plate and several LEDs on the substrate plate. The effect of illumination of the LED light bulb has room for improvement. A traditional light bulb having a tungsten filament can create the effect of even illumination light because of the nature of the tungsten filament; however, the LED filament is hard to generate the effect of even illumination light. There are some reasons as to why the LED filament is hard to create the effect of even illumination light. One reason is that the substrate plate blocks light rays emitted from the LEDs. Another reason is that the LED generates point source of light, which leads to the concentration of light rays. In contrast, to reach the effect of even illumination light requires even distribution of light rays.

In addition, a traditional light bulb having a tungsten filament with elaborate curvatures and varied shapes could present an aesthetical appearance, especially when the traditional light bulb is lighting. The LED filament of the LED light bulb is difficult to be bent to form curvature because the substrate plate causes less flexibility. Further, electrodes on the LED filament and wires connecting the electrodes with the LEDs may be broken or disconnected when the LED filament is bent due to stress concentration.

SUMMARY OF THE INVENTION

The disclosure relates to an LED light bulb (i.e., LED bulb lamp) comprising an LED lamp substrate having at least one LED light source mounted thereon; and an electrical isolation assembly disposed on the LED lamp substrate, wherein the electrical isolation assembly electrically isolates the LED lamp substrate's charged part from outside of the LED lamp substrate.

Preferably, the electrical isolation assembly comprising an electrical isolation unit covering the LED lamp substrate for electrically isolating the charged part on the LED lamp substrate from outside of the LED lamp substrate; and a light processing unit disposed on the electrical isolation unit for converting the outputting direction of the light emitted by the LED light sources.

Preferably, the electrical isolation unit and the light processing unit are integrally formed.

Preferably, the electrical isolation unit is made of electrically insulating materials with high reflectivity.

Preferably, the light processing unit being a cup-shaped structure comprises a main body, a bottom portion and a top portion, wherein the main body is formed between the bottom portion and top portion.

Preferably, the bottom portion is formed with a plurality of through holes, while electrical isolation unit is formed with a plurality of through holes corresponding to the through holes on the bottom portion and the LED light sources. The main body comprises a reflecting surface formed on an inside surface of the main body, and the LED light sources on the LED lamp substrate are arranged inside the main body in an encircling manner, so that the light emitted by each of the LED light sources is reflected towards inside of the main body by the reflecting surface.

Preferably, the electrical isolation assembly further comprises an extending portion which is outwardly extended from the circumferential of the bottom portion, and the extending portion is formed with a plurality of through holes, while the electrical isolation unit is formed with a plurality of through holes corresponding to the through holes on the bottom portion and the LED light sources on the LED lamp substrate. The main body comprises a reflecting surface formed on an outside surface of the main body, and the LED light sources on the LED lamp substrate are arranged outside the main body in an encircling manner, so that the light emitted by each of the LED light sources is reflected towards outside of the main body by the reflecting surface.

Preferably, the bottom portion is hollowed out and the main body is a camber surface. The main body comprises a reflecting surface formed on an outside surface of the main body, and wherein, the LED light sources on the LED lamp substrate are arranged under the light processing unit in an encircling manner so that one part of each of the LED light sources are exposed outside the main body, one part are located under the main body and the rest are exposed inside the main body, such that the light emitted by the part of each of the LED light sources exposed outside the main body is reflected towards outside of the main body by the reflecting surface, the light emitted by the part of each of the LED light sources located under the main body go towards the outside right along the main body from the bottom up, and the light emitted by the rest of each of the LED light sources exposed inside the main body are outputted directly towards the lamp housing of the LED bulb lamp.

Preferably, the main body is a camber surface and the main body comprises a reflecting surface formed on an outside surface of the main body, and wherein, the LED light sources on the LED lamp substrate are arranged under the light processing unit in an encircling manner so that one part of the LED light sources are exposed outside the main body, one part are located under the main body, such that the light emitted by the part of each of the LED light sources exposed outside the main body are reflected towards outside of the main body by the reflecting surface, and the light emitted by the part of each of the LED light sources located under the main body go towards outside right along the main body from the bottom up.

Preferably, the bottom portion is formed with a plurality of through holes, while the electrical isolation unit is formed with a plurality of through holes corresponding to the through holes on the bottom portion and the LED light sources. The main body with a camber surface comprises a reflecting surface formed on an outside surface of the main body, and wherein the LED lamp substrate include two sets of LED light sources distributed in an encircling manner, wherein, the first set of LED light sources are arranged inside the main body in an encircling manner and the light emitted by each of the light sources of this set are outputted directly to the lamp housing of the LED bulb lamp, and wherein, the second set of LED light sources are arranged under the light processing unit in an encircling manner so that one part of the LED light sources in this set are exposed outside the main body, one part are located under the main body, such that the light emitted by the part of each of the LED light sources exposed outside the main body are reflected towards outside of the main body by the reflecting surface, and the light emitted by the part of each of the LED light sources located under the main body go towards outside right along the main body from the bottom up, wherein the first set of the LED light sources are corresponding to the through holes formed on the bottom portion.

Preferably, the bottom portion is formed with a plurality of through holes, while the electrical isolation unit is formed with a plurality of through holes corresponding to the through holes on the bottom portion and the LED light sources. The main body is a camber surface, and the main body comprises a reflecting surface formed on an outside surface and an inside surface of the main body, and wherein, the LED lamp substrate includes two sets of LED light sources distributed in an encircling manner, wherein the first set of LED light sources are exposed inside the main body in an encircling manner and the light emitted by each of the light sources of this set is reflected towards inside of the LED bulb lamp by the reflecting surface of the inside surface, and wherein, the second set LED light sources are arranged under the light processing unit in an encircling manner so that one part of each of the LED light sources in this set are exposed outside the main body and one part are located under the main body, such that the light emitted by the part of each of the LED light sources is reflected towards outside direction of the main body by the reflecting surface of the outside surface, and the light emitted by the part of each of the LED light sources located under the main body go toward outside right along the main body from the bottom up, wherein the first set of LED light sources are corresponding to the through holes formed on the bottom portion.

Preferably, the bottom portion is formed with a plurality of through holes, while the electrical isolation unit is formed with a plurality of through holes corresponding to the through holes on the bottom portion and the LED light sources. In addition, the electrical isolation assembly further comprises an extending portion which is outwardly extended from the circumferential of the bottom portion, wherein, the extending portion is formed with a plurality of through holes, while the electrical isolation unit is formed with a plurality of through holes corresponding to the through holes on the extending portion and the LED light sources on the LED lamp substrate. The main body comprises a reflecting surface formed on an outside surface of the main body, and wherein the LED lamp substrate includes two sets of LED light sources distributed in an encircling manner, wherein the first set of LED light sources are arranged inside the main body in an encircling manner and the light emitted by each of the light sources of this set are outputted to the lamp housing of the LED bulb lamp directly, and the second set of LED light sources are arranged outside the cut body in an encircling manner, so that the light emitted by each of the LED light sources in this set is reflected towards outside of the main body by the reflecting surface, wherein the first set of LED light sources are corresponding to the through holes formed on the bottom portion, and the second set of LED light sources are corresponding to the through holes formed on the extending portion.

Preferably, the bottom portion is formed with a plurality of through holes, while the electrical isolation unit is formed with a plurality of through holes corresponding to the through holes on the bottom portion and the LED light sources. In addition, the electrical isolation assembly further comprises an extending portion which is outwardly extended from the circumferential of the bottom portion, and the extending portion is formed with a plurality of through holes, while the electrical isolation unit is formed with a plurality of through holes corresponding to the through holes on the extending portion and the LED light sources on the LED lamp substrate. The main body comprises a reflecting surface formed on an outside surface and an inside surface of the main body, and the LED lamp substrate includes two sets of LED light sources distributed in an encircling manner, wherein the first set of LED light sources are arranged inside the main body in an encircling manner and the light emitted by each of the light sources of this set is reflected towards inside of the LED bulb lamp by the reflecting surface of the inside surface, and wherein the second set of LED light sources are arranged outside the main body in an encircling manner, so that the light emitted by each of the LED light sources in this set is reflected towards outside of the main body by the reflecting surface of the outside surface, wherein the first set of LED light sources are corresponding to the through holes formed on the bottom portion, the second set of LED light sources are corresponding to the through holes formed on the extending portion.

Preferably, in the various embodiments discussed above, the size of the through hole on the bottom portion and the extending portion is equal to or slightly bigger than the size of the LED light source.

Preferably, the LED bulb lamp further comprises a lamp housing, wherein the inside surface or outside surface of the lamp housing or both are coated with an adhesive film, and the thickness of the adhesive film depends on total weight of the LET bulb lamp. In one embodiment, the thickness of the adhesive film is 200 μm~300 μm if the total weight of the LET bulb lamp is larger than 100 g. In another embodiment, the thickness of the adhesive film is 40 μm~90 μm if the total weight of the LET bulb lamp is smaller than 80 g.

Preferably, the LED bulb lamp further comprises a lamp housing, wherein the inside surface or outside surface of the lamp housing or both are coated with a diffusion film. In one embodiment, the main ingredient of the diffusion film is selected from at least one of calcium carbonate, calcium halophosphate and aluminum oxide.

Preferably, the LED bulb lamp further comprises a lamp housing, wherein the inside surface of the lamp housing is coated with a reflecting film, the reflecting film being coated in an area which has a certain angle with the central axis of the LED bulb lamp. In an embodiment, the main ingredient of the reflecting film is barium sulfate. In an embodiment, the angle is in the range of 0~60 degree. In an embodiment, the angle is in the range of 0~45 degree. In an embodiment, the thickness of the reflecting film can gradually reduced from the central axis of the LED bulb lamp.

According to the LED bulb lamp of the disclosure, it can protect users from contacting the charged part inside the lamp housing when the LED bulb lamp is broken and thereby avoid electric shock accidents. In addition, the directions of the light emitted by the LED light sources can be changed to achieve different kinds of lighting effects according to the LED bulb lamp of the disclosure.

As previously discussed, electrodes of an LED filament and wires connecting the electrodes with the LED chips are easily broken when the LED filament is bent due to stress concentration. To address the above issue, the instant disclosure provides embodiments of LED filaments and LED light bulbs.

According to an embodiment, an LED filament comprises a plurality of LED chips, two conductive electrodes, a plurality of conductive wires, an enclosure coating, and at least one auxiliary piece. The LED chips are arranged in an array and electrically connected with one another. The two conductive electrodes are disposed corresponding to the array. Each of the two conductive electrodes is electrically connected to a corresponding LED chip at an end of the array. The conductive wires electrically connect the LED chips and the two conductive electrodes. The conductive wires are respectively between every two adjacent LED chips of the array and between each of the two conductive electrodes and the corresponding LED chip at an end of the array. The enclosure coating is on at least two sides of the array and the two conductive electrodes. A portion of each of the two conductive electrodes is exposed from the enclosure. The auxiliary piece is disposed in the enclosure coating and overlaps at least one of the conductive wires between each of the two conductive electrodes and the corresponding one of the two LED chips respectively at two ends of the array on a radial direction of the LED filament.

According to another embodiment, an LED filament comprises a plurality of LED chips, two conductive electrodes, a plurality of conductive wires, an enclosure coating, and at least one auxiliary piece. The LED chips are arranged in an array and electrically connected with one another. The two conductive electrodes are disposed corresponding to the array. Each of the two conductive electrodes is electrically connected to a corresponding LED chip at an end of the array. The conductive wires electrically connect the LED chips and the two conductive electrodes. The conductive wires are respectively between every two adjacent LED chips of the array and between each of the two conductive electrodes and the corresponding LED chip at an end of the array. The enclosure coating is on at least two sides of the array and the two conductive electrodes. A portion of each of the two conductive electrodes is exposed from the enclosure. The auxiliary piece is disposed in the enclosure coating. While a virtual plane crosses the auxiliary piece, the virtual plane further crosses one of the conductive wires between the corresponding conductive electrode and the corresponding LED chip at the end of the array.

According to an embodiment, an LED light bulb comprises a bulb shell, a bulb base, two conductive supports, a driving circuit, and an LED filament. The bulb base is connected with the bulb shell. The two conductive supports are disposed in the bulb shell. The driving circuit is electrically connected with the two conductive supports and the bulb base. The LED filament comprises a plurality of LED chips, two conductive electrodes, a plurality of conductive wires, an enclosure coating, and at least one auxiliary piece. The LED chips are arranged in an array and electrically connected with one another. The two conductive electrodes are disposed corresponding to the array. Each of the two conductive electrodes is electrically connected to a corresponding LED chip at an end of the array. The conductive wires electrically connect the LED chips and the two conductive electrodes. The conductive wires are respectively between every two adjacent LED chips of the array and between each of the two conductive electrodes and the corresponding LED chip at an end of the array. The enclosure coating is on at least two sides of the array and the two conductive electrodes. A portion of each of the two conductive electrodes is exposed from the enclosure. The auxiliary piece is disposed in the enclosure coating and overlaps at least one of the conductive wires between each of the two conductive electrodes and the corresponding one of the two LED chips respectively at two ends of the array on a radial direction of the LED filament.

According to another embodiment, an LED light bulb comprises a bulb shell, a bulb base, two conductive supports, a driving circuit, and an LED filament. The bulb base is connected with the bulb shell. The two conductive supports are disposed in the bulb shell. The driving circuit is electrically connected with the two conductive supports and the bulb base. The LED filament comprises a plurality of LED chips, two conductive electrodes, a plurality of conductive wires, an enclosure coating, and at least one auxiliary piece. The LED chips are arranged in an array and electrically connected with one another. The two conductive electrodes are disposed corresponding to the array. Each of the two conductive electrodes is electrically connected to a corresponding LED chip at an end of the array. The conductive wires electrically connect the LED chips and the two conductive electrodes. The conductive wires are respectively between every two adjacent LED chips of the array and between each of the two conductive electrodes and the corresponding LED chip at an end of the array. The enclosure coating is on at least two sides of the array and the two conductive electrodes. A portion of each of the two conductive electrodes is exposed from the enclosure. The auxiliary piece is disposed in the enclosure coating. While a virtual plane crosses the at least one auxiliary piece, the virtual plane further crosses one of the conductive wires between the corresponding conductive electrode and the corresponding LED chip at the end of the array.

Concisely, according the embodiments of the instant disclosure, wires between the electrodes and the LED chips at the end of the array can be supported and protected by the auxiliary pieces. Toughness of two ends of the LED filament can be significantly increased. As a result, the LED filament can be bent to form varied curvatures without the risks of the wires between the electrodes and the LED chips being broken. While the LED filament with elegance curvatures emits light, the LED light bulb would present an amazing effect.

DETAILED DESCRIPTION

In order to make the objects, technical solutions and advantages of the invention more apparent, the invention will be further illustrated in details in connection with accompanying figures and embodiments hereinafter. It should be understood that the embodiments described herein are just for explanation, but not intended to limit the invention.

Figure 1:
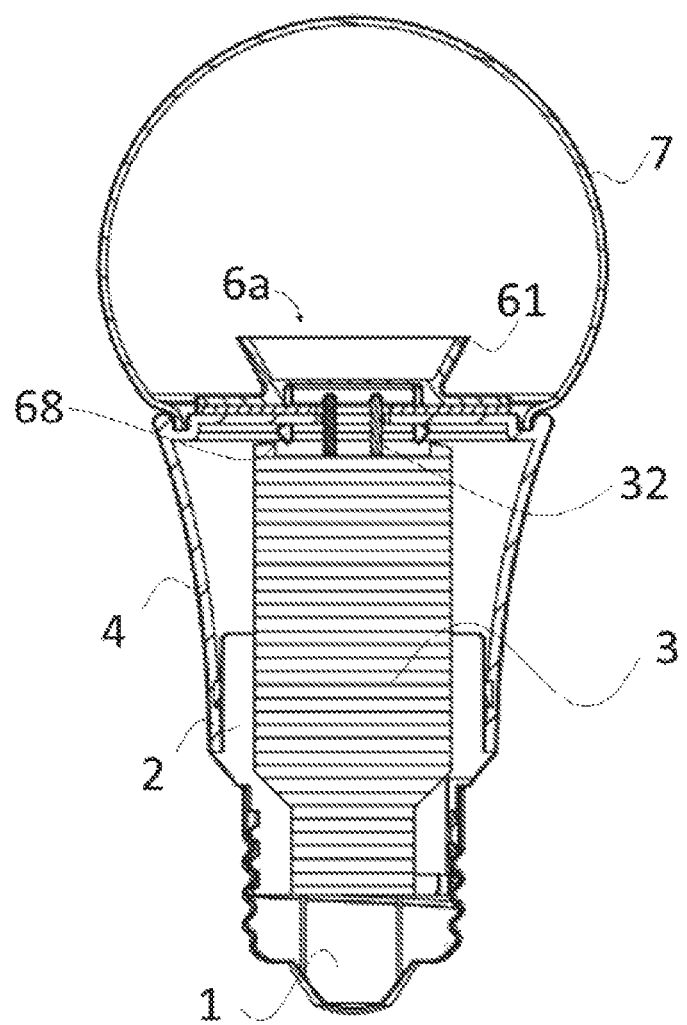
FIG. 1 illustrates a longitudinal sectional view of the LED bulb lamp along the central axis according to an embodiment.
Figure 2:
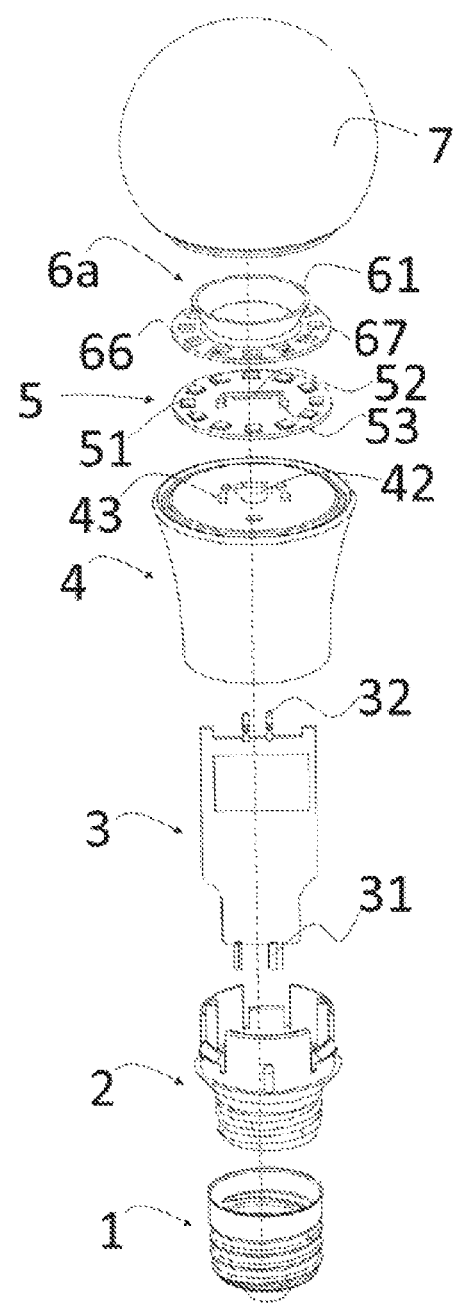
FIG. 2 illustrates an exploded view of the LED bulb lamp according to an embodiment.
Figure 3:
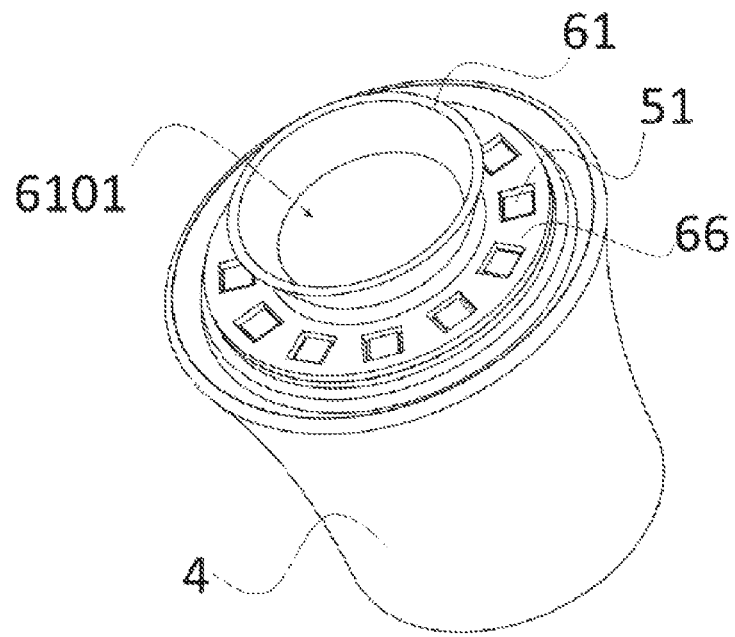
FIG. 3 illustrates a structural schematic view of the electrical isolation assembly, the LED lamp substrate and the radiator after being assembled together according to an embodiment.
Figure 4:
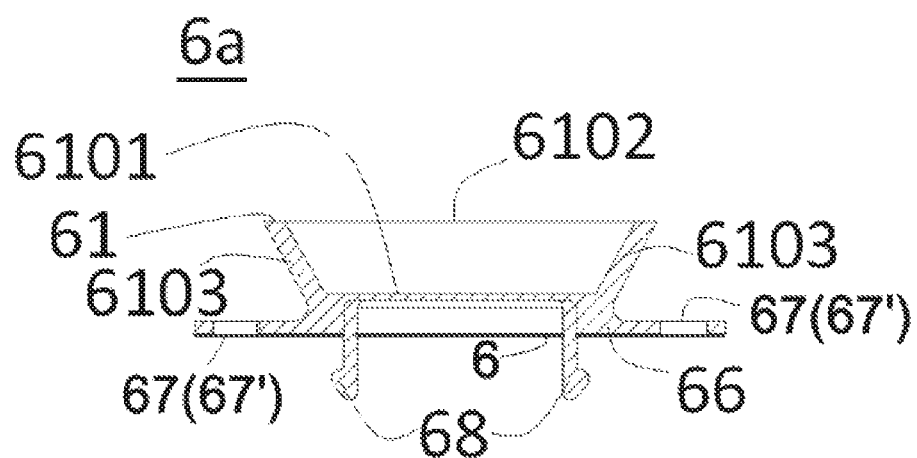
FIG. 4 illustrates a longitudinal sectional view of the electrical isolation assembly along the central axis according to an embodiment.
Figure 5:
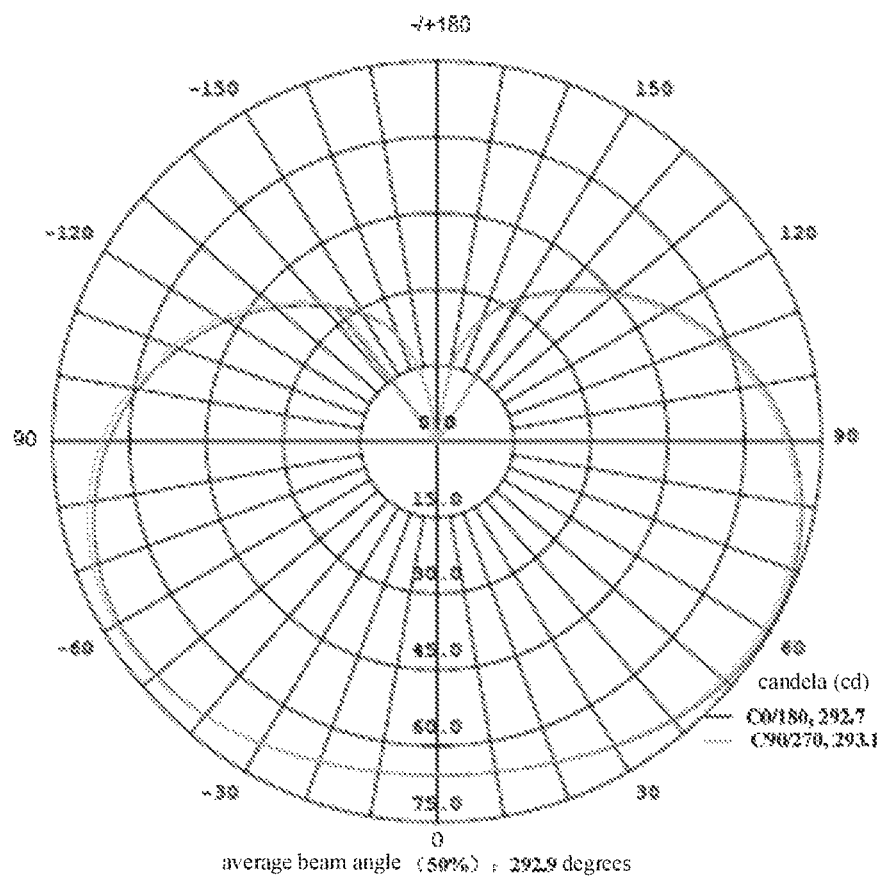
FIG. 5 illustrates an exemplary light distribution curve view of the LED bulb lamp according to an embodiment.

Referring to FIG. 1 to FIG. 6, an LED bulb lamp (also known as an LED light bulb) is provided according to an embodiment of this invention. FIG. 1 illustrates a longitudinal sectional view of the LED bulb lamp along the central axis according to an embodiment. FIG. 2 illustrates an exploded view of the LED bulb lamp according to an embodiment. FIG. 3 illustrates a structural schematic view of the electrical isolation assembly, the LED lamp substrate and the radiator after being assembled together according to an embodiment. FIG. 4 illustrates a longitudinal sectional view of the electrical isolation assembly along the central axis according to an embodiment. FIG. 5 illustrates an exemplary light distribution curve view of the LED bulb lamp according to an embodiment.

Referring to FIG. 1 and FIG. 2, the LED bulb lamp comprises a lamp head 1, a base 2, an LED driving power supply 3, a radiator 4, an LED lamp substrate 5, an electrical isolation assembly 6a, and a lamp housing 7.

One end of the base 2 embeds into the lamp head 1, and the other end of the base 2 embeds into one end of the radiator 4 away from the lamp housing lamp housing 7. In one embodiment, the ends of the base 2 and the radiator 4 that are connected can be formed with lock structures such that the base can be locked with the radiator. The base 2 is with an electrical connection structure inside to enable the LED driving power supply 3 placed within the radiator 4 to electrically connect with the lamp head 1.

The LED driving power supply 3 is disposed between the base 2 and the radiator 4. The LED driving power supply 3 has input wires 31 on its end closer to the base 2 (input end). The input wires 31 are electrically connected with the lamp head 1 via the base 2. The LED driving power supply 3 has an output wire 32 on the other end closer to the radiator 4 (output end). The output wire 32 is electrically connected with the LED lamp substrate 5. Thus the current flows to the input wires 31 of the LED driving power supply 3 via the lamp head 1, and then flows to the output wires 32 of the LED driving power supply 3 after voltage transformation by the LED driving power supply 3 to be supplied to the LED lamp substrate 5 to light the LED light sources 51 on the LED lamp substrate 5.

In some other embodiments, several columnar bulges are disposed on the end of the LED driving power source 3 closer to the radiator 4 instead of the outputs wires 32, the top outside surface of the columnar bulges has been conductively treated, and the columnar bulges are connected with a conductive fiberglass panel which in turn is connected with the LED lamp substrate 5 electrically. Thus, the current flows to the input wires 31 of the LED driving power supply 3 via the lamp head 1, and then flows to the columnar bulges of the LED driving power supply 3 after voltage transformation by the LED driving power supply 3 and is supplied to the LED lamp substrate 5 via the conductive fiberglass to light the LED light sources 51 on the LED lamp substrate 5. In these embodiments, the electrical connection of the LED driving power source 3 with the LED lamp substrate 5 can be completed by welding process, i.e., the LED lamp substrate 5 is welt on the columnar bulges of the LED driving power source 3.

As shown in FIG. 1 and FIG. 2, the end of the radiator 4 away from the lamp housing 7 is embedded with the base 2, and the end of the radiator 4 away from the lamp head 1 is connected with the LED lamp substrate 5. Via holes 42 are formed on the radiator 4. The via holes 42 correspond to the output wires 32 of the LED driving power supply 3, and the output wires 32 of the LED driving power supply 3 can cross through the via hole 42 up and down. In addition, the via holes 42 are also corresponding to the via holes 52 formed on the LED lamp substrate 5 so that the output wires 32 of the LED driving power supply 3 can electrically connect with the LED lamp substrate 5 through the corresponding via holes 42 and via holes 52 in order. Further, fixing holes 43 are disposed on the end of the radiator 4 away from the lamp head 1. The fixing holes 43 are corresponding to the fixing holes 53 formed on the LED lamp substrate 5 and the fixing element 68 disposed on the electrical isolation assembly 6a to enable the electrical isolation assembly 6a to connect with the LED lamp substrate 5 and the radiator 4.

The LED lamp substrate 5 is placed on the end of the radiator 4 closer to the lamp housing 7, and the LED lamp substrate 5 can be disposed with the electrical isolation assembly 6a at firstly, and then disposed on the radiator 4. The LED lamp substrate 5 can be circularly shaped. At least one light resource 51, which may have the traditional appearance with holder and gluey shell, chip scale package or other package structure, is mounted on the LED lamp substrate 5. In addition, as described above, the LED lamp substrate 5 has the via holes 52 formed thereon, and the via holes 52 are corresponding to the via holes 42 on the radiator 4. The output wires 32 of the LED driving power supply 3 can electrically connect with the LED lamp substrate 5 through the corresponding via holes 42 and via holes 52 in order. Further, as described above, the LED lamp substrate 5 has the fixing holes 53 formed thereon, the fixing holes 53 are corresponding to the fixing holes 43 on the radiator 4 and the fixing elements 68 on the electrical isolation assembly 6a to enable the electrical isolation assembly 6a to disposed on the LED lamp substrate 5 and the radiator 4.

In one embodiment, the numbers of via holes 42 and the via holes 52 depends on the number of the output wires 32 of the LED driving power supply 3, generally, these via holes can be the holes corresponding to two output wires, the anode and the cathode. If the LED driving power supply 3 has the Dimming function of adjusting the brightness of the light sources 51 or in other use cases where an increased electrical connection wires are required, the wires and the corresponding holes can be increased accordingly.

The electrical isolation assembly 6a is disposed on the LED lamp substrate 5 for isolating the charged part on the LED lamp substrate 5 from outside. The electrical isolation assembly 6a further includes an electrical isolation unit 6. Several through holds 67' are formed on the electrical isolation unit 6, and these through holds 67' are corresponding to the through holes on the bottom portion and the LED light sources 51 on the LED lamp substrate 5 such that the light emitted from the LED light sources 51 can cross through these through holds 67'. When the electrical isolation assembly 6a is disposed on the LED lamp substrate 5, the electrical isolation unit 6 covers the LED lamp substrate 5 for electrically isolating the charged part on the LED lamp substrate 5 from outside of the LED lamp substrate 5. In an embodiment, the electrical isolation unit 6 can be an electrical isolation board made from electrically insulating materials with high reflectivity, such as polycarbonate (PC).

The electrical isolation assembly 6a can further comprise a light processing unit 61 which can convert the outputting direction of the light emitted by the LED light sources 51. When the electrical isolation assembly 6a is disposed on the LED lamp substrate 5, the light processing unit 61 is disposed on the electrical isolation unit 6, that is, the electrical isolation unit 6 is located between the light processing unit 61 and the LED lamp substrate 5. The light processing unit 61 and the electrical isolation unit 6 can be integrally formed.

As shown in FIG. 3 and FIG. 4, the light processing unit 61 has a cup-shaped structure when being seen as a whole. The light processing unit 61 comprises a bottom portion 6101, a main body 6103 and a top portion 6102. The main body 6103 is formed between the bottom portion 6101 and the top portion 6102. It should be understood that the light processing unit 61 is described here to include the top portion 6101, but in fact, the top of the light processing unit 61 is hollowed out, and the boundary line just is seen from the longitudinal sectional view. In the embodiment, the preferably external diameter of the bottom portion 6101 is 16 mm~20 mm and the preferably external diameter of the top portion 6102 is 25 mm~29 mm. The outside surface's side boundary of the main body 6103 is approximately a straight line and has a certain angle with the extending surface of the bottom portion 6101. In one embodiment, the angle can be 51~73 degree. It should be understood that the outside surface of the main body 6103 can also be other shapes which are good for reflecting light.

The electrical isolation assembly 6a further comprises an extending portion 66 which is extended outwardly from the circumferential of the main body 6103 in an encircling manner. The extending portion 66 is formed with at least one through holes 67 which are radially formed on the extending portion 66 in an encircling manner and are corresponding to the LED light sources 51 on the LED lamp substrate 5. Accordingly, these through holds 67 are also corresponding to the through holds 67' of the electrical isolation unit 6. When the electrical isolation assembly 6a is disposed on the LED lamp substrate 5, the light sources 51 on the LED lamp substrate 5 can cross through the corresponding through holes 67' on the electrical isolation unit 6 and embeds into the through holes 67 of the extending portion 66.

In this embodiment, the through holes 67 can be, but is not limited to, arranged evenly along the outside of the main body 6013. The through holes 67 may have rectangle shape or circular shape, etc. The depth of each of the through holes 67 can be equal or higher than the height of the LED light sources 51. In one embodiment, the depth of each through hole 67 can be 100%-120% of the height of the LED light sources 51 to make sure the through holes 67 can meet the required light transmittance. In addition, the cross sectional area of each of the through holes 67 can be equal to or bigger than the bottom area of each of the LED light sources 51. In one embodiment, the cross sectional area of the through hole 67 is 100%~120% of the bottom area of the LED light source 51 to make sure the through hole 67 would not block the light emitted by the LED light sources 51.

By the way of embedding the LED light sources 51 into the through holes 67 of the extending portion 66, the LED light sources 51 are arranged outside the main body 6103 in an encircling manner so that the emitted light is distributed outside the main body 6103 of the light processing unit 61 when the LED light source 51 is lighting. It should be noted that, in this embodiment, a reflecting surface is formed on the outside surface of the main body 6103 to reflect the light emitted by the LED light sources 51 towards outside of the main body 6103 so that the range of the light distribution of the LED light sources 51 can be more than 180 degree.

As described above, the preferably external diameter of the bottom portion 6101 of the light processing unit 61 is 16 mm~20 mm and the preferably external diameter of the top portion 6102 of the light processing unit 61 is 25 mm~29 mm. If the external diameter of the top portion 6102 is bigger than 29 mm, a light spot will be generated on the top of the lamp housing 7 when all the LED light sources 51 on the LED lamp substrate 5 are lighting, even though the requirement of the standard for the light distribution of the LED bulb lamp can be met, the whole illumination effect of the LED bulb lamp will be affected. Further, as described before, the outside surface's side boundary of the main body 6103 has an angle of 51~73 degree with the extending surface of the bottom portion 6101. If the angle is less than 51 degree, the whole illumination effect of the LED bulb lamp will decrease, even though the requirement of the standard for the light distribution of the LED bulb lamp can be met.

Referring to FIG. 4, fixing elements 68 are disposed on the bottom portion 6101 of the light processing unit 61 of the electrical isolation assembly 6a. The fixing elements 68 can cross through the electrical isolation unit 6, and then can be fixed with the fixing holes 53 on the LED lamp substrate 5 and the fixing holes 43 on the radiator 4 to connect the electrical isolation assembly 6a with the LED lamp substrate 5 and then to connect with the radiator 4. It should be understood that the electrical isolation assembly 6a can include the electrical isolation unit 6 only (i.e. does not includes the light processing unit 61), and in such case, the fixing elements 68 can be disposed on the electrical isolation unit 6.

In an embodiment, each of the fixing elements 68, the fixing holes 53 and the fixing holes 43 can be a lock structure to achieve the lock connection of the electrical isolation assembly 6a with the LED lamp substrate 5 and the radiator 4. However, it should be understood that the electrical isolation assembly 6a, the LED lamp substrate 5 and the radiator 4 can be fixed and connected in other ways, for example, through screw or silicone connection.

When the electrical isolation assembly 6a is disposed on the LED lamp substrate 5 via the fixing elements 68, the through holes 67 on the extending portion 66 are exactly embedded with the corresponding LED light sources 51 on the LED lamp substrate 5. Generally, there are some charged part such as the welding points and the conductive wires on the LED lamp substrate 5 for electrically connecting the LED lamp substrate 5 to the LED driving power supply 3, and there are some active and passive elements on the LED driving power supply 3 too. Thus, it's easy for users to contact the charged part inside the LED bulb lamp and get an electric shock accident after the lamp housing 7 is broken. In this embodiment, an electric insulation design is used for the electrical isolation unit 6, the extending portion 66 and the fixing elements 68, so that the whole electrical isolation assembly 6a can isolate the charged part on the LED lamp substrate 5 such that the charged part will not be exposed to outside even the lamp housing 7 is broken, then users will not get an electric shock accident due to contacting these charged part.

Back to FIG. 1 and FIG. 2, the lamp housing 7 is disposed on the one end of the radiator 4 away from the base 2. And the lamp housing 7 can connect with the radiator 4 by an adhesive film.

An LED bulb was described above according to an embodiment of this invention. The experimental data of the distribution of luminous intensity of the LED bulb lamp according to this embodiment is as shown in FIG. 5. As can be seen in the FIG. 5, the distribution of luminous intensity of the LED bulb lamp is distributed in the scope of 0 degree~135 degree, and 90.5% of the luminous intensity measurements (cd) have a difference with the average value of all the measurements no more than 25%, which is above the requirement of the standard (i.e., in the scope of 0 degree~135 degree, 90% of the luminous intensity measurements (cd) have a difference with the average value of all the measurements no more than 25%). In addition, as can be seen in the FIG. 5, the luminous flux in the scope of 135 degree~180 degree is 5.3%-9.5% of the total luminous flux, which is also above the requirement of the standard (the luminous flux in the scope of 135 degree~180 degree should be no less than 5% of the total luminous flux).

Figure 6:
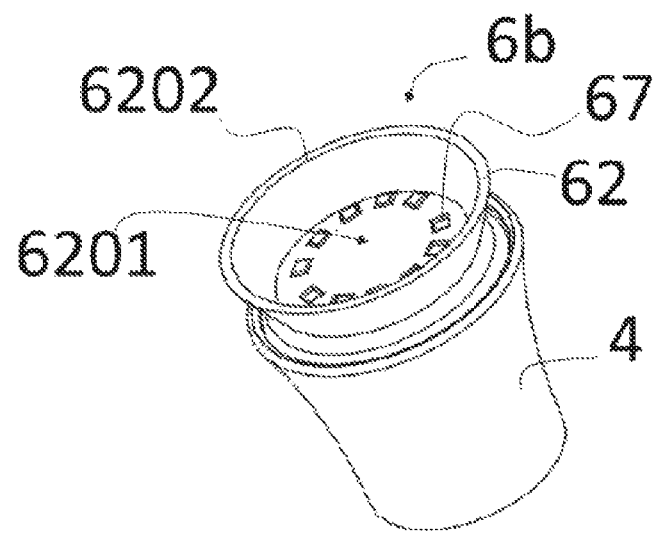
FIG. 6 illustrates a structural schematic view of the electrical isolation assembly, the LED lamp substrate and the radiator after assembling according to another embodiment.
Figure 7:
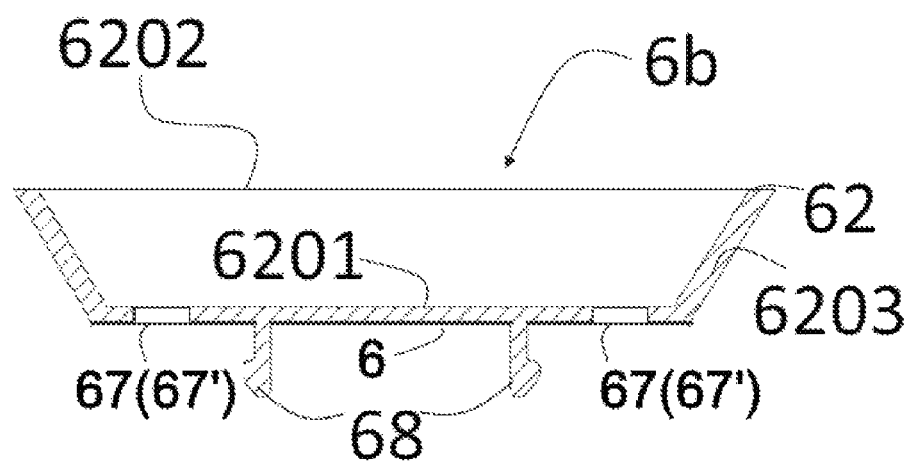
FIG. 7 illustrates a longitudinal sectional view of the electrical isolation assembly along the central axis according to another embodiment.

Referring to FIG. 6 and FIG. 7, an LED bulb lamp will be discussed according to another embodiment of this invention. FIG. 6 illustrates a structural schematic view of the electrical isolation assembly, the LED lamp substrate and the radiator after assembling according to another embodiment; and FIG. 7 illustrates a longitudinal sectional view of the electrical isolation assembly along the central axis according to another embodiment.

In the embodiment, except the electrical isolation assembly 6b and the LED light sources 51 on the LED lamp substrate 5 have a different arrangement with the arrangement of the electrical isolation assembly 6a and the light sources 51 discussed referring to FIG. 1-5, the other assemblies comprising the lamp head 1, the base 2, the LED driving power source 3, the radiator 4, the LED lamp substrate 5 and the lamp housing 7, and their connection relationship can be the same with those in above embodiment.

To describe clearly and simply, these same assemblies are described herein briefly. One end of the base 2 embeds into the lamp head 1, and the other end of the base 2 embeds into the end of the radiator 4 away from the lamp housing 7. The LED driving power supply 3 is disposed inside of the base 2 and the radiator 4. The LED driving power supply 3 has input wires 31 in one end closer to the base 2 which are electrically connected to the lamp head 1 via the base 2. The LED driving power supply 3 has output wires 32 in the end closer to the radiator 4 which are electrically connected to the LED lamp substrate 5 via the radiator 4. The end the of the radiator 4 away from the lamp housing 7 is embedded with the base 2, and the other end away from the lamp head 1 connects with the LED lamp substrate 5. The LED lamp substrate 5 is disposed on the end of the radiator 4 closer to the lamp housing 7 and the electrical isolation assembly 6b is disposed on the LED lamp substrate 5. The lamp housing 7 is disposed on the end of the radiator 4 away from the base 2.

The differences of the electrical isolation assembly 6b with the electrical isolation assembly 6a of the above embodiment are: the electrical isolation assembly 6b comprises a light processing unit 62 instead of the light processing unit 61, and a reflecting surface is formed on inside surface of the main body 6203 of the light processing unit 62; the electrical isolation assembly 6b doesn't comprise the extending portion 66 and the through holes 67 formed on the extending portion 66, but at least one through holes 67 corresponding to the LED light sources 51 are formed on the bottom portion 6201 of the light processing unit 62. The LED light sources 51 on the LED lamp substrate 5 are radially arranged inside the main body 6203 in an encircling manner. The reflecting surface is formed on the inside surface of the main body 6203 of the light processing unit 62 to enable the light emitted by the LED light sources 51 is reflected towards inside of the main body 6203 to achieve the purpose of collecting light.

Specifically, the electrical isolation assembly 6b can comprises an electrical isolation unit 6. Several through holds 67' are formed on the electrical isolation unit 6, and these through holds 67' corresponding to the through holes on the bottom portion and the LED light sources 51 on the LED lamp substrate 5 such that the light emitted from the LED light sources 51 can cross through these through holds 67'. When the electrical isolation assembly 6b is disposed on the LED lamp substrate 5, the electrical isolation unit 6 covers the LED lamp substrate 5 for electrically isolating the charged part on the LED lamp substrate 5 from outside of the LED lamp substrate 5. Similarly, the electrical isolation unit 6 can be an electrical isolation board made from electrically insulating materials with high reflectivity, such as polycarbonate (PC).

Referring to FIG. 6 and FIG. 7, the electrical isolation assembly 6b can further comprise a light processing unit 62 which can convert the outputting direction of the light emitted by the LED light sources 51. When the electrical isolation assembly 6b is disposed on the LED lamp substrate 5, the light processing unit 62 is disposed on the electrical isolation unit 6, that is, the electrical isolation unit 6 is located between the light processing unit 62 and the LED lamp substrate 5. Similarly, the light processing unit 62 and the electrical isolation unit 6 can also be integrally formed.

The light processing unit 62 has a cup-shaped structure when being seen as a whole. The light processing unit 62 comprises a bottom portion 6201, a main body 6203 and a cut top 6202, wherein, the main body 6203 is formed between the bottom portion 6201 and the top portion 6202. Also, it should be understood that the light processing unit 62 is described here to include the top portion 6201, but in fact, the top of the light processing unit 62 is hollowed out, and the boundary line just is seen from the longitudinal sectional view. In the embodiment, the preferably external diameter of the bottom portion 6201 is 37 mm~40 mm which is the optimal size range for cooperating with the LED lamp substrate 5. In this embodiment, a reflecting surface is formed on an inside surface of the main body 6203, the light emitted by each of the LED light sources 51 is reflected towards inside of the main body 6203 by the reflecting surface. In an embodiment, the inside surface's side boundary of the main body 6203 is approximately a straight line and has a certain angle with the extending surface of the bottom portion 6201. In one embodiment, the angle can be 45 degree~75 degree to get the optimal effect of collecting light. But it should be understood that the inside surface of the main body 6203 can also be other shapes which are good for collecting light.

Several through holes 67 corresponding to the LED light sources 51 are formed on the bottom portion 6201 closer to the inside circumferential of the main body 6203. It should be understood that these through holds 67 are also corresponding to the through holds 67' on the electrical isolation unit 6. The number of the through holes 67, 67' is the same with the number of the LED light sources 51 on the LED lamp substrate 5. In one embodiment, the preferred number of the LED light sources 51 and the through holes 67, 67' is, but not is limited to, 4~12. The LED light sources 51 on the LED lamp substrate 5 can cross through the corresponding through holes 67' on the electrical isolation unit 6 and in turn embed into the through holes 67 on the bottom portion 6201 of light processing unit 62 when the electrical isolation assembly 6b is disposed on the LED lamp substrate 5.

Similarly, the through holes 67 may have rectangle shape or circular shape, etc. The depth of each of the through holes 67 can be equal to or higher than the height of the LED light sources 51. In one embodiment, the depth of each through holes 67 can be 100%-120% of the height of the LED light sources 51. In addition, the cross sectional area of each of the through holes 67 can be equal to or bigger than the bottom area of each of the LED light sources 51. In one embodiment, the cross sectional area of the through hole 67 is 100%~120% of the bottom area of the LED light source 51.

By the way of embedding the LED light sources 51 into the through holes 67 formed on the bottom portion 6201, the LED light sources 51 are arranged inside the main body 6203 in an encircling manner so that the emitted light is distributed inside the main body 6203 of the light processing unit 62 when the LED light source 51 is lighting. It should be noted that, in this embodiment, the reflecting surface is formed on the inside surface of the main body 6203 to reflect the light emitted by the LED light sources 51 towards inside of the main body 6203 so that the angle range of the light distribution of the LED light sources 51 is less than 120 degree. In addition, a condenser can be arranged in the inside of the light processing unit 62 to enhance the effect of converging light.

Referring to FIG. 6 and FIG. 7, fixing elements 68 are disposed on the bottom portion 6201 of the light processing unit 62 by the electrical isolation assembly 6b. The fixing elements 68 can cross through the electrical isolation unit 6, and then can be fixed with the fixing holes 53 on the LED lamp substrate 5 and the fixing holes 43 on the radiator 4 to connect the electrical isolation assembly 6b with the LED lamp substrate 5 and then to connect with the radiator 4. Similarly, it should be understood that the electrical isolation assembly 6a can include the electrical isolation unit 6 only (i.e. does not includes the light processing unit 62), and in such case, the fixing elements 68 can be disposed on the electrical isolation unit 6. Further, the fixing elements 68, the fixing holes 53 and the fixing holes 43 can be a lock structure to achieve the lock connection of the electrical isolation assembly 6b with the LED lamp substrate 5 and the radiator 4. The electrical isolation assembly 6b, the LED lamp substrate 5 and the radiator 4 can be fixed and connected in other ways, for example, through screw or silicone connection.

When the electrical isolation assembly 6b is disposed on the LED lamp substrate 5 via the fixing elements 68, the through holes 67 are exactly embedded with the corresponding LED light sources 51 on the LED lamp substrate 5. Generally, there are some charged part such as the welding points and the conductive wires on the LED lamp substrate 5 for electrically connecting the LED lamp substrate 5 to the LED driving power supply 3, and there are some active and passive elements on the LED driving power supply 3 too. Thus, it's easy for users to contact the charged part in the LED bulb lamp and get an electric shock accident after the lamp housing 7 is broken. In this embodiment, an electric insulation design is used for the electrical isolation unit 6 and the fixing elements 68, so that the whole electrical isolation assembly 6b can isolate the charged part on the LED lamp substrate 5 such that the charged part will not be exposed to outside even the lamp housing 7 is broken, then users will not get an electric shock accident due to contacting these charged part.

It should be noted that, in the two embodiments described above, according to the structure of the electrical isolation assembly 6a or 6b, the LED light sources 51 can arranged inside or outside the main body 6103, 6203 of the light processing unit 61, 62 in an encircling manner. Nevertheless, the disclosed LED bulb lamp can adopt different design.

Figure 8:
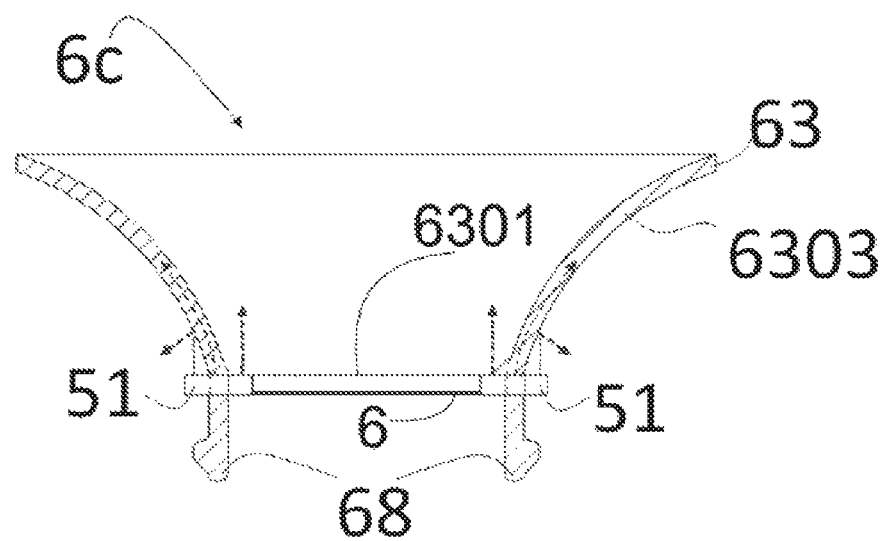
FIG. 8 illustrates a longitudinal sectional view of the electrical isolation assembly along the central axis according to yet another embodiment.

An LED bulb lamp is described bellow according to another embodiment referring to FIG. 8. FIG. 8 illustrates a longitudinal sectional view of the electrical isolation assembly along the central axis according to yet another embodiment.

In this embodiment, except the electrical isolation assembly 6c and the LED light sources 51 on the LED lamp substrate 5 have a different arrangement with the arrangement of electrical isolation assembly 6a, 6b and the light sources 51 described in above embodiments, the other assemblies and their connection relationship can be the same with those in above embodiments and need not be repeated here.

The main differences of the electrical isolation assembly 6c with the electrical isolation assembly 6a and 6b of the above embodiment are: the electrical isolation assembly 6c comprises a light processing unit 63, which has main body 6303 with non-straight camber surface, but does not have bottom portion 6301; the LED light sources 51 are arranged under the light processing unit 63 in an encircling manner. It should be understood that the bottom portion 6301 in the present embodiment is hollowed out, that is, there is no bottom portion 6301. The boundary line indicated by reference number 6301 in FIG. 8 just is shown in the longitudinal sectional view. Further, the electrical isolation unit 6 of the electrical isolation assembly 6c is shown lower than the bottom portion 6301, but in fact, the electrical isolation unit 6 is located between the main body 6303 and the LED light sources 51. Further, it should be understood that the main body 6303 may be other shape although a shape of camber surface is discussed here.

Specifically, a reflecting surface is formed on the outside of the camber surface of the main body 6303. And the light processing unit 63 of the electrical isolation assembly 6c is above the light sources 51 on the LED lamp substrate 5 when the electrical isolation assembly 6c is disposed on the LED lamp substrate 5, that is, the LED light sources 51 on the LED lamp substrate 5 are arranged under the light processing unit 63 in an encircling manner so that one part of each of the LED light sources 51 are exposed outside the main body 6303, one part are located under the main body 6303 and the rest are exposed inside the main body 6303. Thus, the light emitted by the part of each of the light sources exposed outside the main body 6303 of the light processing unit 63 can be reflected by the reflecting surface on the outside surface of the main body 6303 towards outside of the main body 6303; the light emitted by the part of each of the light sources located under the main body 6303 of the light processing unit 63 can go towards outside along the camber surface of the main body 6303 from the bottom up due to refraction of the main body 6303; the light emitted by the part of each of the LED light sources exposed inside the main body 6303 of the light processing unit 63 can be outputted directly to the lamp housing 7 upwards without blocking of the bottom portion 6301.

In addition, as shown in FIG. 8, the fixing elements 68 can be arranged under the circumferential of the main body 6301 of the light processing unit 63 to connect the electrical isolation assembly 6c with the LED lamp substrate 5 and the radiator 4. Similarly, it should be understood that the electrical isolation assembly 6c can include the electrical isolation unit 6 only (i.e. does not include the light processing unit 63), and in such case, the fixing elements 68 can be disposed on the electrical isolation unit 6.

In this embodiment, due to the camber surface design of the main body 6303 of the light processing unit 63, the design of the reflecting surface of the outside surface of the main body 6303, and the design of the main body 6303 of the light processing unit 63 located above the LED light sources 51, the range of the light distribution of the LED light sources can be more than 180 degree effectively.

As described above, the bottom portion 6301 is hollowed out and the light processing unit 63 can be arranged above the LED light sources 51 so that the light emitted by the LED light sources 51 will have the light emitting effect towards three directions after processed by the light processing unit 63. In another embodiment, the bottom portion 6301 may be present in fact and in such case, by arranging the light processing unit 63 over the LED light sources 51 such that a part of each LED light source 51 is exposed outside the main body 6303 and another part is located under the main body 6303, such that the light emitted by the part of each LED light source exposed outside of the main body 6303 will emits light towards two directions, and the light emitted by the part of each LED light source located under the main body 6303 will go towards outside along the camber surface of the main body 6303 from the bottom up. Thus, the light emitted by the LED light sources 51 will have the light emitting effect towards two directions after processed by the light processing unit 63.

In addition, different external diameter of the bottom portion 6301 of the light processing unit 63 and the length of the extend camber surface of the main body 6303 can be designed depending on the lighting requirement for the LED bulb lamp. For example, by adjusting the external diameters of the bottom portion 6301 of the light processing unit 63 or the length of the extend camber surface of the main body 6303, for example, the external diameter of the bottom portion 6301 is designed to be smaller to make the area of the LED light sources exposed outside the main body 6303 bigger, or the length or angle of the camber surface of the main body 6303 is designed to block more light emitted by the LED light sources, more of the light emitted by the LED light sources 51 will be reflected by the reflecting surface on the outside surface of the main body 6303, and thus higher brightness of the reflected light can be obtained accordingly.

Figure 9:
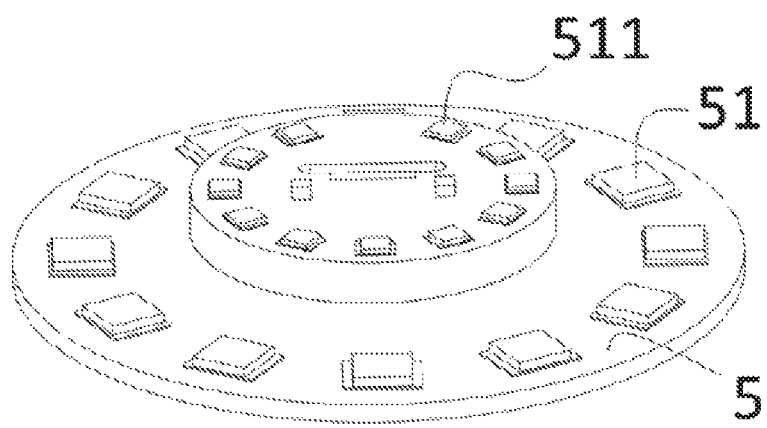
FIG. 9 illustrates a schematic view of the of the LED lamp substrate according to an embodiment.

As described above, one set of LED light sources 51 are mounted on the LED lamp substrate 5 in an encircling manner in the above embodiment. In some embodiments, two sets of LED light sources can be mounted on the LED lamp substrate 5 to form two encircling arrangements, as shown in FIG. 9. There are two sets of LED light sources on the LED lamp substrate 5, one set illustrated by the reference number 51 and the other set illustrated by the reference number 511. The two sets of LED light sources 51, 511 are both arranged around the center of the LED lamp substrate 5 in an encircling manner. The LED light sources 511 are closer to the center of the LED lamp substrate 5 and the LED light sources 51 are closer to the edge of the LED lamp substrate 5. Further, the portion of the LED lamp substrate 5 mounted with the LED light sources 511 are on the LED lamp substrate 5 protrudes upward slightly as compared with the portion of the LED lamp substrate 5 mounted with the LED light sources 51 in order to be collocated with the electrical isolation assembly.

Figure 10:
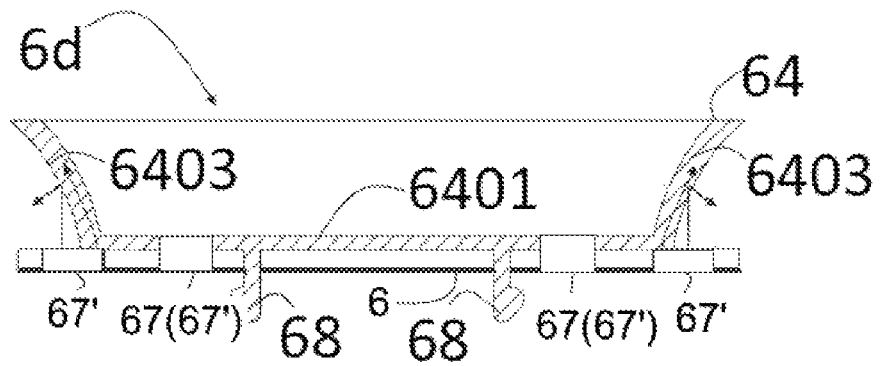
FIG. 10 illustrates a longitudinal sectional view of the electrical isolation assembly along the central axis according to yet another embodiment.
Figure 11:
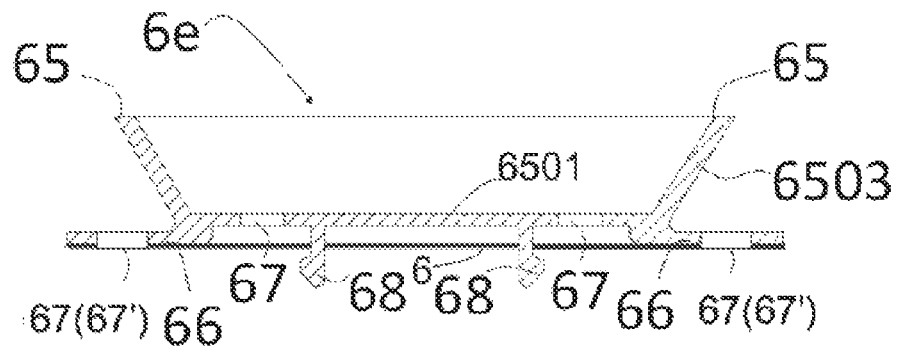
FIG. 11 illustrates a longitudinal sectional view of the electrical isolation assembly along the central axis according to yet another embodiment.

Referring to FIGS. 10-11, an LED bulb lamp deploying the arrangement with two sets of LED light sources as shown in FIG. 9 is described. FIG. 10 and FIG. 11 illustrate a longitudinal sectional view of the electrical isolation assembly along the central axis according to an embodiment of this invention, respectively.

As shown in FIG. 10, in this embodiment, except the electrical isolation assembly 6d and the LED light sources 51 on the LED lamp substrate 5 have a different arrangement with the arrangements of the electrical isolation assemblies 6a, 6b, 6c, and the light sources 51 described in the above embodiments, the other assemblies and their connection relationship can be the same with those in above embodiments and need not be repeated here.

In this embodiment, the electrical isolation assembly 6d comprises light processing unit 64, its main body 6403 is non-straight camber surface, and its bottom portion 6401 is formed with the through holes 67 corresponding to the LED light sources 511 on the light substrate 5. It should be noted that the electrical isolation unit 6 also is formed with corresponding through holes 67'. Further, it should be understood that the main body 6403 may be other shape although a shape of camber surface is discussed here.

In one embodiment, just an outside surface of the main body 6403 is formed with a reflecting surface. In this case, when the electrical isolation assembly 6d is disposed on the LED lamp substrate 5 as shown in FIG. 9, the first set of LED light sources 51 are arranged inside the main body 6403 in an encircling manner, and the light emitted by the first set of light sources 511 can cross through the through holes 67' and the through holes 67 formed on the electrical isolation unit 6 and the bottom portion 6403 correspondingly and are outputted to the lamp housing 7 directly. In addition, the second set of light sources 51 are under the light processing assembly 64 so that one part of each LED light source in this set are exposed outside main body 6403 of the light processing assembly 64 and one part are located under the main body 6403. Then the light emitted by the part of each LED light sources 51 exposed outside the main body 6403 of the light processing unit 64 is reflected by the reflecting surface towards outside of the main body 6403; the light emitted by the part of each LED light sources located under the main body 6403 goes toward outside along the camber surface of the main body 6403 from the bottom up.

It should be understood that both the inside and outside surface of the main body 6403 can be formed with a reflecting surface. In such case, as above, for the first set of light sources 51 located under the light processing unit 64, the light emitted by the part of each of the light sources 51 exposed outside the main body 6403 of the light processing unit 64 is reflected by the reflecting surface on the outside surface of the main body 6403 towards outside of the main body 6403, and the light emitted by the part of the light sources 51 located under the main body 6403 of the light processing unit 64 goes toward outside along the camber surface of the main body 6403 from the bottom up. Meanwhile, for the LED light sources 511 arranged inside the main body 6403 in an encircling manner, the light emitted by each of the light sources 511 is reflected by the reflecting surface on the inside surface of the main body 6403 towards inside of the main body 6403. This arrangement can bring another illumination effect.

In addition, it is possible that only an inside surface of the main body 6403 can be formed with a reflecting surface. In this case, for the LED light sources 511 arranged inside the main body 6403 in an encircling manner, the light emitted by each of the light sources 511 emit to the lamp housing directly. Meanwhile, for the light sources 51 located under the light processing unit 64, the light emitted by each of the light sources 511 goes toward outside from the bottom up along the camber surface of the main body 6403. This arrangement can bring yet another illumination effect.

Figure 12:
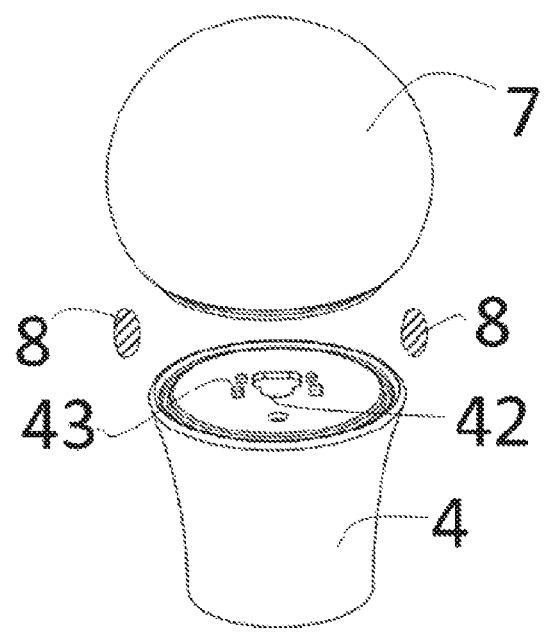
FIG. 12 illustrates a schematic view of an adhesive film coating between the lamp housing and the radiator according to an embodiment.

Referring to FIG. 12, another embodiment of the LED bulb lamp deploying the arrangement with two sets of LED light sources as shown in FIG. 9 is described.

The electrical isolation assembly 6e comprises light processing unit 65, the side surface's side boundary of its main body 6503 is straight line, and its bottom portion 6503 is formed with the through holes 67 corresponding to the LED light sources 511 on the LED lamp substrate 5. In addition, the electrical isolation assembly 6e further comprises extending portion 66 which is formed with the through holes 67 corresponding to the LED light sources 51 on the LED lamp substrate 5. The LED light sources 51, 511 can be arranged inside and outside the main body 6403 of the light processing unit 64 in an encircling manner at the same time. It should be noted that the electrical isolation unit 6 also is formed with corresponding through holes 67', and these through holes 67' are also corresponding to those disposed on the extending portion 66 and on the bottom portion 6501. Further, it should be understood that the main body 6503 may be other shape although it is discussed here with straight boundary line of its side surface.

In an embodiment, a reflecting surface is just formed on an outside surface of the main body 6503. In this case, when the electrical isolation assembly 6e is disposed on the LED lamp substrate 5 as shown in FIG. 10, the first set of LED light sources 51 are arranged inside the main body 6503 in an encircling manner, and the light emitted by the first set of light sources 511 can cross through the through holes 67' and the through holes 67 formed on the electrical isolation unit 6 and the bottom portion 6503 correspondingly and are outputted to the lamp housing 7 directly. In addition, the second set of light sources 51 are arranged outside the main body 6503 in an encircling manner, and the light emitted by the light sources 51 is reflected by the reflecting surface on the outside surface of the main body 6503 towards outside of the main body 6503.

It should be understood that both inside and outside surface of the main body 6503 can be formed with a reflecting surface. In such case, for the LED light sources 511 arranged inside the main body 6503 in an encircling manner, the light emitted by each of the light sources 511 is reflected by the reflecting surface on the inside surface of the main body 6503 towards inside of the main body 6503. Meanwhile, for the light sources 51 arranged outside the main body 6503 in an encircling manner, the light emitted by the light sources 51 is reflected by the reflecting surface on the inside surface towards outside of the main body 6503. This arrangement can bring another illumination effect.

In addition, it is possible that only an inside surface of the main body 6503 can be formed with a reflecting surface. In this case, for the LED light sources 511 arranged inside surface the main body 6503 in an encircling manner, the light emitted by the light sources 511 is reflected by the reflecting surface on the inside surface of the main body 6503 towards inside of the main body 6503. Meanwhile, for the light sources 51 arranged outside the main body 6503 in an encircling manner, the light emitted by the light sources 51 goes towards outside from the bottom up along the straight side surface of the main body 6503. This arrangement can bring yet another illumination effect.

In the above arrangements, the emitting direction of the light outside the main body 6503 can be adjusted by changing the design of the angle of the inside or outside surface of the main body 6503 with the extending surface of the bottom portion 6501.

It should be noted that the electrical isolation assembly 6*d*, 6*e* in the above embodiments can be the same as the electrical isolation assembly 6*b* with the fixing elements 68 arranged under the bottom portion 6401, 6501 of the light processing unit 64, 65 to connect the electrical isolation assembly 6*d*, 6*e* with the LED lamp substrate 5 and the radiator 4. Similarly, in the case of the electrical isolation assembly 6*a* includes only the electrical isolation unit 6 (i.e. it does not include the light processing unit 64, 65), the fixing elements 68 can be disposed on the electrical isolation unit 6. The fixing elements 68 can employ the lock structure to achieve the lock connection.

When the electrical isolation assembly 6*d*, 6*e* is disposed on the LED lamp substrate 5 by the fixing elements 68, the through holes 67 on the bottom portion 6403 and the through holes 67 on the extending portion 66 can be embedded with the two sets of light sources 51 on the LED lamp substrate 5 correspondingly. As the above embodiment, the electrical isolation unit 6, the extending portion 66 and the fixing element 68 can employ an electrical insulation design. Thus, the whole electrical isolation assembly 6*d*, 6*e* can cover the charged part on the LED lamp substrate 5 such that the charged part would not expose to the outside even though the lamp housing 7 is broken, so users can be protected from contacting the charged part to avoid an electric shock accident.

In addition, it should be understood that the electrical isolation unit 6, the light processing unit 61/62/63/64/65, the extending portion 66 and the fixing elements 68 can be integrally formed. They can be made of PC plastic materials having the reflectivity more than 92% or metal materials with high reflectivity by plating processing.

FIG. 12 illustrates a schematic figure of adhesive film coating between the lamp housing and the radiator according to an embodiment. In the above described embodiments, a layer of adhesive film can be coated on the inside or outside surface of the lamp housing 7 or between the lamp housing 7 and the radiator 4 to isolate the outside of the lamp housing 7 from the inside when the lamp housing is broken.

The main ingredient of the adhesive film 8 is calcium carbonate or strontium orthophosphate that can collocate with organic solvents to blend appropriately. In one embodiment, the adhesive film 8 consists of vinyl-terminated silicon oil, hydrosilicon oil, dimethylbenzene and calcium carbonate.

Dimethylbenzene is a supporting material among these ingredients, which volatilizes when the adhesive film has been coated on the inside or outside surface of the lamp housing 7 and has been solidified, and the main function of dimethylbenzene is to adjust viscosity so as to adjust the thickness of the adhesive film.

The thickness selection of the adhesive film 8 depends on the total weight of the LET bulb lamp. The thickness of the adhesive film 8 could be between 200 μm~300 μm when the radiator 4 is injected by heat conducting glue (casting glue) (consisting of at least 70% of the heat conducting glue which is 0.7~0.9 W/m*K) and the total weight of the LED bulb lamp is more than 100 g.

The total weight of the LED bulb lamp is less than about 80 g when there is no heat conducting glue being injected into the radiator 4, and the thickness of the adhesive film 8 can be 40 μm~90 μm so that the LED bulb lamp could have the ability of anti-explosion. The lower limit of the thickness depends on the total weight of the LED bulb light but the question of anti-explosion should be considered, whereas the light transmittance will not be enough and the cost of materials will be increased if the upper limit is more than 300 μm.

When the lamp housing 7 is broken, the adhesive film 8 will join the fragments of the lamp housing 7 together to avoid forming a hole throughout the inside and the outside of the lamp housing 7, so that protecting user from contacting the charged part inside the lamp housing 7 to avoid electric shock accidents.

In addition, the LED bulb lamp according to the disclosure can be selectively coated with a layer of diffusion film on the inside or the outside surface of the lamp housing 7 to mitigate the granular sensation of user watching the light sources 51. Further, the diffusion film not only has the function of diffusing light but also has the function of electrical isolation so as to reduce the risk of electric shock when the lamp housing 7 is broken. In addition, the diffusion film can enable the light to be diffusing to all direction when the LED light sources is lighting, and avoiding generating a dark area on the top of the lamp housing 7 to make a more comfortable lighting environment.

The main ingredients of the diffusion film can comprise at least one or combination of calcium carbonate, calcium halophosphate and aluminum oxide. The diffusion film could have optimal effect of light diffusion and transmission (more than 90% in some cases) when formed by calcium carbonate with an appropriate solution. In an embodiment, the ingredients of the diffusion film comprise: calcium carbonate (e.g., CMS-5000, white powder), thickener (e.g., thickener DV-961, milky white liquid), and ceramic activated carbon (e.g., ceramic activated carbon SW-C, colorless liquid). The chemical name of the thickener DV-961 is colloidal silica modified acrylic resin which is used to increase the stickiness when the calcium carbonate is coated on the inside or outside surface of the lamp housing 7 and comprises the ingredients of acrylic resin, silicone gel and pure water.

In one embodiment, the diffusion film adopts calcium carbonate as the main ingredient and collocates with thickener, ceramic activated carbon and deionizer water. These ingredients are coated on the inside or outside surface of the lamp housing 7 after blending, and the average coat thickness is in the range of 20 μm~30 μm. The deionizer water will volatilize at last and only the three ingredients of calcium carbonate, thickener, and ceramic activated carbon left. In an embodiment, if the diffusion film is formed with different ingredients, the thickness range of the diffusion film can be adopted is 200 μm~300 μm and the light transmittance is kept in the range of 92%~94%, which will have a different effect.

In other embodiments, calcium halophosphate and aluminum oxide can be selected as the main ingredients of the diffusion film. The particle size of calcium carbonate is in the range of about 2 μm~4 μm, whereas the particle sizes of calcium halophosphate and aluminum oxide are in the ranges of about 4 μm-4 μm and 1 μm-2 μm respectively. When the required range of light transmittance is 85%~92%, the average thickness of the diffusion film which has the main gradient of calcium carbonate in whole is about 20 μm~30 μm; the average thickness of the diffusion film which has the main gradient of calcium halophosphate is 25 μm~35 μm and the average thickness of the diffusion film which has the main gradient of aluminum oxide is 10 μm~15 μm when requiring the same light transmittance. If requiring a higher light transmittance, for example, more than 92%, the required thickness of the diffusion film which has the main ingredient of calcium carbonate, calcium halophosphate and aluminum oxide should be thinner. For example, the required thickness of the diffusion film which has the main ingredient of calcium carbonate should be within 10 μm~15 μm. That is, the main ingredients and the corresponding formed thickness, or the like, of the diffusion film to be coated can be selected based on the usage occasion of the LET bulb lamp which has different requirement of light transmittance.

In addition, the LED bulb lamp of present disclosure can be selectively coated with a thin layer of reflecting film on the inside top surface of the lamp housing 7 to convert a portion of the light outputting towards the top of the lamp housing 7 by LED light sources 51 to the sidewall. The reflecting film may have the main gradient of barium sulfate and may be mixed with thickener, 3% of ceramic activated carbon and deionizer water. In an embodiment, the concentration of barium sulfate can be in the range of 45%-55%, and the thickness of the formed reflecting film 9 is about 20 μm~30 μm at this moment. When the average thickness of the coated reflecting film 9 is about 17 μm~20 μm, the light transmittance is up to about 97~98%, that is, 2% of the light emitting towards topside could be reflected towards the sidewall of the LED bulb lamp.

Figure 13:
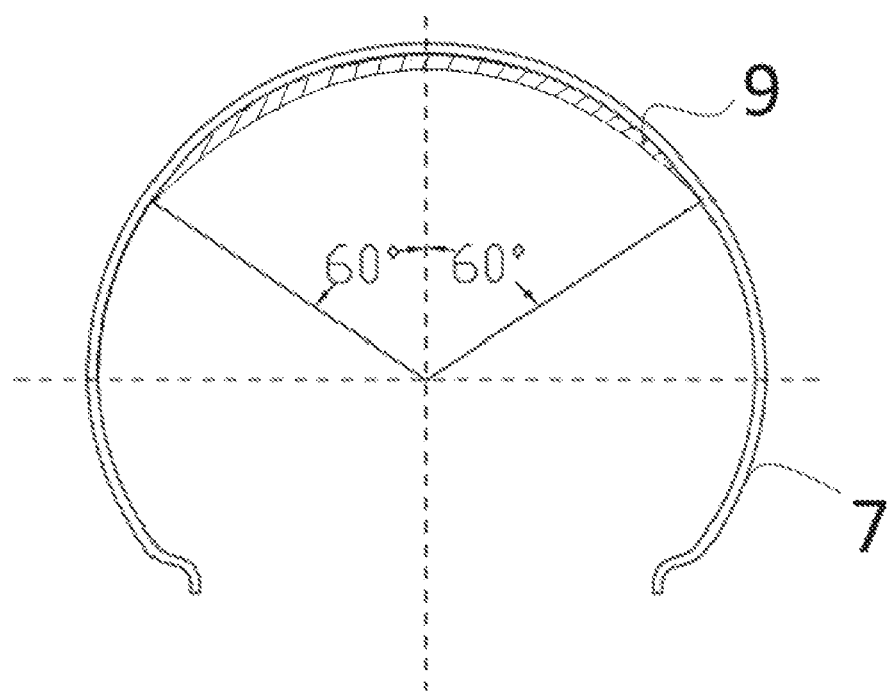
FIG. 13 illustrates a longitudinal sectional view of the lamp housing coated with the reflecting film along the central axis according to an embodiment.

It's to be noted that the target of coating reflecting film 9 is to generate reflection effect after the light hitting the barium sulfate particles, thus there is no need to coat the total lamp housing 7 with the reflecting film 9. As shown in FIG. 13, taking the central axis which is from the lamp head 1 to the center of the lamp housing 7 as the center, the reflecting film 9 can be coated on an approximate equal area from the central axis, that is, the coated reflecting film is distributed symmetrically along the central axis as a circular curved surface, and the coated t reflecting film within an area which has a certain angle with the central axis. In an embodiment, the angle can be 0~60 degree. Preferably, the angle can be 0~45 degree. In addition, when the concentration of the selected reflecting film solution is higher, the coated reflecting film 9 need not to be too thick. Of course, if the requirement for the light transmittance is just 95%, that is, 5% of the light emitting upward will be reflected towards the sidewall of the LED bulb lamp, an adoptable concentration of the barium sulfate solution can be about 55%~60%, and the layer thickness of the reflecting film can be in the range of 25 μm~30 μm. Further, due to on the top of the lamp housing, the light luminance of the light distributed within the area where the angle with the central axis 0~60 degree is diminishing from 0 degree to 60 degree, so the layer thickness of the reflecting film can be gradually reduced from 0 degree at which the thickness is biggest to 60 degree at which the thickness is smallest.

The LED light bulb shown in FIGS. 1-13 may comprise one or more LED filaments, which replaces the LED lamp substrate 5, the LED light sources 51, and other related components. Most of components of the LED light bulb with the LED filament(s) may be common to those of the LED light bulb shown in FIGS. 1-13. For example, the lamp housing 7 of the LED light bulb shown in FIGS. 1-13 may be common to that of the LED light bulb with the LED filament(s). The lamp housing of the LED light bulb with the LED filament(s) may also comprise the adhesive film 8 and the reflecting film 9 described above. The LED light bulb with the LED filament(s) is illustrated below.

Figure 14A:
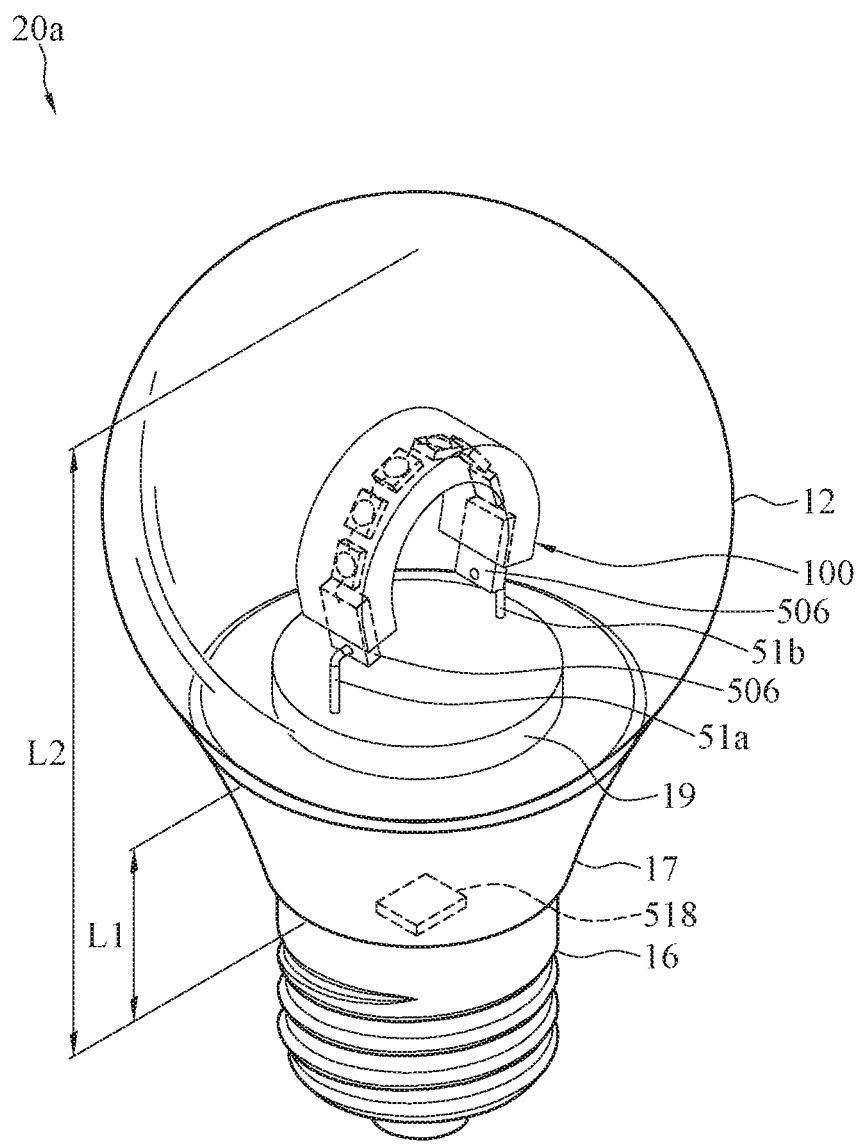
FIG. 14A to FIG. 14C illustrate perspective views of LED light bulbs according to different embodiments of the present disclosure.
Figure 14B:
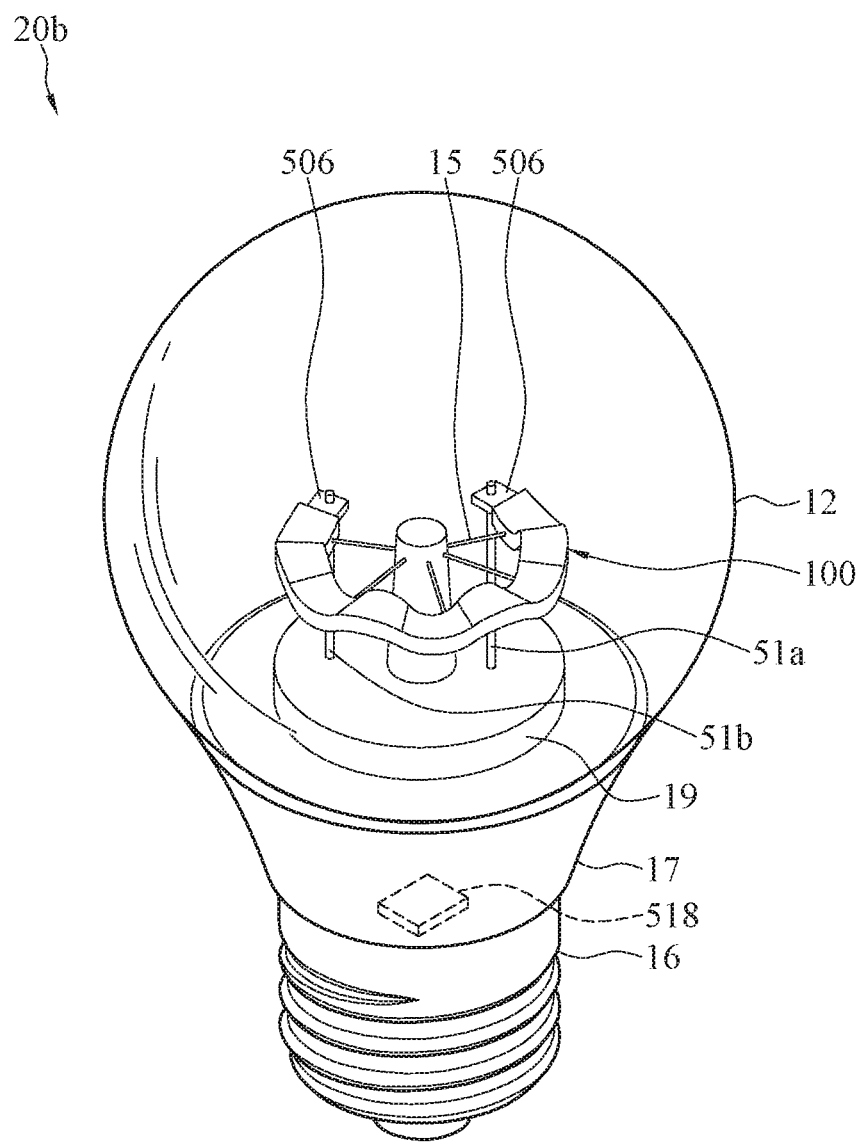

Please refer to FIGS. 14A and 14B which illustrate a perspective view of LED light bulb applying the LED filaments according to a first and a second embodiments. The LED light bulb 20a, 20b comprises a bulb shell 12, a bulb base 16 connected with the bulb shell 12, at least two conductive supports 51a, 51b disposed in the bulb shell 12, a driving circuit 518 electrically connected with both the conductive supports 51a, 51b and the bulb base 16, and a single LED filament 100 disposed in the bulb shell 12.

The conductive supports 51a, 51b are used for electrically connecting with the conductive electrodes 506 and for supporting the weight of the LED filament 100. The bulb base 16 is used to receive electrical power. The driving circuit 518 receives the power from the bulb base 16 and drives the LED filament 100 to emit light. Due that the LED filament 100 emits light like the way a point light source does, the LED light bulb 20a, 20b may emit omnidirectional light. In this embodiment, the driving circuit 518 is disposed inside the LED light bulb. However, in some embodiments, the driving circuit 518 may be disposed outside the LED bulb.

In the embodiment of FIG. 14A, the LED light bulb 20a comprises two conductive supports 51a, 51b. In an embodiment, the LED light bulb may comprise more than two conductive supports 51a, 51b depending upon the design.

The bulb shell 12 may be shell having better light transmittance and thermal conductivity; for example, but not limited to, glass or plastic shell. Considering a requirement of low color temperature light bulb on the market, the interior of the bulb shell 12 may be appropriately doped with a golden yellow material or a surface inside the bulb shell 12 may be plated a golden yellow thin film for appropriately absorbing a trace of blue light emitted by a part of the LED chips 102, 104, so as to downgrade the color temperature performance of the LED bulb 20a, 20b. A vacuum pump may swap the air as the nitrogen gas or a mixture of nitrogen gas and helium gas in an appropriate proportion in the interior of the bulb shell 12, so as to improve the thermal conductivity of the gas inside the bulb shell 12 and also remove the water mist in the air. The air filled within the bulb shell 12 may be at least one selected from the group substantially consisting of helium (He), and hydrogen (H2). The volume ratio of Hydrogen to the overall volume of the bulb shell 12 is from 5% to 50%. The air pressure inside the bulb shell may be 0.4 to 1.0 atm (atmosphere). The aforementioned configurations of the bulb shell 12 can be applied to the lamp housing 7 shown in FIGS. 1-13. In addition, the bulb shell 12 may be the same as or similar to the lamp housing 7 shown in FIGS. 1-13, e.g., the bulb shell 12 may also comprise the adhesive film 8 and the reflecting film 9.

According to the embodiments of FIGS. 14A and 14B, each of the LED light bulbs 20a, 20b comprises a stem 19 in the bulb shell 12 and a heat dissipating element (i.e. heat sink) 17 between the bulb shell 12 and the bulb base 16. In the embodiment, the bulb base 16 is indirectly connected with the bulb shell 12 via the heat dissipating element 17. Alternatively, the bulb base 16 can be directly connected with the bulb shell 12 without the heat dissipating element 17. The LED filament 100 is connected with the stem 19 through the conductive supports 51a, 51b. The stem 19 may be used to swap the air inside the bulb shell 12 with nitrogen gas or a mixture of nitrogen gas and helium gas. The stem 19 may further provide heat conduction effect from the LED filament 100 to outside of the bulb shell 12. The heat dissipating element 17 may be a hollow cylinder surrounding the opening of the bulb shell 12, and the interior of the heat dissipating element 17 may be equipped with the driving circuit 518. The exterior of the heat dissipating element 17 contacts outside gas for thermal conduction. The material of the heat dissipating element 17 may be at least one selected from a metal, a ceramic, and a plastic with a good thermal conductivity effect. The heat dissipating element 17 and the stem 19 may be integrally formed in one piece to obtain better thermal conductivity in comparison with the traditional LED light bulb whose thermal resistance is increased due that the screw of the bulb base is glued with the heat dissipating element.

Please referring to FIG. 14B, the LED filament 100 is bent to form a portion of a contour and to form a wave shape having wave crests and wave troughs. In the embodiment, the outline of the LED filament 100 is a circle when being observed in a top view and the LED filament 100 has the wave shape when being observed in a side view. Alternatively, the outline of the LED filament 100 can be a wave shape or a petal shape when being observed in a top view and the LED filament 100 can have the wave shape or a line shape when being observed in a side view. In order to appropriately support the LED filament 100, the LED light bulb 20b further comprises a plurality of supporting arms 15 which are connected with and supports the LED filament 100. The supporting arms 15 may be connected with the wave crest and wave trough of the waved shaped LED filament 100. In this embodiment, the arc formed by the filament 100 is around 270 degrees. However, in other embodiment, the arc formed by the filament 100 may be approximately 360 degrees. Alternatively, one LED light bulb 20b may comprise two LED filaments 100 or more. For example, one LED light bulb 20b may comprise two LED filaments 100 and each of the LED filaments 100 is bent to form approximately 180 degrees arc (semicircle). Two semi-circle LED filaments 100 are disposed together to form an approximately 360 circle. By the way of adjusting the arc formed by the LED filament 100, the LED filament 100 may provide with omnidirectional light. Further, the structure of one-piece filament simplifies the manufacturing and assembly procedures and reduces the overall cost.

The LED filament 100 has no any substrate plate that the conventional LED filament usually has; therefore, the LED filament 100 is easy to be bent to form elaborate curvatures and varied shapes, and structures of conductive electrodes 506 and wires connecting the conductive electrodes 506 with the LEDs inside the LED filament 100 are tough to prevent damages when the LED filament 100 is bent. The details of the LED filament 100 will be discussed later.

In some embodiment, the supporting arm 15 and the stem 19 may be coated with high reflective materials, for example, a material with white color. Taking heat dissipating characteristics into consideration, the high reflective materials may be a material having good absorption for heat radiation like graphene. Specifically, the supporting arm 15 and the stem 19 may be coated with a thin film of graphene.

Figure 14C:
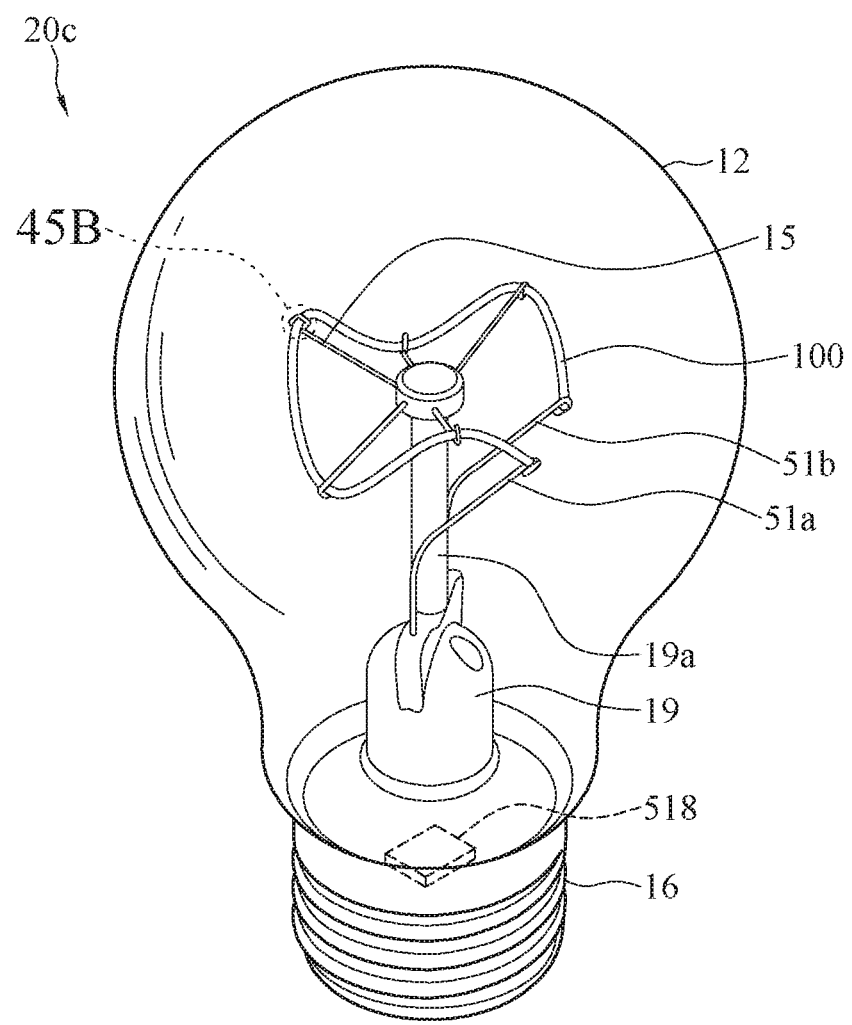

Please refer to FIG. 14C. FIG. 14C illustrates a perspective view of an LED light bulb according to a third embodiment of the present disclosure. According to the third embodiment, the LED light bulb 20c comprises a bulb shell 12, a bulb base 16 connected with the bulb shell 12, two conductive supports 51a, 51b disposed in the bulb shell 12, a driving circuit 518 electrically connected with both the conductive supports 51a, 51b and the bulb base 16, a stem 19, supporting arms 15 and a single LED filament 100.

The cross-sectional size of the LED filaments 100 is small than that in the embodiments of FIGS. 14A and 14B. The conductive electrodes 506 of the LED filaments 100 are electrically connected with the conductive supports 51a, 51b to receive the electrical power from the driving circuit 518. The connection between the conductive supports 51a, 51b and the conductive electrodes 506 may be a mechanical pressed connection or soldering connection. The mechanical connection may be formed by firstly passing the conductive supports 51a, 51b through the through holes 506h (shown in FIG. 15A) and secondly bending the free end of the conductive supports 51a, 51b to grip the conductive electrodes 506. The soldering connection may be done by a soldering process with a silver-based alloy, a silver solder, a tin solder.

Similar to the first and second embodiments shown in FIGS. 14A and 14B, the LED filament 100 shown in FIG. 14C is bent to form a contour from the top view of FIG. 14C. In the embodiment of FIG. 14C, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

In some embodiments, four quadrants may be defined in a top view of an LED light bulb (e.g., the LED light bulb 20b shown in FIG. 14B or the LED light bulb 20c shown in FIG. 14C), and the origin of the four quadrants may be defined as a center of a stem/stand of the LED light bulb in the top view (e.g., a center of the top of the stand of the stem 19 shown in FIG. 14B or a center of the top of the stand 19a shown in FIG. 14C). The LED filament of the LED light bulb (e.g., the LED filaments 100 shown in FIG. 14B and FIG. 14C) in the top view may be presented as an annular structure, shape or, contour. The LED filament presented in the four quadrants in the top view may be symmetric. For example, the structure of a portion of the LED filament in the first quadrant is symmetric with that of a portion of the LED filament in the second quadrant, in the third quadrant, or in the fourth quadrant. The LED filament presented in the four quadrants in the top view may be in point symmetry (e.g., being symmetric with the origin of the four quadrants) or in line symmetry (e.g., being symmetric with one of the two axis the four quadrants).

A tolerance (a permissible error) of the symmetric structure of the LED filament in the four quadrants in the top view may be 20%-50%. For example, in a case that the structure of a portion of the LED filament in the first quadrant is symmetric with that of a portion of the LED filament in the second quadrant, a designated point on portion of the LED filament in the first quadrant is defined a first position, a symmetric point to the designated point on portion of the LED filament in the second quadrant is defined a second position, and the first position and the second position may be exactly symmetric or be symmetric with 20%-50% difference.

In addition, a length of a portion of the LED filament in one of the four quadrants in the top view is substantially equal to that of a portion of the LED filament in another one of the four quadrants in the top view. The lengths of portions of the LED filament in different quadrants in the top view may also have 20%-50% difference.

In some embodiments, four quadrants may be defined in a side view of an LED light bulb (e.g., the LED light bulb 20a shown in FIG. 14A or the LED light bulb 20c shown in FIG. 14C). In such case, a stand may be defined as the Y-axis, and the X-axis may cross a middle of the stand (e.g., the stand 19a of the LED light bulb 20c shown in FIG. 14C) while the origin of the four quadrants may be defined as the middle of the stand. Portions of the LED filament presented in the first quadrant and the second quadrant (the upper quadrants) in the side view may be symmetric (e.g., in line symmetry with the Y-axis) in structure; portions of the LED filament presented in the third quadrant and the fourth quadrant (the lower quadrants) in the side view may be symmetric (e.g., in line symmetry with the Y-axis) in structure. Additionally, the portions of the LED filament presented in the upper quadrants in the side view may be asymmetric with the portions of the LED filament presented in the lower quadrants in the side view. In particular, the portion of the LED filament presented in the first quadrant and the fourth quadrant in the side view is asymmetric, and the portion of the LED filament presented in the second quadrant and the third quadrant in the side view is asymmetric.

A tolerance (a permissible error) of the symmetric structure of the LED filament in the first quadrant and the second quadrant in the side view may be 20%-50%. For example, a designated point on portion of the LED filament in the first quadrant is defined a first position, a symmetric point to the designated point on portion of the LED filament in the second quadrant is defined a second position, and the first position and the second position may be exactly symmetric or be symmetric with 20%-50% difference.

In addition, a length of a portion of the LED filament in the first quadrant in the side view is substantially equal to that of a portion of the LED filament in the second quadrant in the side view. A length of a portion of the LED filament in the third quadrant in the side view is substantially equal to that of a portion of the LED filament in the fourth quadrant in the side view. However, the length of the portion of the LED filament in the first quadrant or the second quadrant in the side view is different from the length of the portion of the LED filament in the third quadrant or the fourth quadrant in the side view. In some embodiment, the length of the portion of the LED filament in the third quadrant or the fourth quadrant in the side view may be less than that of the portion of the LED filament in the first quadrant or the second quadrant in the side view. The lengths of portions of the LED filament in the first and the second quadrants or in the third and the fourth quadrants in the side view may also have 20%-50% difference.

Figure 15A:
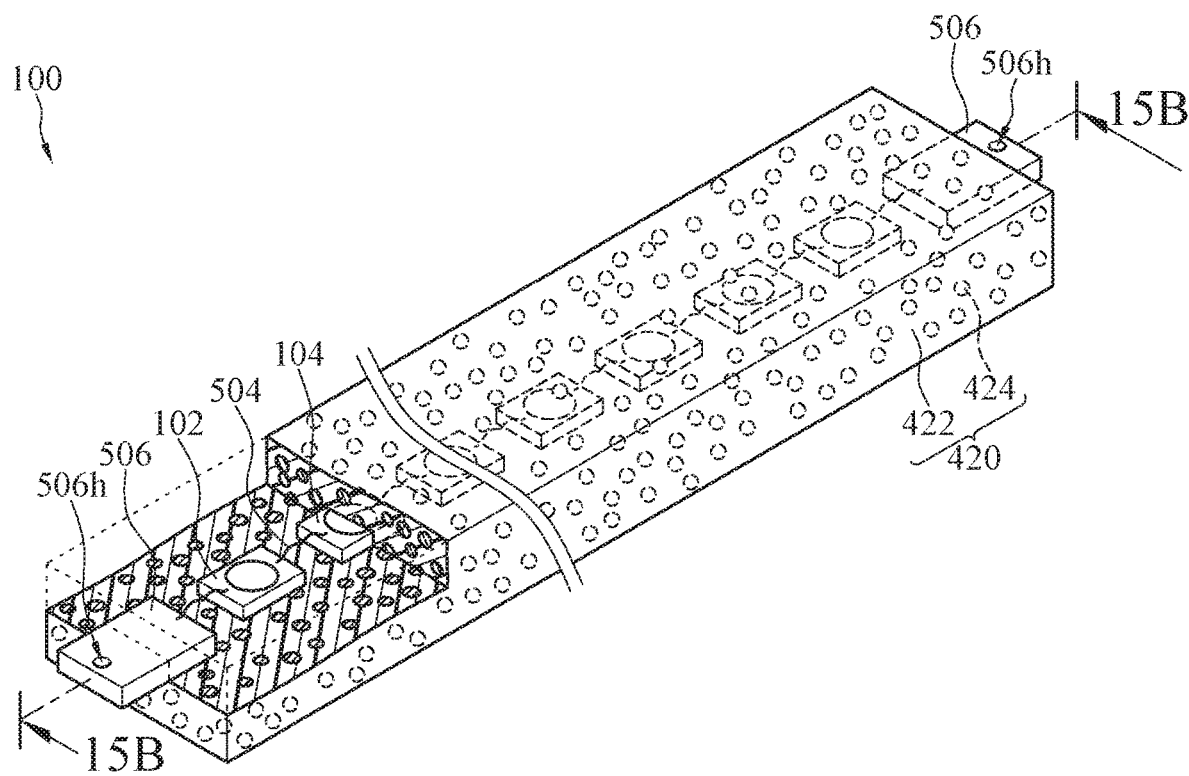
FIG. 15A and FIG. 15B respectively illustrate a perspective view and a partially cross sectional view of an LED filament according to an embodiment of the present disclosure.
Figure 15B:
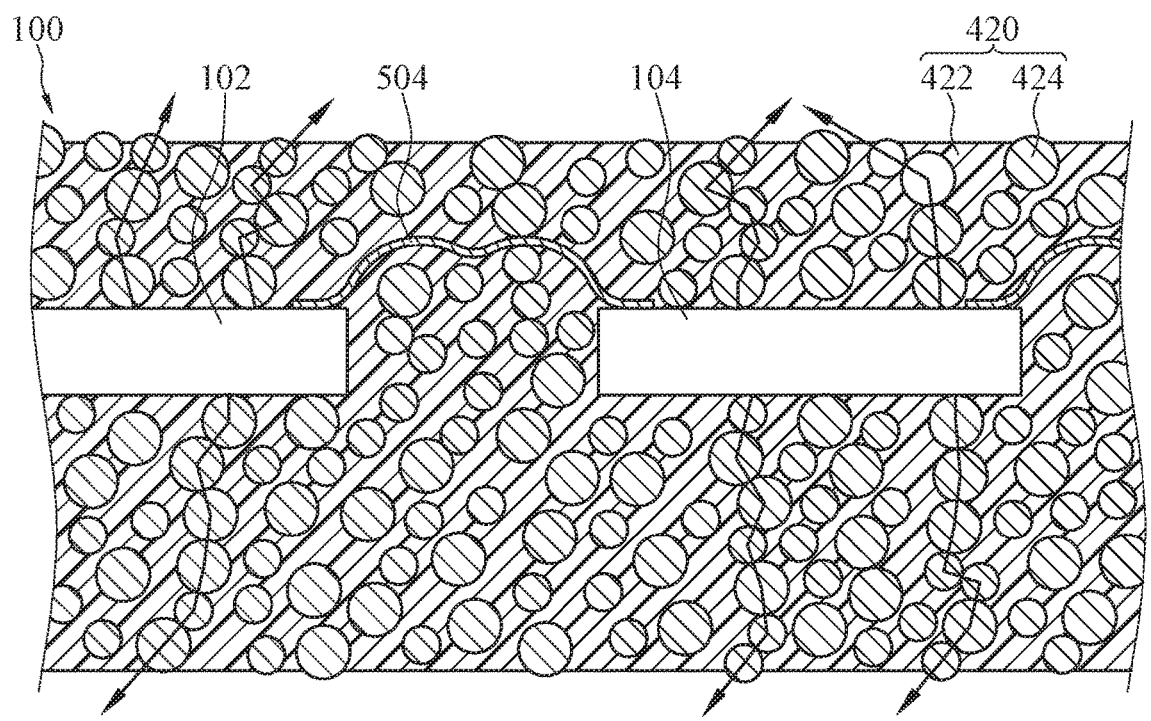

Please refer to FIGS. 15A and 15B. FIG. 15A illustrates a perspective view of an LED filament with partial sectional view according to a first embodiment of the present disclosure while FIG. 15B illustrates a partial cross-sectional view at section 15B-15B of FIG. 15A. According to the first embodiment, the LED filament 100 comprises a plurality of LED chips 102, 104, at least two conductive electrodes 506, and a light conversion coating 420. The conductive electrodes 506 are disposed corresponding to the plurality of LED chips 102, 104. The LED chips 102, 104 are electrically coupled together. The conductive electrodes 506 are electrically connected with the plurality of LED chips 102, 104. The light conversion coating 420 coats on at least two sides of the LED chips 102, 104 and the conductive electrodes 506. The light conversion coating 420 exposes a portion of two of the conductive electrodes 506. The light conversion coating 420 comprises an adhesive 422 and a plurality of phosphors 424.

LED filament 100 emits light while the conductive electrodes 506 are applied with electrical power (electrical current sources or electrical voltage sources). In this embodiment, the light emitted from the LED filament 100 is substantially close to 360 degrees light like that from a point light source. An LED light bulb 20a, 20b, illustrated is in FIGS. 14A and 14B, utilizing the LED filament 100 is capable of emitting omnidirectional light, which will be described in detailed in the followings.

As illustrated in the FIG. 15A, the cross-sectional outline of the LED filament 100 is rectangular. However, the cross-sectional outline of the LED filament 100 is not limited to rectangular, but may be triangle, circle, ellipse, square, diamond, or square with chamfers.

Each of LED chips 102, 104 may comprise a single LED die or a plurality of LED dies. In the embodiment, each of the LED chips 102, 104 is an LED die without any package. The outline of the LED chip 102, 104 may be, but not limited to, a strip shape. The number of the LED chips 102, 104 having strip shapes of the LED filament 100 could be less, and, correspondingly the number of the electrodes of the LED chips 102, 104 is less, which can improve the illuminating efficiency since the electrodes may shield the illumination of the LED chip, thereby affecting the illumination efficiency. In addition, the LED chips 102, 104 may be coated on their surfaces with a conductive and transparent layer of Indium Tin Oxide (ITO).

The LED chips 102, 104 may comprise sapphire substrate or transparent substrate. Consequently, the substrates of the LED chips 102, 104 do not shield/block light emitted from the LED chips 102, 104. In other words, the LED chips 102, 104 are capable of emitting light from each side of the LED chips 102, 104.

The electrical connections among the plurality of LED chips 102, 104 and the conductive electrodes 506, in this embodiment, may be shown in FIG. 15A. The LED chips 102, 104 are connected in series and the conductive electrodes 506 are disposed on and electrically and respectively connected with the two ends of the series-connected LED chips 102, 104. However, the connections between the LED chips 102, 104 are not limited to that in FIG. 15A. Alternatively, the connections may be that two adjacent LED chips 102, 104 are connected in parallel and then the parallel-connected pairs are connected in series.

According to this embodiment, the conductive electrodes 506 may be, but not limited to, metal electrodes. The conductive electrodes 506 are disposed at two ends of the series-connected LED chips 102, 104 and a portion of each of the conductive electrodes 506 are exposed out of the light conversion coating 420. The arrangement of the conductive electrodes 506 is not limited to the aforementioned embodiment.

Please refer to FIGS. 15A and 15B again. According to this embodiment, the LED filament 100 further comprises conductive wires 540 for electrically connecting the adjacent LED chips 102, 104 and conductive electrodes 506. The conductive wires 540 may be gold wires formed by a wire bond of the LED package process, like Q-type. In an embodiment, the conductive wire 540 is naturally arched between two adjacent LED chips 102, 104 and between the LED chip 102 and the conductive electrode 506. In some embodiments, according to FIG. 15B, the conductive wires 540 are of M shape. The M shape here is not to describe that the shape of the conductive wires 540 exactly looks like letter M, but to describe a shape which prevents the wires from being tight and provides buffers when the conductive wires 540 or the LED filament 100 is stretched or bended. Specifically, the M shape may be any shape formed by a conductive wire 540 whose length is longer than the length of a wire which naturally arched between two adjacent LED chips 102, 104. The M shape includes any shape which could provide buffers while the conductive wires 104 are bended or stretched; for example, S shape.

The light conversion coating 420 comprises adhesive 422 and phosphors 424. The light conversion coating 420 may, in this embodiment, wrap or encapsulate the LED chips 102, 104 and the conductive electrodes 506. In other words, in this embodiment, each of six sides of the LED chips 102, 104 is coated with the light conversion coating 420; preferably, but not limited to, is in direct contact with the light conversion coating 420. However, at least two sides of the LED chips 102, 104 may be coated with the light conversion coating 420. Preferably, the light conversion coating 420 may directly contact at least two sides of the LED chips 102, 104. The two directly-contacted sides may be the major surfaces which the LED chips emit light. Referring to FIG. 15A, the major two surfaces may be the top and the bottom surfaces. In other words, the light conversion coating 420 may directly contact the top and the bottom surfaces of the LED chips 102, 104 (upper and lower surfaces of the LED chips 102, 104 shown in FIG. 15B). Said contact between each of six sides of the LED chips 102, 104 and the light conversion coating 420 may be that the light conversion coating 420 directly or indirectly contacts at least a portion of each side of the LED chips 102, 104. Specifically, one or two sides of the LED chips 102, 104 may be in contact with the light conversion coating 420 through die bond glue. The light conversion coating 420 may further comprise heat dissipation particles (such as nanoparticle oxide) to improve the effect of heat dissipation.

The phosphors 424 of the light conversion coating 420 absorb some form of radiation to emit light. For instance, the phosphors 424 absorb light with shorter wavelength and then emit light with longer wavelength. In one embodiment, the phosphors 424 absorb blue light and then emit yellow light. The blue light which is not absorbed by the phosphors 424 mixes with the yellow light to form white light. According to the embodiment where six sides of the LED chips 102, 104 are coated with the light conversion coating 420, the phosphors 424 absorb light with shorter wavelength out of each of the sides of the LED chips 102, 104 and emit light with longer wavelength. The mixed light (longer and shorter wavelength) is emitted from the outer surface of the light conversion coating 420 which surrounds the LED chips 102, 104 to form the main body of the LED filament 100. In other words, each of sides of the LED filament 100 emits the mixed light.

The light conversion coating 420 may expose a portion of two of the conductive electrodes 506. Phosphors 424 are harder than the adhesive 422. The size of the phosphors 424 may be 1 to 30 um (micrometer) or 5 to 20 um. The size of the same phosphors 424 are generally the same. In FIG. 15B, the reason why the cross-sectional sizes of the phosphors 424 are different is the positions of the cross-section for the phosphors 424 are different. The adhesive 422 may be transparent, for example, epoxy resin, modified resin or silica gel, and so on.

The composition ratio of the phosphors 424 to the adhesive 422 may be 1:1 to 99:1, or 1:1 to 50:1. The composition ratio may be volume ratio or weight ratio. Please refer to FIG. 15B again. The amount of the phosphors 424 is greater than the adhesive 422 to increase the density of the phosphors 424 and to increase direct contacts among phosphors 424. The arrow lines on FIG. 15B show thermal conduction paths from LED chips 102, 104 to the outer surfaces of the LED filament 100. The thermal conduction paths are formed by the adjacent and contacted phosphors. The more direct contacts among the phosphors 424, the more thermal conduction paths forms, the greater the heat dissipating effect the LED filament 100 has, and the less the light conversion coating becomes yellow. Additionally, the light conversion rate of the phosphors 424 may reach 30% to 70% and the total luminance efficiency of the LED light bulb 20a, 20b is increased. Further, the hardness of the LED filament 100 is increased, too. Accordingly, the LED filament 100 may stand alone without any embedded supporting component like rigid substrates. Furthermore, the surfaces of cured LED filament 100 are not flat due to the protrusion of some of the phosphors 424. In other words, the roughness of the surfaces and the total surface area are increased. The increased roughness of the surfaces improves the amount of light passing the surfaces. The increased surface area enhances the heat dissipating effect. As a result, the overall luminance efficiency of the LED light filament 100 is raised.

As mention above, a desired deflection of the LED filament 100 may be achieved by the adjustment of the ratio of phosphors 424 to the adhesive 422. For instance, the Young's Modulus (Y) of the LED filament 100 may be between 0.1×1010 to 0.3×1010 Pa. If necessary, the Young's Modulus of the LED filament 100 may be between 0.15× 1010 to 0.25×1010 Pa. Consequently, the LED filament 100 would not be easily broken and still possess adequate rigidity and deflection.

Figure 16A:
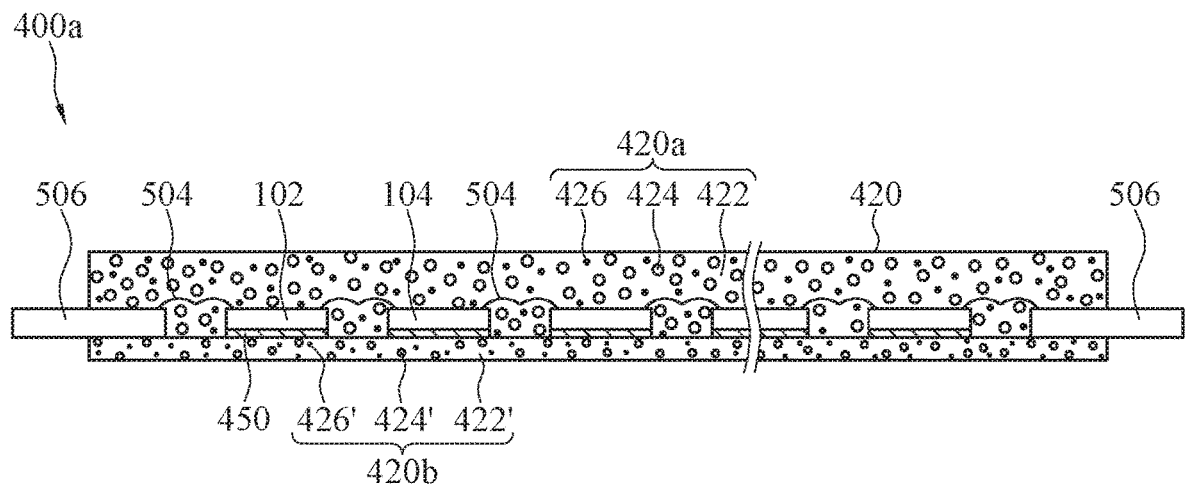
FIG. 16A illustrates a cross sectional view of an LED filament according to an embodiment of the present disclosure.

Please refer to FIG. 16A. FIG. 16A illustrates a cross-sectional view of an LED filament 400a according to an embodiment of the present disclosure. In an embodiment, the LED filament comprises multiple layers as shown in FIG. 16 including a base layer 420b formed by phosphor film and a top layer 420a formed by phosphor glue. An outer surface of the base layer 420b and/or an outer surface of the top layer 420a may be processed in a surface roughening manner. The LED filament 400a is analogous to and can be referred to the LED filament 100 with a light conversion coating 420 divided into the top layer 420a and the base layer 420b. The LED filament 400a comprises LED chips 102, 104, conductive electrodes 506, conductive wires 504 for electrically connecting the adjacent LED chips 102, 104 and conductive electrodes 506, and light conversion coating 420 coating on at least two sides of the LED chips 102, 104 and the conductive electrodes 506. The light conversion coating 420 exposes a portion of two of the conductive electrodes 506. The light conversion coating 420 comprises a top layer 420a and a base layer 420b. The base layer 420b coats on one side of the LED chips 102, 104 and the conductive electrodes 506. The top layer 420a coats on another sides of the LED chips 102, 104 and the conductive electrodes 506.

The top layer 420a and the base layer 420b may be distinct by a manufacturing procedure of the LED filament 400a. During a manufacturing procedure, the base layer 420b can be formed in advance. Next, the LED chips 102, 104 and the conductive electrodes 506 can be disposed on the base layer 420b. The LED chips 102, 104 are connected to the base layer 420b via die bond glues 450. The conductive wires 504 can be formed between the adjacent LED chips 102, 104 and conductive electrodes 506. Finally, the top layer 420a can be coated on the LED chips 102, 104 and the conductive electrodes 506.

In the embodiment, the top layer 420a is the phosphor glue layer, and the base layer 420b is the phosphor film layer. The phosphor glue layer comprises an adhesive 422, a plurality of phosphors 424, and a plurality of inorganic oxide nanoparticles 426. The adhesive 422 may be silica gel or silicone resin. The plurality of the inorganic oxide nanoparticles 426 may be, but not limited to, aluminium oxides (Al2O3). The phosphor film layer comprises an adhesive 422', a plurality of phosphors 424', and a plurality of inorganic oxide nanoparticles 426'. The compositions of the adhesives 422 and adhesive 422' may be different. The adhesive 422' may be harder than the adhesive 422 to facilitate the disposition of the LED chips 102, 104 and the conductive wires 504. For example, the adhesive 422 may be silicone resin, and the adhesive 422' may be a combination of silicone resin and PI gel. The mass ratio of the PI gel of the adhesive 422' can be equal to or less than 10%. The PI gel can strengthen the hardness of the adhesive 422'. The plurality of the inorganic oxide nanoparticles 426 may be, but not limited to, aluminium oxides (Al2O3) or aluminium nitride. The size of the phosphors 424' may be smaller than that of the phosphors 424. The size of the inorganic oxide nanoparticles 426' may be smaller than that of the inorganic oxide nanoparticles 426. The size of inorganic oxide nanoparticles may be around 100 to 600 nanometers (nm). The inorganic oxide nanoparticles are beneficial of heat dissipating. In some embodiment, part of inorganic oxide nanoparticles may be replaced by inorganic oxide particles which have the size of 0.1 to 100 μm. The heat dissipation particles may be with different sizes.

Figure 16B:
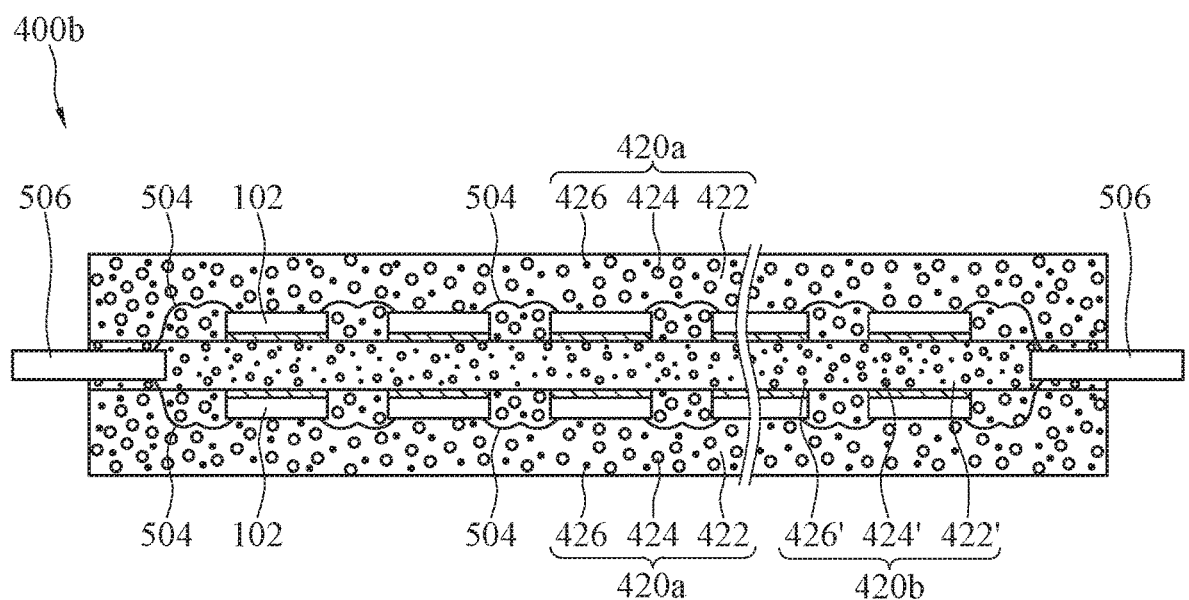
FIG. 16B to FIG. 16E respectively illustrate a cross-sectional view of an LED filament according to another embodiments of the present disclosure.

Please refer to FIG. 16B. FIG. 16B illustrates a cross-sectional view of an LED filament 400b according to another embodiment of the present disclosure. The LED filament 400b is analogous to and can be referred to the LED filament 400a. In the embodiment, the LED chips 102, 104, the conductive wires 504, and the top layer 420a are disposed on two opposite sides of the base layer 420b. In other words, the base layer 420b is between the two top layers 420a. The conductive electrodes 506 are at two opposite ends of the base layer 420b. The LED chips 102 of both of the two top layers 420a can be connected to the same conductive electrodes 506 via the conductive wires 504.

Figure 16C:
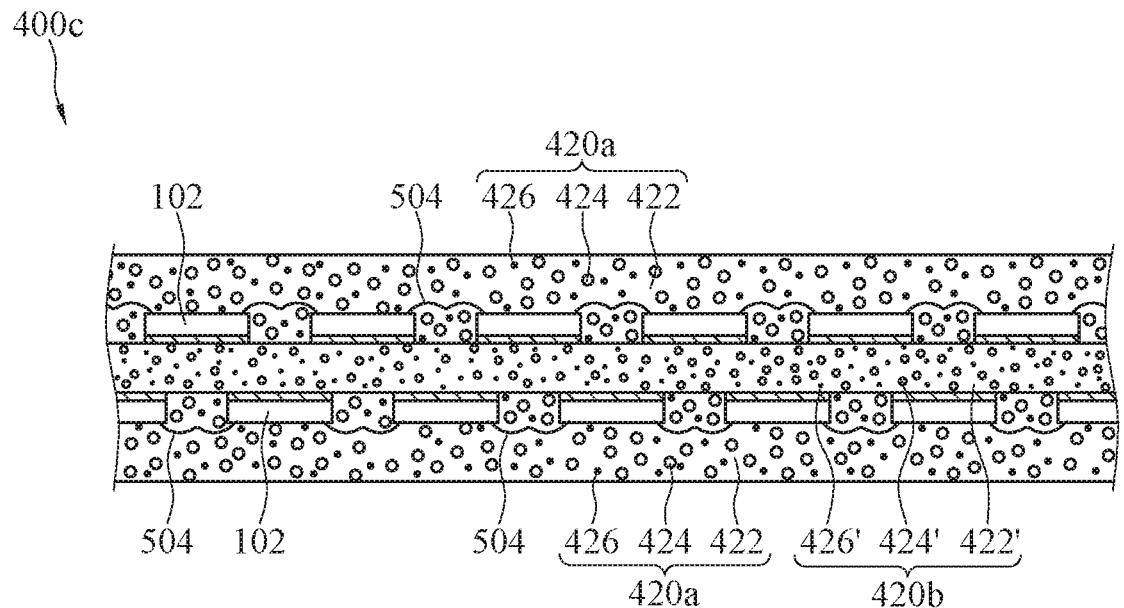

Please refer to FIG. 16C. FIG. 16C illustrates a cross-sectional view of an LED filament 400c according to another embodiment of the present disclosure. In the embodiments, as shown in FIG. 16C, the LED chips 102, 104 at the two opposites sides of the base layer 420b are interlaced with each other. For illustration purpose, the LED chips 102, 104 at an upper side of the base layer 420b shown in FIG. 16C is named an upper LED chip set, and the LED chips 102, 104 at a lower side of the base layer 420b shown in FIG. 16C is named a lower LED chip set. There are gaps defined on an axial direction of the LED filament 400c between each adjacent two of the LED chips 102, 104 of the upper LED chip set, between each adjacent two of the LED chips 102, 104 of the lower LED chip set, or between the conductive electrode 506 and the LED chip 102 of the upper or lower LED chip set. Each of the LED chips 102, 104 of the upper LED chip set is aligned with, on a radial direction of the LED filament 400c, the closest gap between each adjacent two of the LED chips 102, 104 of the lower LED chip set or between the conductive electrode 506 and the LED chip 102 of the lower LED chip set, and vice versa.

As shown in FIG. 16C, in an embodiment, a length of each of the gaps of the upper and lower LED chip sets on the axial direction of the LED filament 400c is less than that of the LED chips 102, 104. In an embodiment, the length of each of the gaps of the upper and lower LED chip sets on the axial direction of the LED filament 400c is ½ length of the LED chips 102, 104. Each of the LED chips 102, 104 of the upper LED chip set not only overlaps the closest gap between each adjacent two of the LED chips 102, 104 of the lower LED chip set, but also overlaps a part (e.g., ¼ in length) of each of the adjacent two of the LED chips 102, 104 of the lower LED chip set forming the closest gap. A gap between LED chips usually causes a dark region where has a lower brightness. However, in the embodiment, illumination of the LED filament 400c would be more smooth and even because every gap in one LED chip sets (the upper or lower LED chip set) can be covered by another LED chips 102, 104 of another LED chip set on the radial direction of the LED filament 400c.

In some embodiments, the base layer 420b between the upper or lower LED chip set as shown in FIG. 16C can be replaced by a brace made by metal or other adequate materials. The brace is hollowed out or engraved out to form mane through holes, such that light rays emitted from the LED chips 102, 104 of the upper LED chip set can pass through the brace to the opposite side, and vice versa.

Figure 16D:
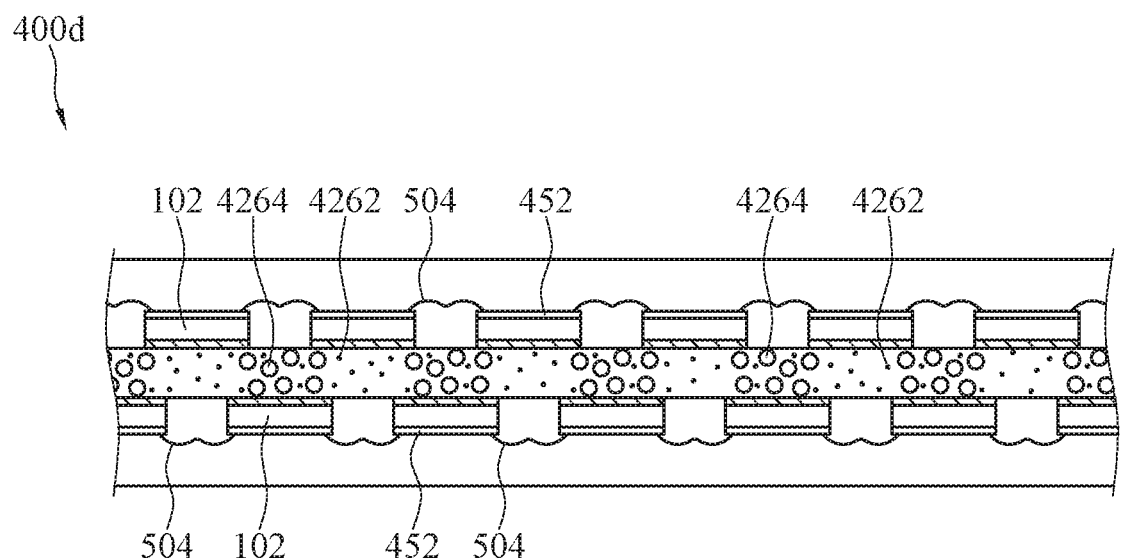

Please refer to FIG. 16D. FIG. 16D illustrates a cross-sectional view of an LED filament 400d according to another embodiment of the present disclosure. For illustration purpose, the phosphors 424, 424' and the inorganic oxide nanoparticles 426, 426' of the LED filament 400b, 400c shown in FIG. 16B and FIG. 16C are omitted in FIG. 16D. The LED filament 400d in FIG. 16D comparing to the LED filament 400c in FIG. 16C further comprises scattering particles 4262 and reflecting particles 4264 in the base layer 420b, and the LED chips 102, 104 of the upper and lower LED chip set face toward the base layer 420b. The scattering particles 4262 can scatter light rays. The scattering particles 4262 may comprise material such as oxide of metal or hydroxide of metal. The reflecting particles 4264 can reflect light rays. The reflecting particles 4264 may comprise metal such as aluminum or silver. The scattering particles 4262 are distributed all over the base layer 420b. The reflecting particles 4264 are concentrated between each of the LED chips 102, 104 of the upper LED chip set and the closest gap corresponding to the LED chips 102, 104 of the lower LED chip set. Light rays emitted from the LED chips 102, 104 of the upper and lower LED chip set enters the base layer 420b in advance and are reflected and scattered by the reflecting particles 4264 and the scattering particles 4262. Reflected and scattered light rays would pass through the gaps toward different directions. As shown in FIG. 16D, the LED filament 400d further comprises, but is not limited to, a plurality of reflecting layers 452. The reflecting layers 452 are respectively disposed on a face of each of the LED chips 102, 104 away from the base layer 420b. Light rays may be reflected by the reflecting layers 452, and the reflected light rays may enter the base layer 420b and be further scattered and reflected by the scattering particles 4262 and the reflecting particles 4264. In such case, the illumination of the LED filament 400d can be more smooth and even.

In other embodiments according to FIG. 16D, the reflecting particles 4264 may be replaced by reflecting thin films. In other embodiments according to FIG. 16D, the reflecting particles 4264 or the reflecting thin films are not necessary and may be eliminated from the base layer 420b.

Figure 16E:
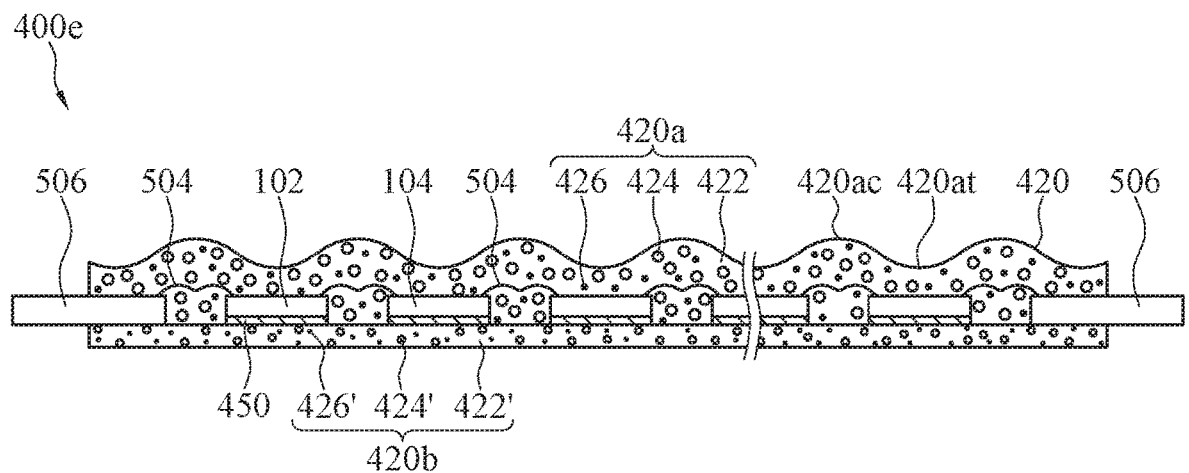

Please refer to FIG. 16E. FIG. 16E illustrates a cross-sectional view of an LED filament 400e according to another embodiment of the present disclosure. A difference between the LED filament 400e in FIG. 16E and the LED filament 400a in FIG. 16A is that the top layer 420a of the LED filament in FIG. 16E has wave shape. The wave shaped top layer 420a comprises wave crests 420ac and wave troughs 420at. Each of the wave crests 420ac are respectively corresponding to each of gaps between the adjacent two of the LED chips 102, 104. Each of the wave troughs 420at are respectively corresponding to each of the LED chips 102, 104. In particular, each of the wave crests 420ac overlaps each of the gaps between the adjacent two of the LED chips 102, 104 on a radial direction of the LED filament 400e, and each of the wave troughs 420at overlaps each of the LED chips 102, 104 on the radial direction of the LED filament 400e. The amount of the phosphors 424 and the inorganic oxide nanoparticles 426 in the wave crests 420ac is greater than that of the phosphors 424 and the inorganic oxide nanoparticles 426 in the wave troughs 420at; therefore, the brightness of the region corresponding to the gaps can be increased. In such case, the illumination of the LED filament 400e can be more smooth and even.

Figure 17A:
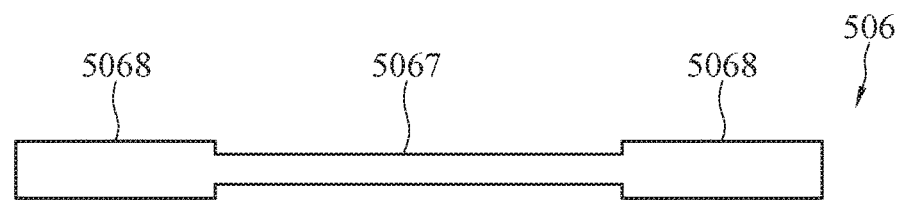
FIG. 17A to FIG. 17Q respectively illustrate bottom views and cross sectional views of conductive electrodes of an LED filament according to different embodiments of the present disclosure.
Figure 17B:
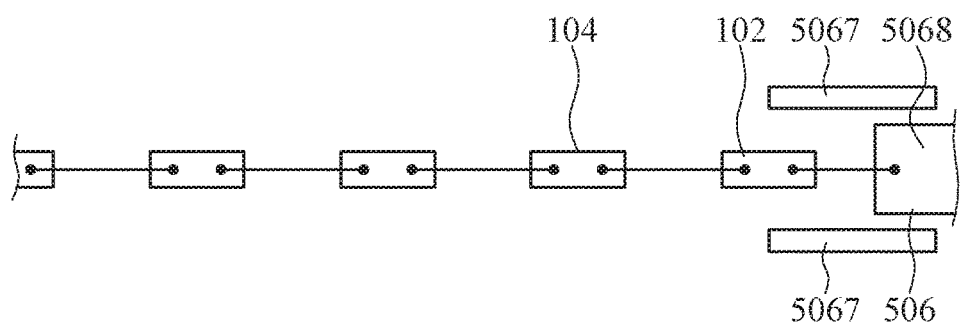
Figure 17C:
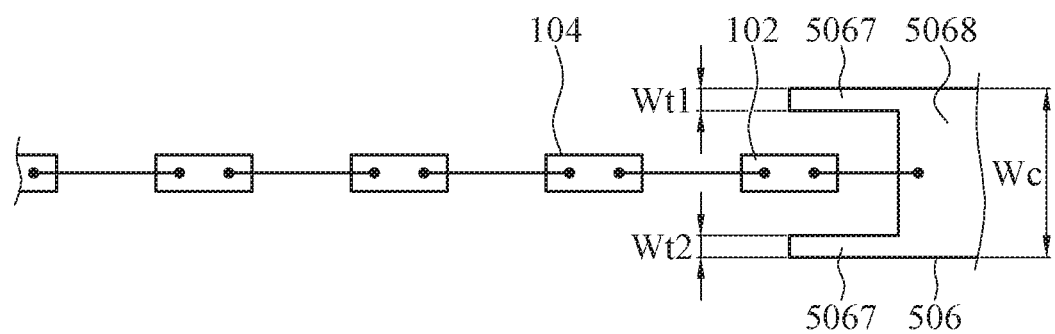
Figure 17D:
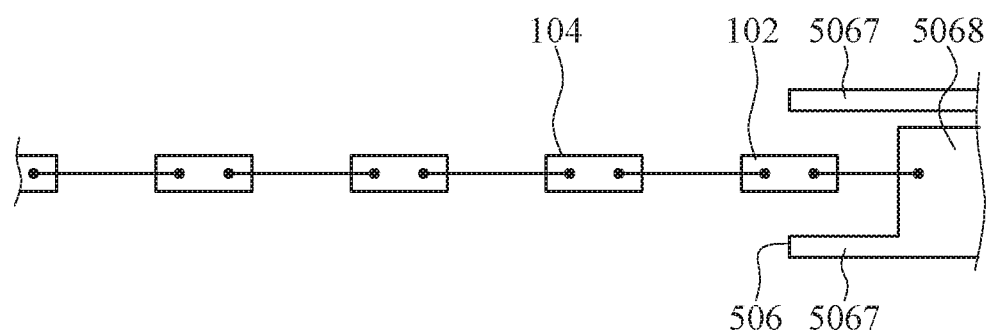
Figure 17E:
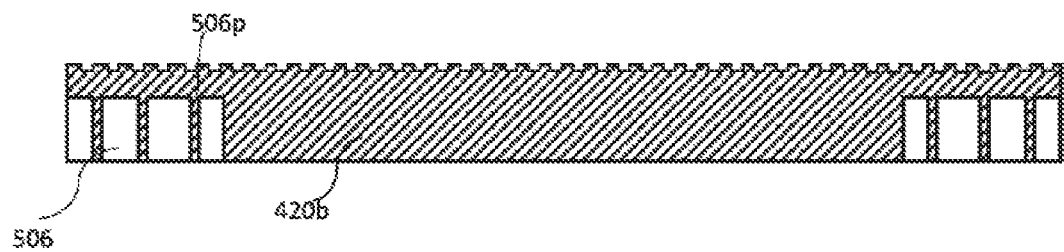
Figure 17F:
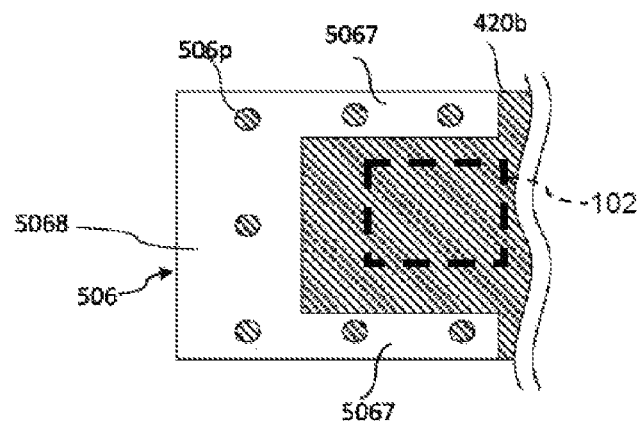
Figure 17G:
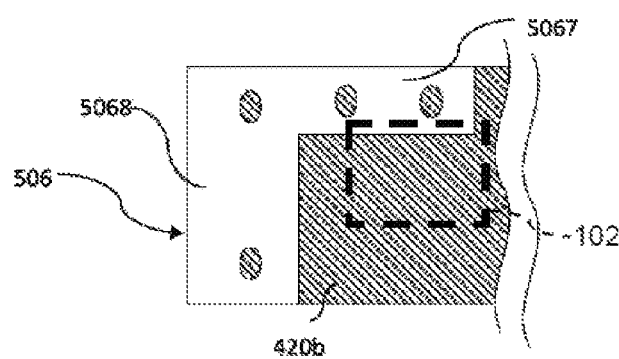
Figure 17H:
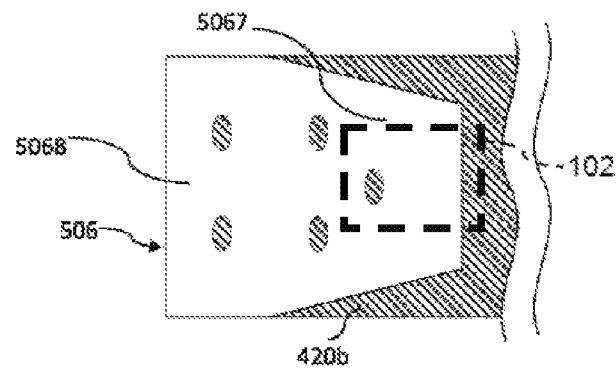
Figure 17I:
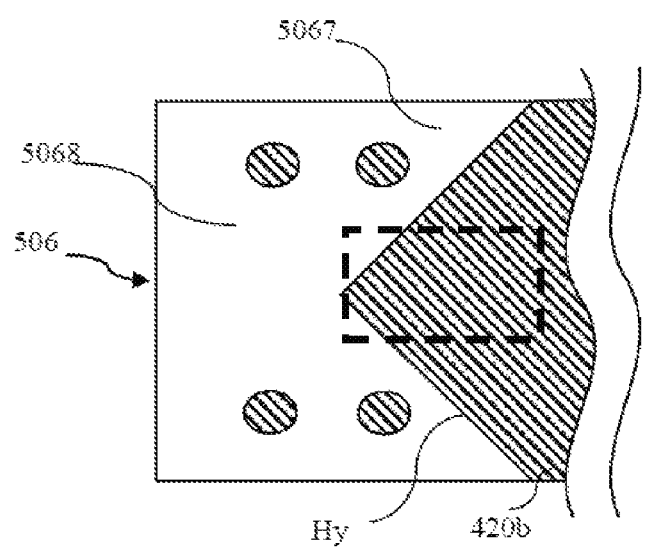
Figure 17J:
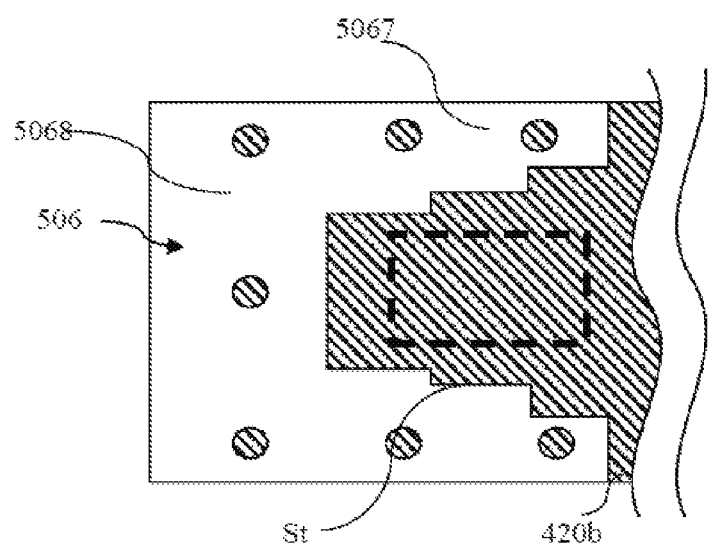
Figure 17K:
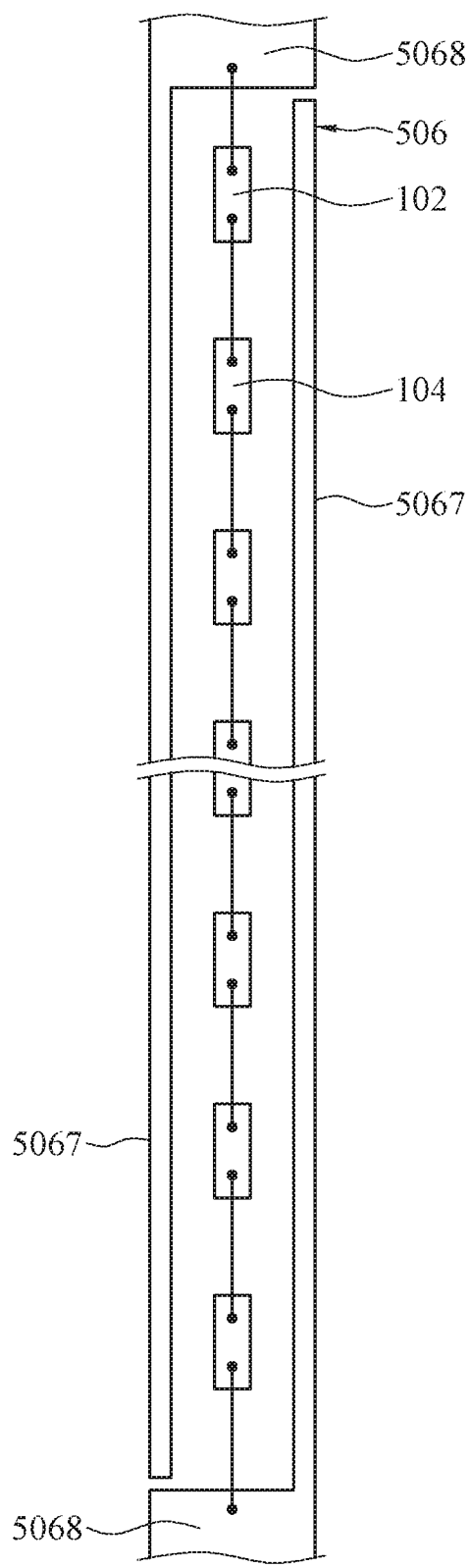
Figure 17L:
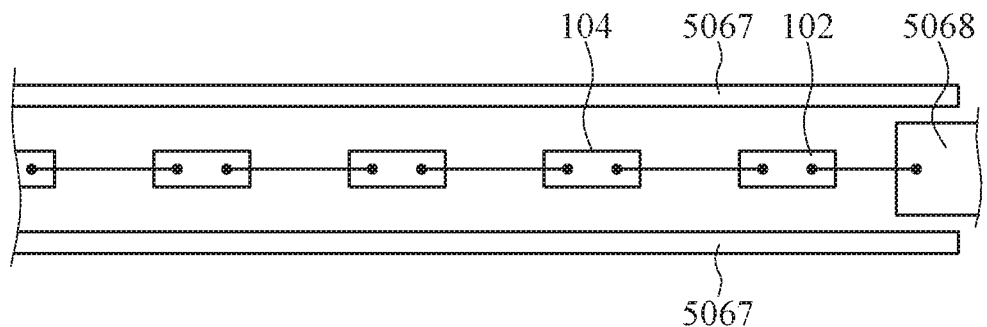
Figure 17M:
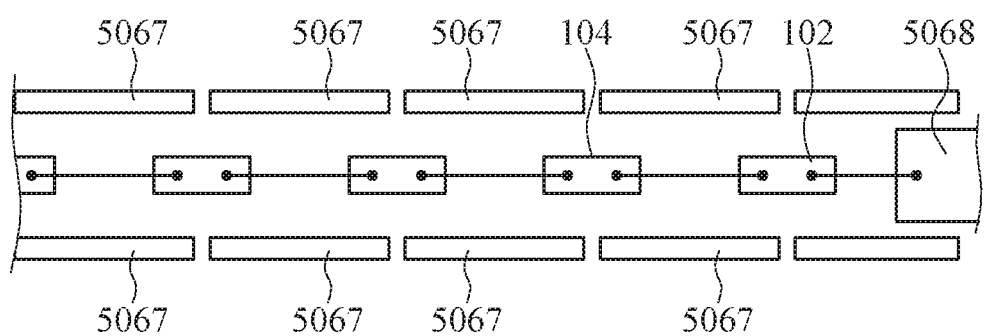
Figure 17N:
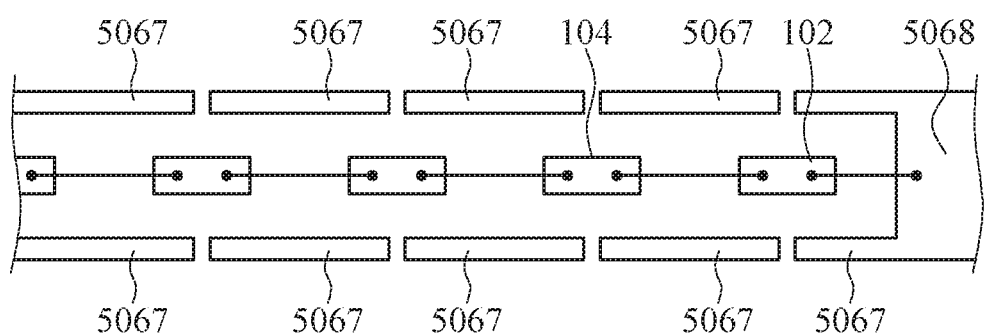
Figure 17O:
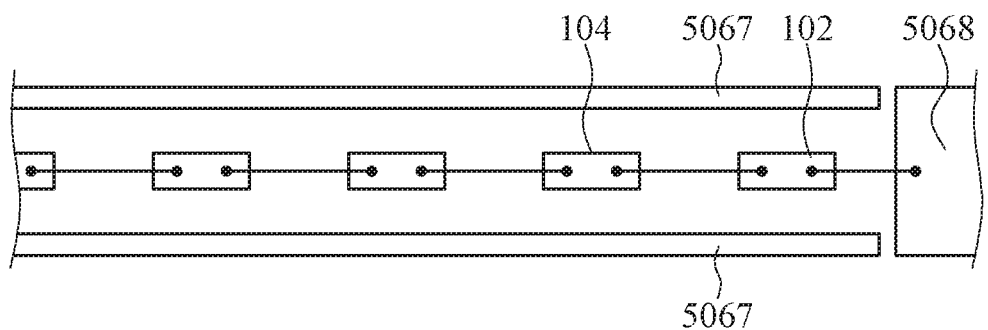
Figure 17P:
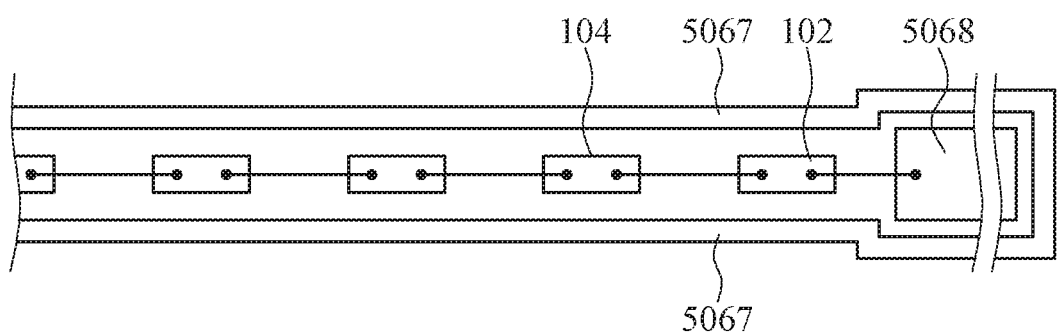
Figure 17Q:
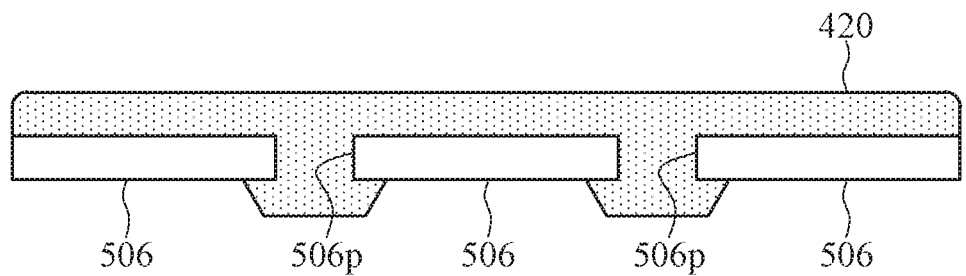

Please refer to FIG. 17A to FIG. 17Q. FIG. 17A to FIG. 17Q respectively illustrate bottom views and cross sectional views of conductive electrodes of an LED filament according to different embodiments of the present disclosure. The design of shape of a conductive electrode (e.g., the electrical connector 506) may consider factors such as wire bonding and filament bending. For example, as show in FIG. 17A, the conductive electrode 506 comprises a connecting region 5068 and a transition region 5067. The connecting region 5068 is at an end of the conductive electrode 506 for being electrically connected with other components. For example, the connecting regions 5068 of the conductive electrodes 506 can be connected to the conductive supports 51a, 51b shown in FIG. 14A to FIG. 14C. In the embodiment, the conductive electrode 506 comprises two connecting regions 5068. The transition region 5067 is between the two connecting regions 5068 for connecting the connecting regions 5068. A width of the connecting region 5068 is greater than that of the transition region 5067. Because the connecting region 5068 is utilized to form a joint point (or a welding point), it is required that the connecting region 5068 has sufficient width. For example, if a width of a filament is W, the width of the connecting region 5068 of the conductive electrode 506 may be between ¼W to 1 W. The number of the connecting region 5068 may be plural, and the width of the connecting regions 5068 may be not identical. Because the transition region 5067 between the connecting regions 5068 is not required to form any joint point, a width of the transition region 5067 may be less than that of the connecting region 5068. For example, if a width of a filament is W, the width of the transition region 5067 may be between ⅒W to ⅓W. The conductive electrode 506 is easier to be bended along with the bending of the filament due to the less width of the transition region 5067 of the conductive electrode 506; therefore, the risk that a wire close to the conductive electrode may be easily broken by stress of bending is lower.

As shown in FIG. 17B, in an embodiment, an LED filament comprises LED chips 102, 104, conductive electrodes 506, two auxiliary pieces (analogous to the transition regions) 5067, wires, and light conversion coating (not shown). The LED filament in the embodiment can be referred to the LED filament 400a in the above embodiments. The wires in the embodiment can be referred to the conductive wires 504 in the above embodiments. For example, the LED chip 102 located at an end of an array of plural LED chips 102, 104 comprised in a filament is connected to the conductive electrode 506 via the wire (e.g., the conductive wire 504 shown in FIGS. 15A and 15B). The light conversion coating in the embodiment can be referred to the light conversion coating 420 in the above embodiment. There is no need to go into details regarding the wires, the light conversion coating, and other components and connections of the LED filament having been discussed in above embodiments. In the embodiment, the discussion would be focused on the wire between the LED chip 102 at the end and the conductive electrodes 506 and the auxiliary pieces 5067.

As shown in FIG. 17B, in the embodiment, each of the conductive electrodes 506 comprises a connecting region 5068. The wire at the end is connected between the LED chip 102 at the end and the connecting region 5068. Each of the auxiliary pieces 5067 extends from a side of the corresponding connecting region 5068 to a side of the LED chip 102 at the end of the LED filament and adjacent to the corresponding connecting region 5068 along an axial direction of the LED filament. Each of the auxiliary pieces 5067 at least overlaps the wire between the corresponding LED chip 102 at the end and the corresponding connecting regions 5068 on a radial direction of the LED filament. In the embodiment, each of the auxiliary pieces 5067 not only overlaps the wire between the corresponding LED chip 102 at the end and the corresponding connecting regions 5068 on the radial direction of the LED filament but also further overlaps a portion of the corresponding LED chip 102 at the end and the corresponding connecting region 5068 on the radial direction of the LED filament. In the embodiment, the auxiliary piece 5067 is not connected to the connecting region 5068. In another embodiment, each of the auxiliary pieces 5067 at least overlaps the wire between the corresponding LED chip 102 at the end and the corresponding connecting regions 5068, a portion of the corresponding LED chip 102 at the end, and a portion of the corresponding connecting region 5068 on the radial direction of the LED filament.

In another embodiment, there could be only one auxiliary piece 5067 overlapping one and only one of the two wires respectively between the two corresponding LED chips 102 at the ends and the corresponding connecting regions 5068 on the radial direction of the LED filament. In another embodiment, there could be only one auxiliary piece 5067 overlapping all wires including the two wires respectively between the two corresponding LED chips 102 at the ends and the corresponding connecting regions 5068 on the radial direction of the LED filament. In another embodiment, there could be two auxiliary piece 5067 respectively overlapping the two wires respectively between the two corresponding LED chips 102 at the ends and the corresponding connecting regions 5068 on the radial direction of the LED filament. In another embodiment, there could be two auxiliary piece 5067 respectively overlapping all wires including the two wires respectively between the two corresponding LED chips 102 at the ends and the corresponding connecting regions 5068 on the radial direction of the LED filament.

The fact that the auxiliary pieces 5067 overlap the wires between the LED chips 102 at the end and the connecting regions 5068 of the conductive electrodes 506 on the radial direction of the LED filament reinforce the connection of the LED chips 102 and the conductive electrodes 506. As a result, the toughness of two ends of the LED filament at which the conductive electrodes 506 locate can be significantly increased. In such cases, the LED filament can be bent to form varied curvatures without the risks of the wires between the conductive electrodes 506 and the LED chips 102 being broken. While the LED filament with elegance curvatures emits light, the LED light bulb would present an amazing effect.

The following discusses the objective of the auxiliary pieces 5067 in detail. The conductive electrode 506 is considerably larger than the LED chips 102, 104. For example, the length of the conductive electrode 506 on an axial direction of the LED filament may be 10-20 times the length of the LED chip 102. It is noted that the drawing of the present disclosure is merely schematic, and thus the considerable difference in terms of size between the conductive electrode 506 and the LED chips 102, 104 is not fully presented. According to the difference in terms of size, the rigidity of the conductive electrode 506 is considerably greater than that of the LED chips 102, 104. While the LED filament is bent, the section where the LED chips 102, 104 would be bent in a smooth way, but the section where the LED chip 102 at the end and the conductive electrode 506 would be bent in a stiff way due to the huge difference of rigidity between the LED chip 102 at the end and the conductive electrode 506. More particularly, the section where the LED chip 102 at the end and the conductive electrode 506 would be bent to form an angle, which cause the wire between the LED chip 102 at the end and the conductive electrode 506 to be bent into a sharp angle. Because the conductive electrode 506 is relatively harder to be bent, and the LED chip 102 at the end is relative easier to be bent, the section between the LED chip 102 at the end and the conductive electrode 506 would be over bent, and force (e.g., shear force) would concentrate on the section. As a result, the wire between the LED chip 102 at the end and the conductive electrode 506 is considerably easier to be broken.

In order to overcome the concentrated force on the section at which the wire between the LED chip 102 at the end and the conductive electrode 506 is located, the auxiliary piece 5067 would at least overlap the wire between the LED chip 102 at the end and the conductive electrode 506 on a radial direction of the LED filament. The radial direction is perpendicular to an axial direction of the LED filament. The radial direction may be any direction extending from a center of a cross section crossing the axial direction of the LED filament; alternatively, the radial direction may be in a direction parallel with the cross section of the LED filament. The axial direction may be aligned with a longitudinal direction of the LED filament; alternatively, the axial direction may be in a direction of the longest side of the LED filament. The LED filament extends from one of the conductive electrodes 506 towards another one of the conductive electrodes 506 along the axial direction. The LED chips 102, 104 are aligned along the axial direction between the conductive electrodes 506. The cross section of the LED filament parallel with the radial direction is not limited to a circular shape (the shape may be formed by the contour of the cross section). The cross section may form any shape. For example, the cross section may form an ellipse shape or a rectangular shape. The shape of the cross section may function as lens to adjust light emitting direction of the LED chip. While the LED filament is bent, force concentrating on the section between the LED chip 102 at the end and the conductive electrode 506 may primarily apply on the section along the radial direction and may cause the section (or the wire in the section) shear failure. The fact that the auxiliary piece 5067 at least overlapping the section at which the wire between the LED chip 102 at the end and the conductive electrode 506 is located on the radial direction of the LED filament can strengthen the mechanical strength of the section to prevent the wire from being broken by the concentrated force.

In another embodiment, in order to overcome the concentrated force on the section at which the wire between the LED chip 102 at the end and the conductive electrode 506 is located, the auxiliary piece 5067 would be arranged on a position, such that while a virtual plane crosses the wire between the LED chip 102 at the end and the conductive electrode 506, the virtual plane must further cross the auxiliary piece 5067. For example, the virtual plane may be a cross section on the radial direction of the LED filament. In addition, a virtual plane would cross the auxiliary piece 5067 while the virtual plane crosses the corresponding LED chip 102 at the end, and a virtual plane would cross the auxiliary piece 5067 while the virtual plane crosses the corresponding connecting region 5068.

Based upon the above configurations, the auxiliary piece 5067 functions as a strengthening element, which increases the mechanical strength of the section where the LED chip 102 at the end and the conductive electrode 506 are and prevent the wire between the LED chip 102 at the end and the conductive electrode 506 from being broken. There are embodiments of the conductive electrode 506 and the auxiliary piece 5067 illustrated below.

As shown in FIG. 17C, in an embodiment, an LED chip 102 located at an end of an array of plural LED chips 102, 104 comprised in a filament is connected to the conductive electrode 506 via a wire. The conductive electrode 506 has a shape surrounding the LED chip 102 at the end by three sides of the conductive electrode 506 while observed in a top view. In another embodiment, the conductive electrode 506 has a shape surrounding the LED chip 102 at the end by three sides of the conductive electrode 506 while observed in a side view (not shown). In another embodiment, the conductive electrode 506 has a shape surrounding the LED chip 102 at the end by at least two sides of the conductive electrode 506. Three sides of the conductive electrode 506 surrounding the LED chip 102 comprise two auxiliary pieces (transition regions) 5067 and one connecting region 5068. In the embodiment shown in FIG. 17C, the auxiliary piece 5067 is connected to the connecting region 5068, and thus the auxiliary piece 5067 pertains to the conductive electrode 506. A sum of widths of the two auxiliary pieces 5067 on the radial direction of the LED filament is less than a width of the connecting region 5068 on the radial direction of the LED filament. As shown in FIG. 17C, a sum of the widths Wt1, Wt2 of the two auxiliary pieces 5067 on the radial direction of the LED filament is less than the width Wc of the connecting region 5068 on the radial direction of the LED filament. In the embodiment, the width Wc of the connecting region 5068 is equal to that of the base layer 420b (or the LED filament), as shown in FIG. 17F. A side of the LED chip 102 at the end not surrounded by the conductive electrode 506 is connected to another LED chip 102 via a wire (e.g., the conductive wire 504 shown in FIGS. 15A and 15B). A wire between the LED chip 102 at the end and the conductive electrode 506 is shorter than those between the LED chips 102, 104 not at the end. In such case, the risk that the wire may be broken by elastic buckling stress is lower.

In an embodiment, one or more of the auxiliary pieces 5067 extend from the connecting region 5068 along an axial direction of the LED filament. The auxiliary piece(s) 5067 overlap the LED chips 102 at the end of the LED filament and the wires between the LED chips 102 at the end and the connecting regions 5068 on the radial direction of the LED filament. The less width of the auxiliary pieces 5067 gives more flexibility than the connecting region 5068 does, and, on the other hand, the fact that the auxiliary pieces 5067 overlap the LED chips 102 at the end and the wires between the LED chips 102 at the end and the connecting regions 5068 of the conductive electrodes 506 on the radial direction of the LED filament reinforce the connection of the LED chips 102 and the conductive electrodes 506. As a result, the toughness of two ends of the LED filament at which the conductive electrodes 506 locate can be significantly increased. A difference between the auxiliary piece 5067 shown in FIG. 17C and the auxiliary piece 5067 shown in FIG. 17B is both of the auxiliary piece 5067 shown in FIG. 17C being connected to the connecting region 5068 while both of the auxiliary piece 5067 shown in FIG. 17B being not connected to the connecting region 5068. Notwithstanding the auxiliary pieces 5067 shown in FIGS. 17B and 17C have different configurations, they all function as strengthening elements to increase the mechanical strength of the section where the LED chip 102 at the end and the conductive electrode 506 are and to prevent the wire between the LED chip 102 at the end and the conductive electrode 506 from being broken.

As shown in FIG. 17D, there are two auxiliary pieces 5067 overlapping the wire between the corresponding LED chip 102 at the end and the corresponding connecting region 5068 of each of the conductive electrodes 506 on the radial direction of the LED filament. One of the two auxiliary pieces 5067 (i.e., the lower one in FIG. 17D) is connected to the corresponding connecting region 5068, which is analogous to the auxiliary pieces 5067 as shown in FIG. 17B. The other one of the two auxiliary pieces 5067 (i.e., the upper one in FIG. 17D) is not connected to the corresponding connecting region 5068 but instead extends from a side of the connecting region 5068, which is analogous to the auxiliary pieces 5067 as shown in FIG. 17C. In the embodiment, the conductive electrode 506 may be form an L shape based upon the connecting region 5068 and the lower auxiliary piece 5067.

In some embodiments, there may be only one auxiliary piece 5067 overlapping the wire between the corresponding LED chip 102 at the end and the corresponding connecting region 5068 of each of the conductive electrodes 506 on the radial direction of the LED filament. The only one auxiliary piece corresponding to each conductive electrode would also increase the mechanical strength of the section where the LED chip 102 at the end and the conductive electrode 506 are and prevent the wire between the LED chip 102 at the end and the conductive electrode 506 from being broken.

The conductive electrodes 506 can be secured in the light conversion coating 420. More particularly, a portion of each of the conductive electrodes 506 is enveloped in the light conversion coating 420. In a case that the light conversion coating 420 is divided into the top layer 420a and the base layer 420b, the conductive electrodes 506 can be enveloped in the top layer 420a, in the base layer 420, or in both of the top layer 420a and the base layer 420b. In some embodiments, the conductive electrodes 506 are not only enveloped but also embedded in the top layer 420a or the base layer 420b of the LED filament, which creates significant attaching strength between the conductive electrodes 506 and the light conversion coating 420. In an embodiment, the structure of the conductive electrode 506 in the LED filament as shown in FIG. 5F comprises one connecting region 5068 and two auxiliary piece 5067 to surround the LED chip 102 as described above. The conductive electrode 506 may have holes 506p.

Please refer to FIGS. 17E and 17F. FIG. 17E illustrates the base layer 420b and the conductive electrode 506 of the LED filament without showing the top layer 420a, the LED chips 102, 104, and the wires 504. FIG. 17F illustrates a bottom view of a portion of the LED filament of FIG. 17E. The LED chip 102 is blocked by the base layer 420b in the bottom view and is thus depicted by dashed lines shown in FIG. 17F to FIG. 17K. A base layer (e.g., a phosphor film) can be made with the conductive electrode 506 embedded inside, which can be referred to the base layer (the phosphor film) 420b as shown in FIG. 17E and FIG. 17F. The conductive electrode 506 comprises holes 506p. The holes 506p are distributed over the connecting region 5068 and the auxiliary pieces 5067. The base layer (the phosphor film) 420b infiltrates the holes 506p from one end and, depending on needs, can pass through the other end of the holes 506p. The base layer (the phosphor film) 420b shown in FIG. 17E does not pass through the holes 506p; alternatively, the base layer (the phosphor film) 420b can pass through the holes 506p and extend to another side of the holes 506p. An upper surface facing upwardly in FIG. 17E of the base layer 420b is processed in a surface roughening treatment; therefore, the base layer 420b has better heat dissipation ability based upon the roughened surface. FIG. 17F is the bottom view of the base layer 420b shown in FIG. 17E. As shown in FIG. 17F, in a certain view (e.g., the bottom view) of the LED filament, either the auxiliary piece 5067 or the connecting region 5068 has a rectangular shape. The two auxiliary pieces 5067 are respectively connected with two opposite sides of the connecting region 5068. The LED chip 102 at the end of the LED filament (or at the end of the array of the LED chips 102, 104) is between the two auxiliary pieces 5067. The two auxiliary pieces 5067 and the connecting region 5068 mutually form a U shape in the bottom view.

Please refer to FIGS. 17G and 17H. FIG. 17G and FIG. 17H show embodiments of the conductive electrode 506 with holes. The difference between the embodiments of FIG. 17G and FIG. 17F is that the conductive electrode 506 of the embodiment of FIG. 17G has only one auxiliary piece 5067. As shown in FIG. 17G, in a certain view (e.g., the bottom view) of the LED filament, either the auxiliary piece 5067 or the connecting region 5068 has a rectangular shape. The only one auxiliary piece 5067 is connected with one of the two opposite sides of the connecting region 5068. The LED chip 102 at the end of the LED filament (or at the end of the array of the LED chips 102, 104) is next to the auxiliary piece 5067. In the embodiment, the LED chip 102 partially overlaps the auxiliary piece 5067 in the bottom view. In another embodiment, the LED chip 102 does not overlap the auxiliary piece 5067 in the bottom view. The auxiliary piece 5067 and the connecting region 5068 mutually form an L shape in the bottom view. In another embodiment, the only one auxiliary piece 5067 may be connected with the center of the connecting region 5068, and the auxiliary piece 5067 and the connecting region 5068 may mutually form a T shape in the bottom view.

The difference between the embodiments of FIG. 17G and FIG. 17H is that the auxiliary piece 5067 of the conductive electrode 506 of the embodiment in FIG. 17H extends from the entire connecting region 5068 (not one of or two of the opposite sides of the connecting region 5068), and the width of the auxiliary piece 5067 decreases gradually from a fixed end of the auxiliary piece 5067 connected with the connecting region 5068 to a free end of the auxiliary piece 5067 opposite with the fixed end. The fixed end of the auxiliary piece 5067 is aligned with the connecting region 5068 and the base layer 420b. In other words, the width of the fixed end of the auxiliary piece 5067 is equal to that of the connecting region 5068 and the base layer 420b. The auxiliary piece 5067 has a trapezoidal shape. In another embodiment, the auxiliary piece 5067 with a gradually-decreasing width decreasing gradually from the fixed end to the free end may have a triangular shape or a semi-circular shape. As shown in FIG. 17H, in the embodiment, the LED chip 102 at the end partially overlaps the auxiliary piece 5067 in the bottom view.

Generally, an average width of the auxiliary piece 5067 is less than that of the connecting region 5068 if there is only one auxiliary piece 5067 of each conductive electrode 506. A sum of widths of the auxiliary pieces 5067 is less than the width of the connecting region 5068 if there are two or more auxiliary pieces 5067 of each conductive electrode 506. The conductive wires are not shown in FIG. 17F-17H, and the LED chips 102 are illustrated as dashed line.

As shown in FIG. 17I, the difference between the embodiments of FIG. 17I and FIG. 17F is that each of the two auxiliary pieces 5067 of the conductive electrode 506 of the embodiment in FIG. 17I has a triangular shape in the bottom view. More particular, each of the two auxiliary pieces 5067 forms a right triangle. Each of the two auxiliary pieces 5067 comprises an inclined side. The two inclined sides of the auxiliary pieces 5067 face towards each other. The inclined sides of the auxiliary pieces 5067 are close to each other at the fixed end. In the embodiment, the inclined sides of the auxiliary pieces 5067 are, but are not limited to, connected with each other. The inclined sides are gradually away from each other from the fixed end to the free end and respectively contact two opposite sides of the base layer 420b at the free end. A vertical distance between the two inclined sides of the auxiliary pieces 5067 is gradually increased from the fixed end to the free end. The auxiliary pieces 5067 are aligned with the connecting region 5068 and the base layer 420b, and the width of the fixed end is equal to the distance between the two free ends of the auxiliary pieces 5067 and is also equal to the width of the connecting region 5068 and the base layer 420b.

As shown in FIG. 17J, the difference between the embodiments of FIG. 17J and FIG. 17I is that the inclined sides of the auxiliary pieces 5067 in FIG. 17J are not straight but are stepped. In another embodiment, the inclined sides of the auxiliary pieces 5067 may be curved, arched, or waved.

As shown in FIG. 17K, in the embodiment, each of the conductive electrodes 506 comprises the connecting region 5068 and one auxiliary piece 5067. The two auxiliary pieces 5067 of the two conductive electrodes 506 may be respectively aligned with the two opposite sides of the base layer 420b and respectively at two opposite sides of the array of the LED chips 102, 104 along the axial direction of the LED filament. In other words, the two auxiliary pieces 5067 are in a staggered arrangement. Each of the auxiliary pieces 5067 extends from the corresponding connecting region 5068 along the axial direction of the LED filament. Each of the auxiliary pieces 5067 not only overlaps the LED chip 102 at the end of the LED filament close to the corresponding connecting region 5068 and the wire between the LED chip 102 at the end and the corresponding connecting regions 5068 on the radial direction but also further overlaps two or more LED chips 102, 104 and two or more wires between the LED chips 102, 104 next to the LED chip 102 at the end. In the embodiment, the auxiliary piece 5067 of the conductive electrode 506 overlaps all of the LED chips on the radial direction but is not connected with the other conductive electrode 506.

As shown in FIG. 17L, the difference between the embodiments of FIG. 17L and FIG. 17C is that each of the two auxiliary pieces 5067 of the embodiment in FIG. 17L is not connected with the connecting region 5068. The auxiliary piece 5067 overlaps all of the LED chips 102, 104, the wires between the LED chips 102 at the end and the connecting region 5068, and the connecting regions 5068. As shown in FIG. 17K and FIG. 17L, there are two auxiliary pieces 5067 in one LED filament, and each of the two auxiliary pieces 5067 overlaps all wires including the two wires respectively between the two corresponding LED chips 102 at the ends and the corresponding connecting regions 5068 on the radial direction of the LED filament.

As shown in FIG. 17M, the difference between the embodiments of FIG. 17L and FIG. 17M is that each of the two auxiliary pieces 5067 of the embodiment in FIG. 17M is divided into a plurality of segments. The segments of each of the two auxiliary pieces 5067 respectively overlap the wires on the radial direction. Each of the segments of each of the two auxiliary pieces 5067 overlaps the corresponding wire and the adjacent two LED chips 102, 104 or overlaps the corresponding wire at the end, the corresponding connecting region 5068, and the corresponding LED chip at the end on the radial direction. There is a gap formed between every two adjacent segments of each of the two auxiliary pieces 5067. Each of the gaps is aligned with the corresponding LED chip 102 or 104 on the radial direction. These sections at which the wires are located are weaker points comparing to where the LED chips 102, 104 are located at; therefore, the segments of each of the two auxiliary pieces 5067 can function as strengthening elements to increase the mechanical strength of these sections.

As shown in FIG. 17N, the difference between the embodiments of FIG. 17M and FIG. 17N is that the segment of each of the two auxiliary pieces 5067 at the end is connected to the corresponding connecting region 5068.

As shown in FIG. 17O, the difference between the embodiments of FIG. 17O and FIG. 17L is that each of the two auxiliary pieces 5067 of the embodiment in FIG. 17O does not overlap the connecting region 5068 on the radial direction of the LED filament and is instead aligned with the connecting region 5068 along the axial direction of the LED filament. The LED filament according to the embodiment of FIG. 17O may be finer.

As shown in FIG. 17P, the difference between the embodiments of FIG. 17P and FIG. 17C is that the auxiliary piece 5067 of the embodiment in FIG. 17P is not connected with the connecting region 5068 and is instead around the connecting region 5068 by three sides of the connecting region 5068. In the embodiment, the number of the auxiliary piece 5067 in FIG. 17P is one and is around the entire array aligned by the LED chips 102, 104 and the connecting regions 5068 (i.e., the conductive electrodes 506)

The auxiliary pieces 5067 of the embodiments in FIGS. 17B, 17L, 17M, 17O, and 17P are not connected with the corresponding connecting region 5068; therefore, the auxiliary pieces 5067 of the embodiments in FIGS. 17B, 17L, 17M, 17O, and 17P may not pertain to the conductive electrodes 506 and, instead, may be deemed as individual elements, which may be non-conductive. The auxiliary pieces 5067 of the embodiments in FIG. 17N is an exception where one segment of each of the auxiliary pieces 5067 at the end is connected to the corresponding connecting region 5068 while the other segments of each of the auxiliary pieces 5067 are not connected to the corresponding connecting region 5068. In other words, only a portion of the auxiliary piece 5067 pertains to the corresponding conductive electrode 506.

In the embodiment shown in FIG. 17C, the first/last one of the LED chips 102 at the two ends of the array of the LED chips 102, 104 is entirely disposed within the area between the two auxiliary pieces 5067, in the other words, the first/last one of the LED chips 102 is entirely disposed within the boundary of the conductive electrode 506, i.e., the segment where the conductive electrode 506 disposed in. In other embodiments, the first/last one of the LED chips 102 may be only partially within the boundary of conductive electrode.

In the FIGS. 17F and 17G, the auxiliary pieces 5067 have a rectangle shape which has a constant width. In other embodiments, the auxiliary pieces 5067 may be similar to FIG. 17H, and have a width gradually decrease from the end close to the connecting region 5068.

The conductive electrode 506 and the LED chips 102, 104 are not limited to be in the same layer. In the embodiment of FIGS. 17E-17J, the conductive electrodes 506 are disposed in the base layer 420*b*, and the LED chips 102, 104 may be disposed in the top layer 420*a* (not shown in FIGS. 17E-17J), in this situation, the base layer 420*b* may be reversed and make the conductive electrodes 506 face upward during a manufacturing process of the LED filament, so as to electrically connect to the LED chips easily.

FIG. 17E and FIG. 17F shows an embodiment of a base layer (e.g., a phosphor film) with the conductive electrode embedded inside. As described previously, embodiments of FIGS. 17G-17J may be also a base layer with the conductive electrode embedded inside. As modified embodiments thereof, the conductive electrodes 506 shown in FIGS. 17F-17J may be disposed in top layer where LED chips disposed in (as shown in FIG. 16A). In this situation, the conductive electrodes 506 may be disposed at different height even they are in the same layer.

As shown in FIG. 17Q, The phosphor powder glue forming the light conversion coating 420 may extends into the holes 506*p* of the conductive electrode 506 as described above. The phosphor powder glue further extends from one side of the conductive electrode 506 to another side of the conductive electrode 506 through the holes 506*p*, as shown in FIG. 17Q. The phosphor powder glue contacts at least two sides (the upper side and the lower side) of the conductive electrode 506. That is to say, the conductive electrode 506 is clamped by the phosphor powder glue (the light conversion coating 420). In other words, the conductive electrode 506 is riveted by the phosphor powder glue (the light conversion coating 420), which increases the mechanical strength between the conductive electrode 506 and the light conversion coating 420.

Figure 18A:
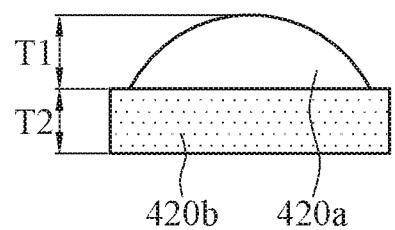
FIG. 18A to FIG. 18D respectively illustrate a cross sectional views of LED filaments according to different embodiments of the present disclosure.
Figure 18B:
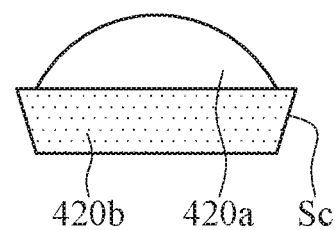
Figure 18C:
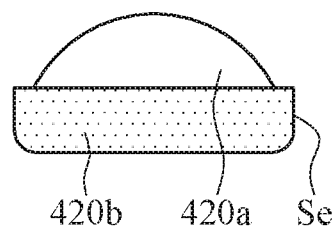
Figure 18D:
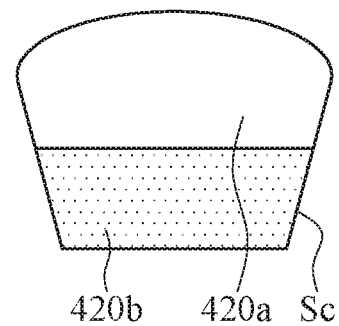

FIGS. 18A, 18B, 18C, and 18D are cross-sectional views of an LED filament according to different embodiments of the present invention. Surfaces of the filaments shown in FIGS. 18A-18D are with different angles. Top layers 420*a* shown in FIGS. 18A-18D may be made by a glue dispenser. Two sides of the top layer 420*a* naturally collapse to form arc surfaces after dispensing process by adjusting the viscosity of the phosphors glue. A cross section of a base layer 420*b* in FIG. 18A is rectangular because the phosphor film of the base layer 420*b* is cut vertically. A cross section of a base layer 420*b* in FIG. 18B is trapezoidal and has slant edges Sc because the phosphor film of the base layer 420*b* is cut bias or is cut by a cutter with an angular configuration. The top layer 420*a* may cut together with the base layer 420*b*, in this situation, the cross section of the top layer 420*a* has slant edges too. A cross section of a base layer 420*b* in FIG. 18C is similar to that of the base layer 420*b* in FIG. 18A. The difference between the base layers 420*b* of FIG. 18A and FIG. 18C is that lower corners of the base layer 420*b* in FIG. 18C are further processed to form arc corners Se. Based upon different finishing manners of FIGS. 18A-18D, the filament may have different illuminating angles and different effects of illumination. The base layer 420*b* in FIG. 18D is analogous to that in FIG. 18B. The difference between the LED filament of FIG. 18B and FIG. 18D is that the slant edges Sc in FIG. 18D extends from the base layer 420*b* to the top layer 420*a*. In other words, both of the top layer 420*a* and the base layer 420*b* in FIG. 18D have the slant edges Sc on two opposite sides of the LED filament. The slant edges Sc of the top layer 420*a* are aligned with the slant edges Sc of the base layer 420*b*. In such case, the cross section of the top layer 420*a* in FIG. 18D has an outline with an arched edge and the two opposite slant edges Sc.

The thickness of the base layer 420*b* may be less than that of the top layer 420*a*. As shown in FIG. 18A, the thickness T2 of the base layer 420*b* is less than the thickness T1 of the top layer 420*a*. In some case, the conductive electrodes 506 are mainly disposed at the base layer 420*b*. Heat generated by the conductive electrodes 506 may be easier dissipated from the base layer 420*b* under the circumstances that the base layer 420*b* is thinner than the top layer 420*a*. In some case, the LED chips 102, 104 face towards the top layer 420*a*, and therefore most of light rays emitted from the LED chips 102, 104 may pass through the top layer 420*a*, which results in lower brightness of the base layer 420*b* comparing to the brightness of the top layer 420*a*. The thicker top layer 420*a* with a greater amount of light reflecting/diffusing particles (e.g., phosphors) can reflect or diffuse a part of light rays towards the base layer 420*b*, and light rays can easily pass through the thinner base layer 420*b*; therefore, the brightness of top layer 420*a* and the base layer 420*b* can be uniform.

Figure 19A:
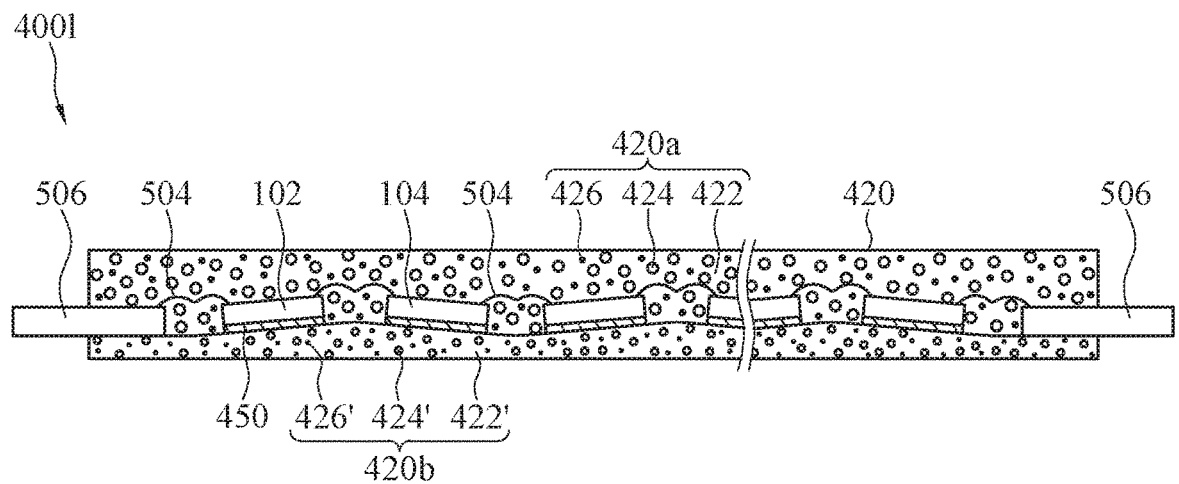
FIG. 19A and FIG. 19B respectively illustrate a cross sectional view and a perspective view of an LED filament according to an embodiment of the present disclosure.
Figure 19B:
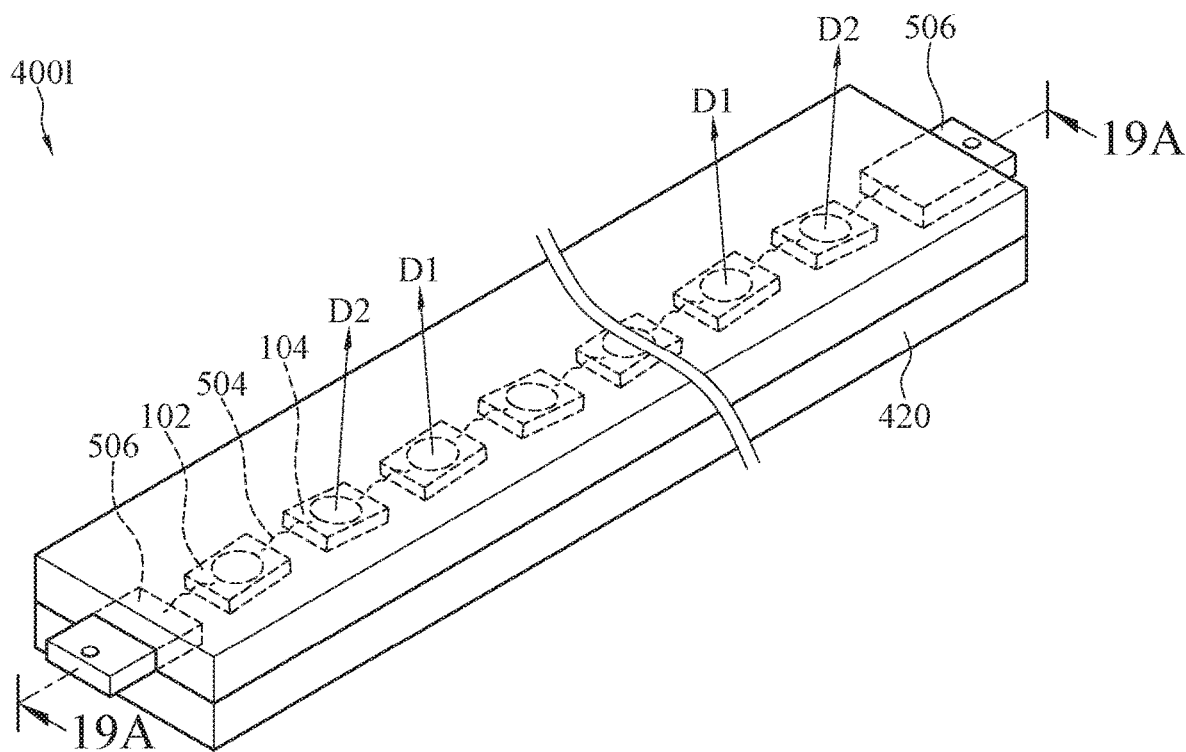

As shown in FIG. 16A, the LED chips 102, 104 are arranged on a flat surface of an embedded region between the base layer 420*b* and the top layer 420*a*; therefore, all of the LED chips 102, 104 on the flat surface face towards the same direction. Alternatively, as shown in FIG. 19A and FIG. 19B, the LED chips 102, 104 are arranged on a wave-shaped interface rather than a flat surface. The embedded region between the top layer 420*a* and the base layer 420*b* is not limited to the wave-shaped interface. In some embodiments, the embedded region may be of saw tooth shape. In an embodiment, the upper surface of the base layer 420*b* (the contact face contacting the top layer 420*a*) may have greater surface roughness to achieve similar effect.

Please refer to FIG. 19A and FIG. 19B. FIG. 19A illustrates a cross-sectional view of an LED filament 400*l* according to an embodiment of the present disclosure. FIG. 19B illustrate a perspective view of the LED filament 400*l*. The LED filament 400*l* can be referred to the LED filament

400a. A difference between the LED filament 400l and the LED filament 400a is regarding the alignment of the LED chips 102, 104. The LED chips 102, 104 of the LED filament 400a are aligned along the axial direction of the LED filament 400a and parallel with a horizontal plane on which the base layer 420b of the LED filament 400a is laid (referring to FIG. 16). In contrast, the LED chips 102, 104 of the LED filament 400l are not aligned along the axial direction of the LED filament 400l and not parallel with a horizontal plane on which the base layer 420b of the LED filament 400l is laid (referring to FIG. 19A). The LED chips 102, 104 of the LED filament 400l may respectively have different angles related to the horizontal plane. Correspondingly, the illuminating directions of the LED chips 102, 104 may be different from one another. Under the circumstances, a side of the base layer 420b of the LED filament 400l carrying the LED chips 102, 104 (or the die bond glues 450) may be not a flat plane but may be a successively concave-convex plane so that each of the LED chips 102, 104 disposed on different positions of the successively concave-convex plane have different angles, accordingly. In some embodiments, all of the LED chips 102, 104 of the LED filament 400l have angles related to the horizontal plane different from one another. Alternatively, a part of the LED chips 102, 104 of the LED filament 400l have a first angle related to the horizontal plane, and another part of LED chips 102, 104 of the LED filament 400l have a second angle related to the horizontal plane. In some embodiments, the first angle equals to 180 degrees minus the second angle. Additionally, the LED chips 102, 104 of the LED filament 400l may have different heights related to the horizontal plane. As a result, the LED filament 400l with the LED chips 102, 104 having different illuminating directions (different angles related to the horizontal plane) and/or different heights may generate a more even illumination, such as an omni-directional illumination.

As shown in FIG. 19A and FIG. 19B, in the embodiment, the LED chips 102, 104, one by one, tilt towards a first direction and a second direction related to the horizontal plane. The first direction and the second direction are opposite with each other. The first direction is substantially towards one of the two opposite conductive electrodes 506, and the second direction is substantially towards the other one of the two opposite conductive electrodes 506. For example, the first one of the LED chips 102, 104 tilts towards the first direction, the next one of the LED chips 102, 104 tilts towards the second direction, the third one of the LED chips 102, 104 tilts towards the first direction, and so on. While the LED chips 102, 104 individually tilt towards the first direction and the second direction, the LED chips 102, 104 individually face a first illumination direction D1 and a second illumination direction D2 shown in FIG. 19B. The first illumination direction D1 and the second illumination direction D2 point to different directions. Herein, the illumination direction is parallel with a normal line of the primary light emitting face of an LED chip.

Figure 19C:
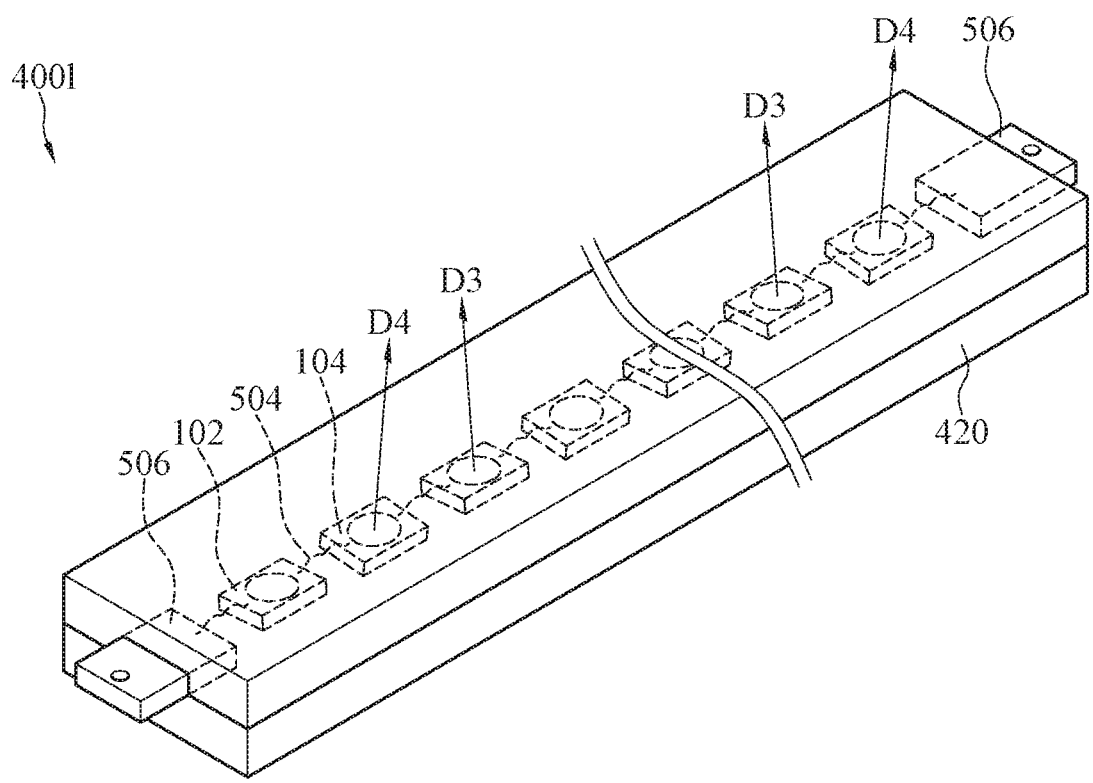
FIG. 19C to FIG. 19I respectively illustrate perspective views of LED filaments according to different embodiments of the present disclosure.

As shown in FIG. 19C, in the embodiment, the LED chips 102, 104, one by one, tilt towards a third direction (e.g., a third illumination direction) and a fourth direction (e.g., a fourth illumination direction) related to the horizontal plane. The third direction and the fourth direction are opposite with each other and are substantially perpendicular to the first direction and the second direction. The third direction is substantially towards one of the two opposite sides of the LED filament 400l on a radial direction thereof; and the fourth direction is substantially towards the other one of the two opposite sides of the LED filament 400l on the radial direction thereof. For example, the first one of the LED chips 102, 104 tilts towards the third direction, the next one of the LED chips 102, 104 tilts towards the fourth direction, the third one of the LED chips 102, 104 tilts towards the third direction, and so on. While the LED chips 102, 104 individually tilt towards the third direction and the fourth direction, the LED chips 102, 104 individually face a third illumination direction D3 and a fourth illumination direction D4 shown in FIG. 19C. The first illumination direction D1, the second illumination direction D2, the third illumination direction D3, and the fourth illumination direction D4 point to different directions.

Figure 19D:
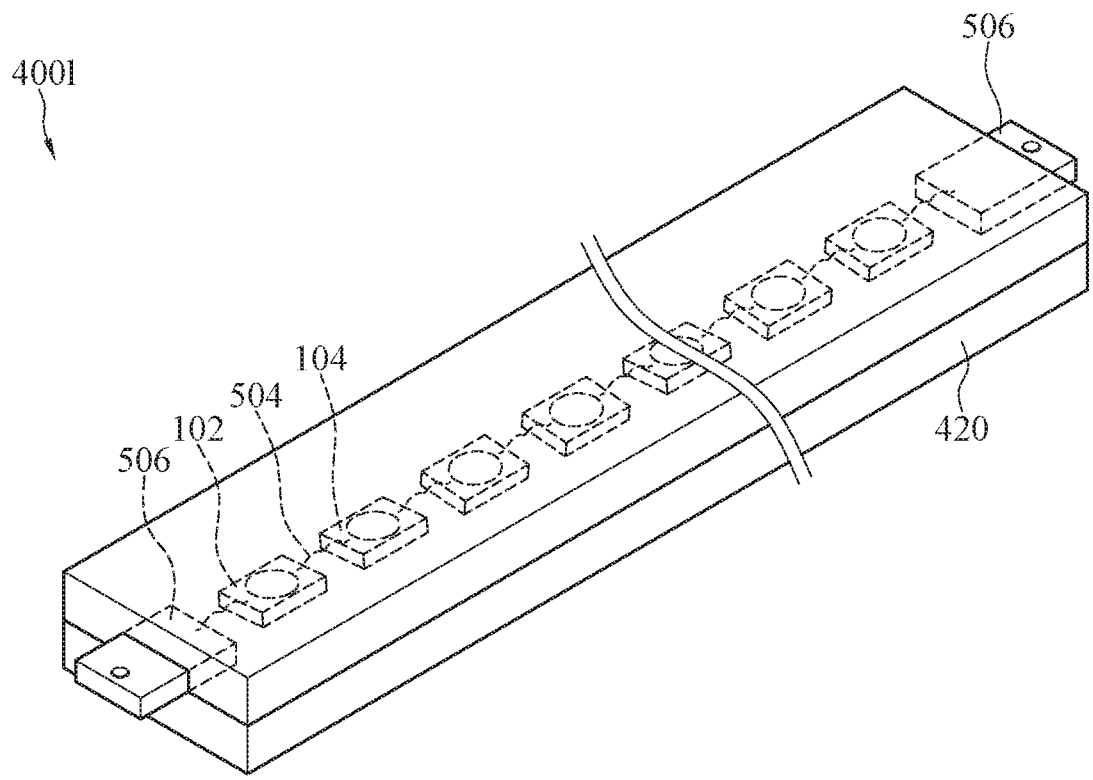

As shown in FIG. 19D, in the embodiment, the LED chips 102, 104, one set by one set (e.g., every two or more adjacent LED chips are defined as one set), tilt towards the third direction and the fourth direction related to the horizontal plane. In the embodiment, every two adjacent LED chips are defined as one set. For example, the first one set of the two adjacent LED chips 102, 104 tilts towards the third direction, the next one set of the two adjacent LED chips 102, 104 tilts towards the fourth direction, the third one set of the two adjacent LED chips 102, 104 tilts towards the third direction, and so on.

Figure 19E:
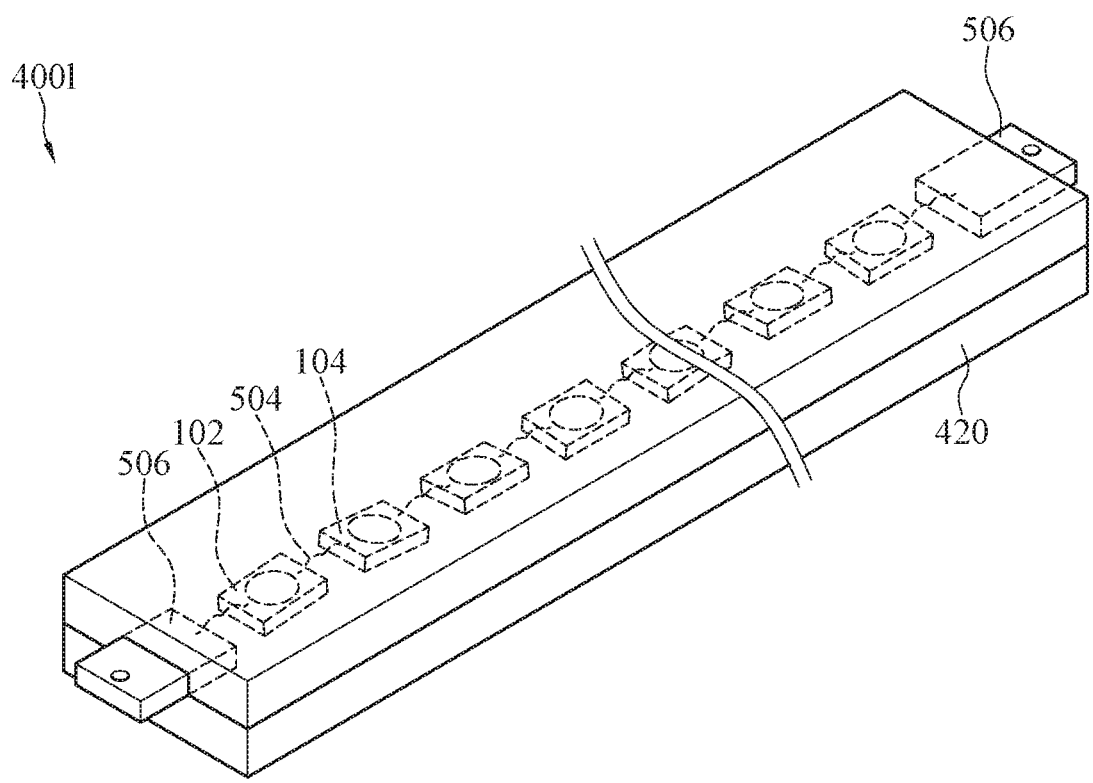

As shown in FIG. 19E, in the embodiment, the LED chips 102, 104 tilt respectively towards the first direction, the second direction, the third direction, and the fourth direction related to the horizontal plane. In the embodiment, the LED chips 102, 104 tilt respectively towards the first direction, the second direction, the third direction, and the fourth direction in an order. For example, the first one of the LED chips 102, 104 tilts towards the first direction, the next one of the LED chips 102, 104 tilts towards the second direction, the third one of the LED chips 102, 104 tilts towards the third direction, the fourth one of the LED chips 102, 104 tilts towards the fourth direction, the fifth one of the LED chips 102, 104 tilts towards the first direction, and so on. In other embodiments, the LED chips 102, 104 may tilt respectively towards the first direction, the second direction, the third direction, and the fourth direction without any order. In yet other embodiments, the LED chips 102, 104 may tilt respectively towards any directions. That is to say, the LED chips 102, 104 may have irregular illumination directions.

Figure 19F:
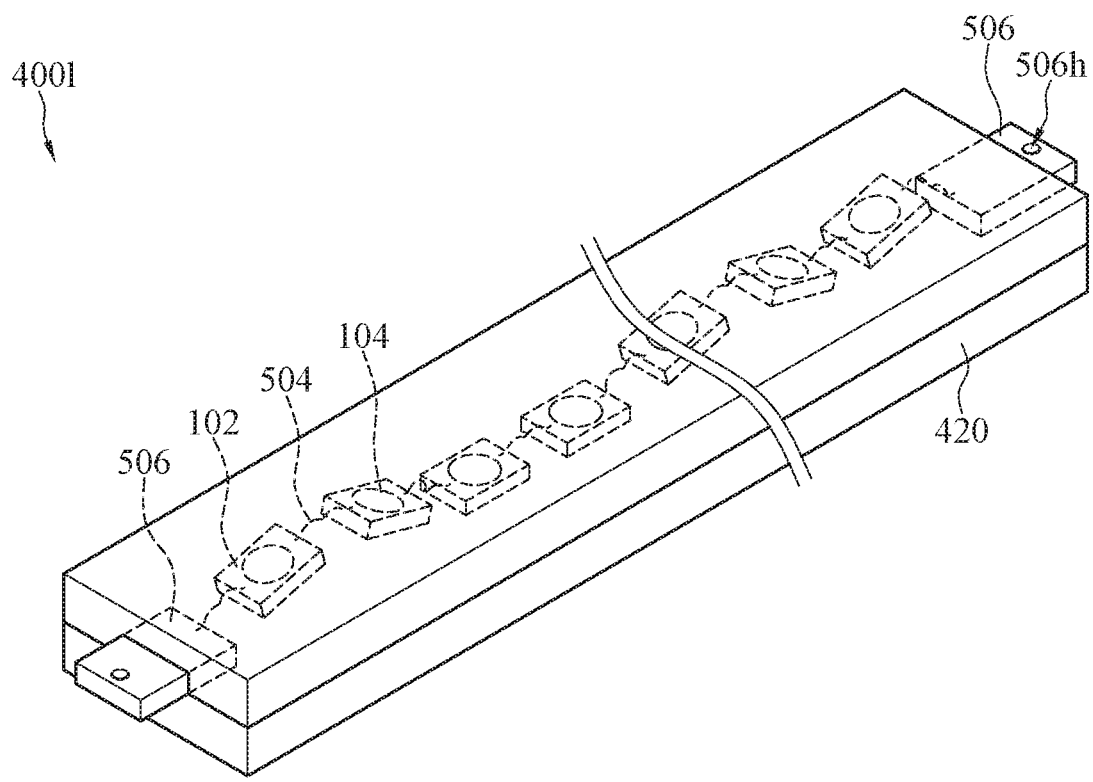

As shown in FIG. 19A to FIG. 19E, each of the LED chips 102, 104 may tilt towards different direction but all of the LED chips 102, 104 may still remain on an axis of the LED filament 400l. As shown in FIG. 19F, some of the LED chips 102, 104 may rotate about the radial direction of the LED filament 400l. The rotated LED chips 102, 104 would face towards a direction different from the radial direction. The rotated LED chips 102, 104 do not remain on the axis of the LED filament 400l.

Figure 19G:
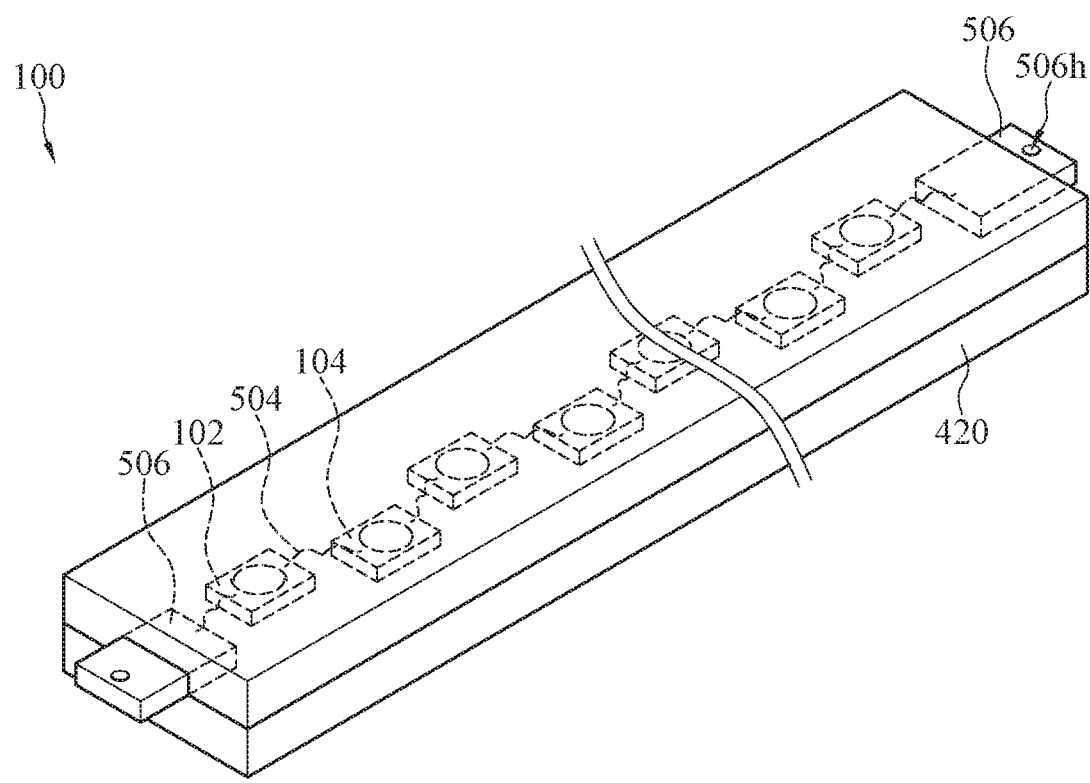

As shown in FIG. 19G, some of the LED chips 102, 104 may shift on the radial direction of the LED filament 400l from the axis of the LED filament 400l. The shifted LED chips 102, 104 do not remain on the axis of the LED filament 400l; however, the illumination direction of the shifted LED chips 102, 104 may be the same as that of the LED chips 102, 104 remaining on the axis of the LED filament 400l.

Figure 19H:
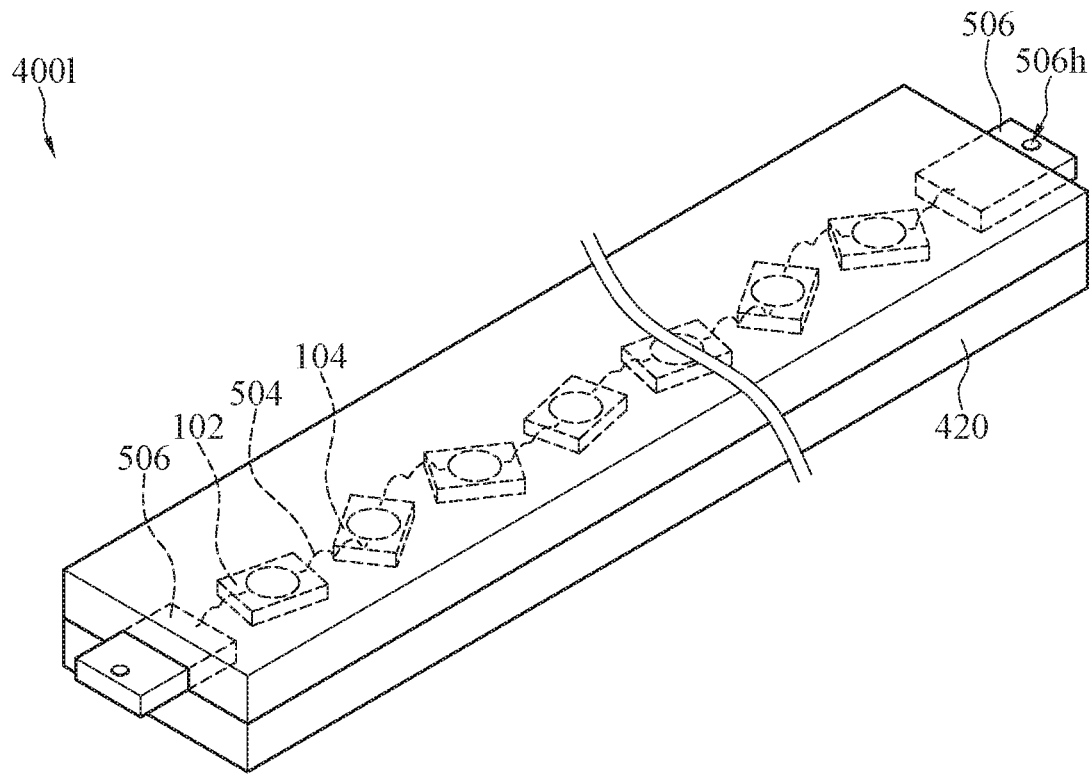

As shown in FIG. 19H, in the embodiment, the LED chips 102, 104 are aligned with the axial direction and at the same level, but some of the LED chips 102, 104 may rotate clockwise or counterclockwise about the normal line of the light emitting face of the LED chips 102, 104. For example, some of the LED chips 102, 104 rotate clockwise about the normal line thereof to 30 degrees, some of the LED chips 102, 104 rotate clockwise about the normal line thereof to 60 degrees, and some of the LED chips 102, 104 rotate counterclockwise about the normal line thereof to 60 degrees.

Figure 19I:
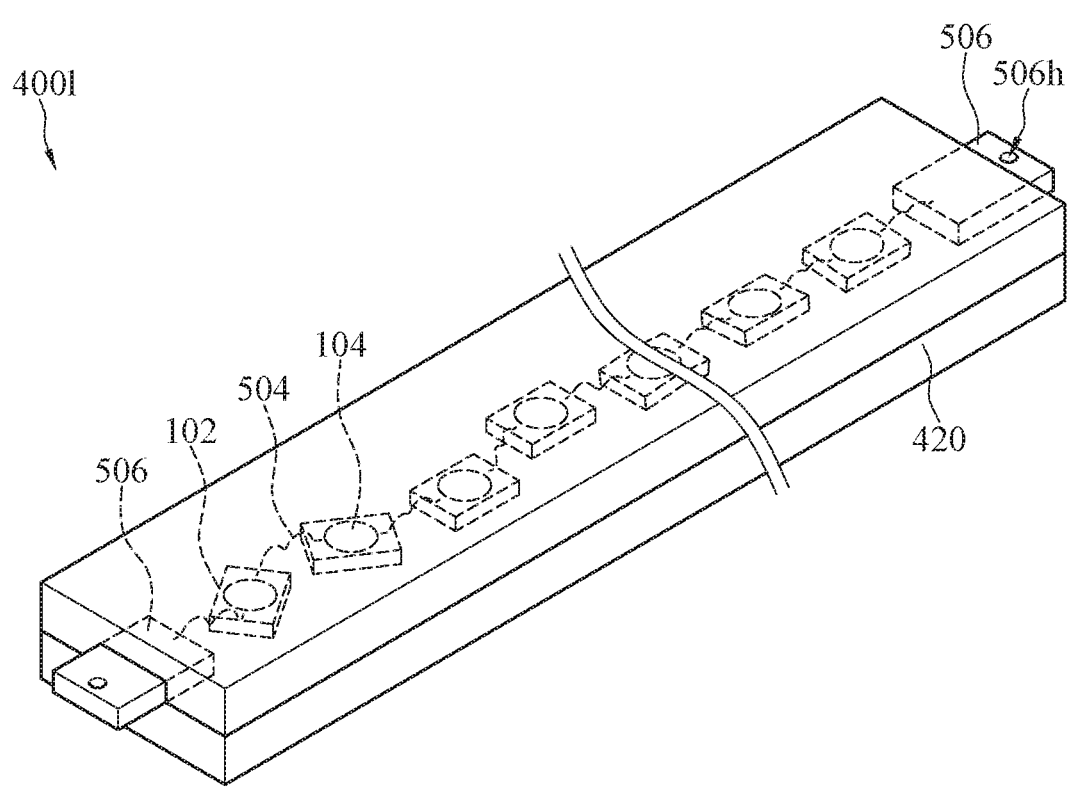

As shown in FIG. 19I, some of the LED chips 102, 104 may tilt towards different directions similar to the tilted LED chips 102, 104 shown in FIG. 19A to FIG. 19E, some of the LED chips 102, 104 may shift on the radial direction of the LED filament 400*l* away from the axis of the LED filament 400*l* similar to the shifted LED chips 102, 104 shown in FIG. 19G, and some of the LED chips 102, 104 may rotate about the normal line similar to the rotated LED chips 102, 104 shown in FIG. 19H. The LED filaments 400*l* according to embodiments of FIG. 19A to FIG. 19I may have a more even illumination effect.

It is noted that the LED chips of the LED filament in all embodiments of the present disclosure may be manufactured in a wire bonding manner or in a flip-chip manner.

Figure 20A:
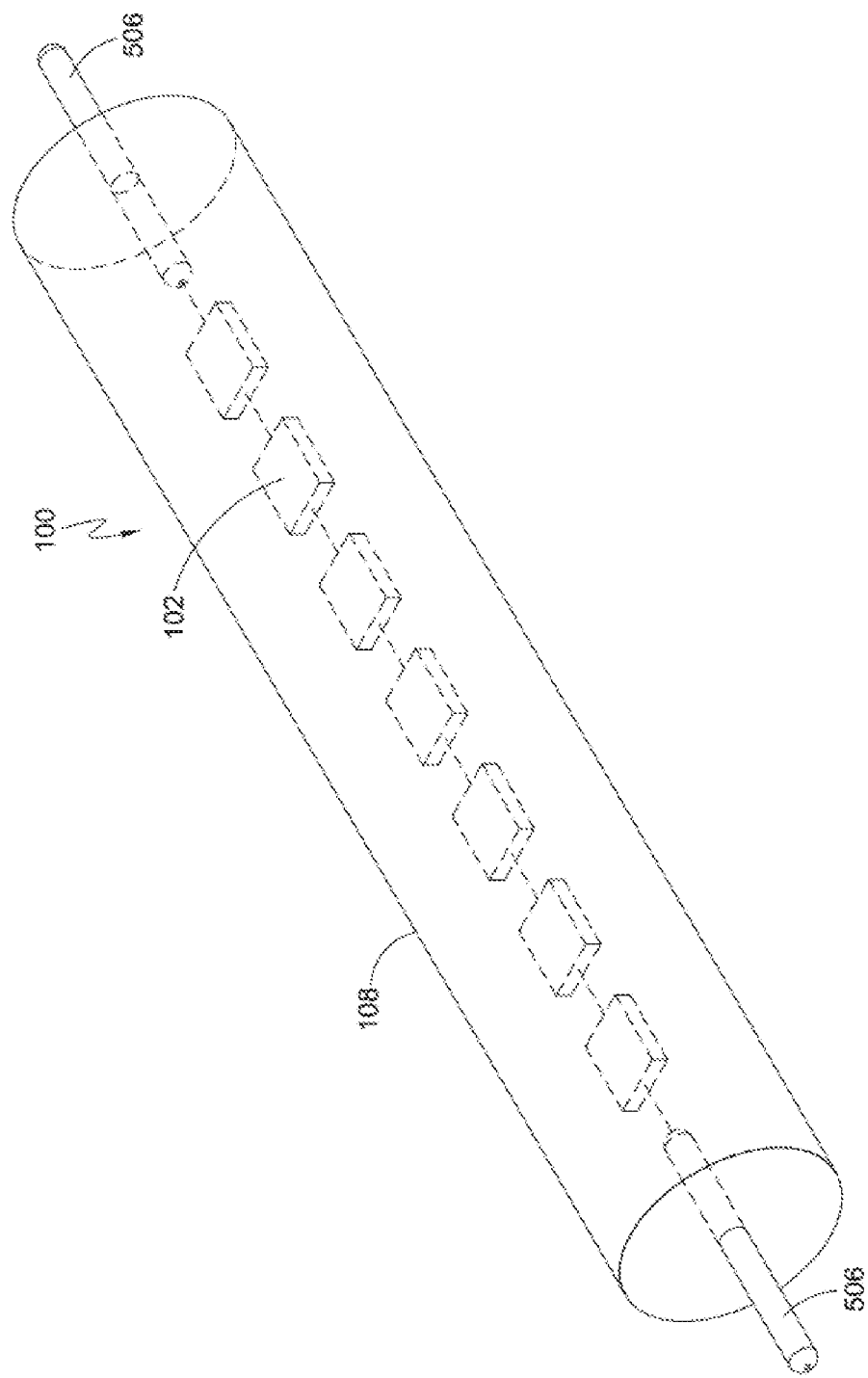
FIG. 20A illustrates a see-through view of an LED filament according to an embodiment of the present disclosure.

Please refer to FIG. 20A. FIG. 20A is a see-through view of the LED filament 100 in accordance with an exemplary embodiment of the present invention. The LED filament 100 includes an enclosure 108, a linear array of LED chips 102 and electrical connectors 506. The linear array of LED chips 102 is disposed in the enclosure 108 to be operable to emit light when energized through the electrical connectors 506. The enclosure 108 is an elongated structure preferably made of primarily flexible materials such as silicone. The enclosure 108 has either a fixed shape or, if made of a flexible material, a variable shape. The enclosure 108 is thus capable of maintaining either a straight posture or curvaceous posture (e.g. like a gift ribbon or helical spiral), with or without external support depending on applications, in an LED light bulb. The enclosure 108 has a cross section in any regular shapes (e.g. circle and polygon) or any irregular shapes (e.g. petal and star). The LED filament 100 of FIG. 20A can be referred to the LED filament 100, 400*a*, 400*l* described above shown in FIG. 15A to FIG. 19E. The enclosure 108 can be referred to the light conversion coating 420.

In an embodiment, the enclosure 108 is a monolithic structure. In some embodiments, the monolithic structure shares a uniform set of chemical and physical properties throughout the entire structure. Being structurally indivisible, the monolithic structure need not be a uniform structure. In other embodiments, the monolithic structure includes a first portion and a second portion having a different property from the first portion. In another embodiment, the enclosure 108 includes a set of otherwise divisible layers or modules interconnected to form a unitary structure of the enclosure.

Figure 20B:
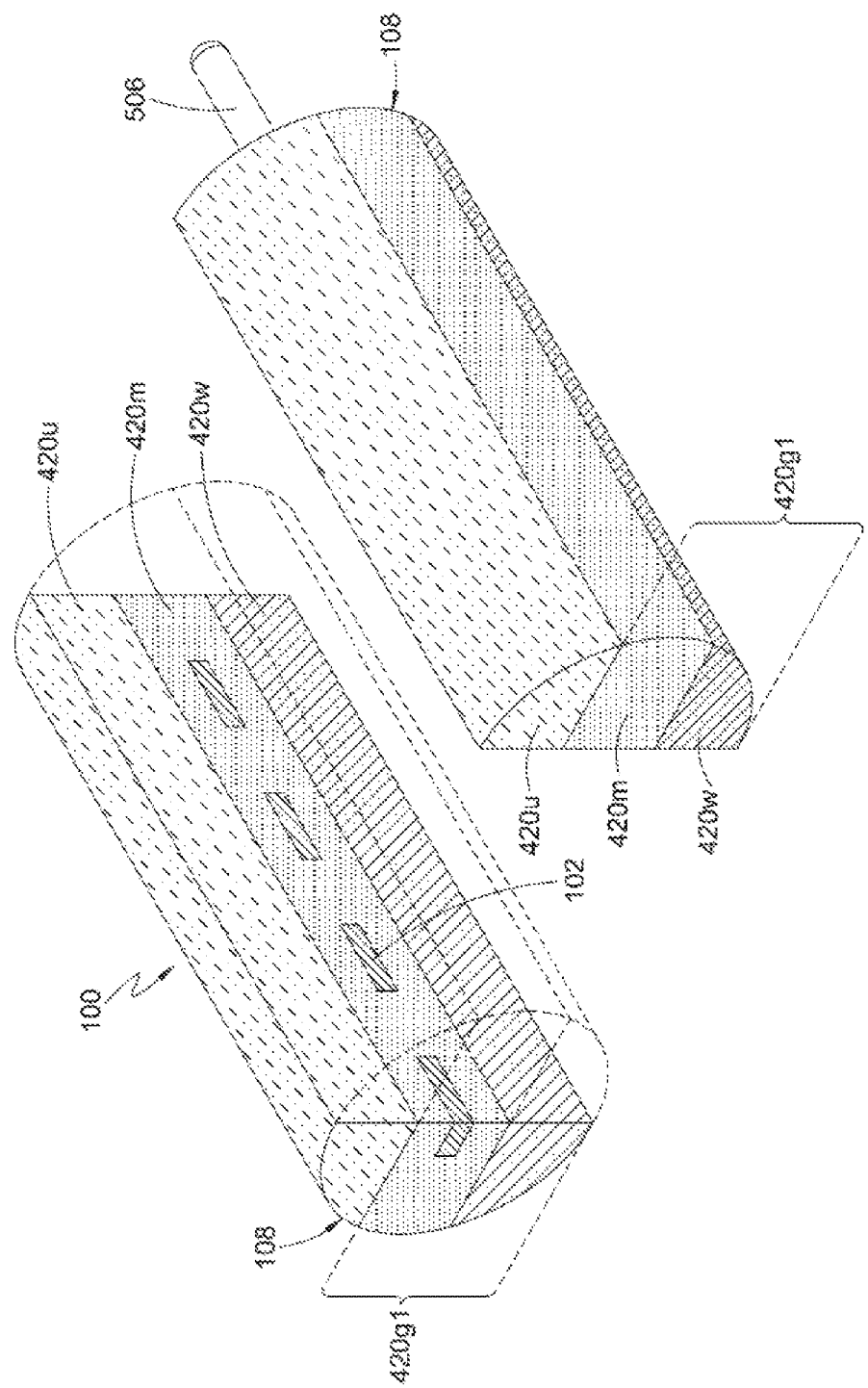
FIG. 20B and FIG. 20C respectively illustrate truncated LED filaments cut into halves according to different embodiments of the present disclosure.

In the embodiments where the enclosure is a monolithic structure exhibiting diverse chemical or physical properties in an otherwise indivisible structure, the enclosure 108 includes a plurality of regions having distinctive properties to enable a desired totality of functions for the LED filament. The plurality of regions in the enclosure is defined in a variety of ways depending on applications. In FIG. 20B, the truncated LED filament 100 is further sliced vertically—i.e. along the light illuminating direction of the linear array of LED chips 102—into equal halves along the longitudinal axis of the LED filament 100 to show its internal structure. The regions of the enclosure are defined by a hypothetical plane perpendicular to the light illuminating direction of the linear array of LED chips 102. For example, the enclosure 108 includes three regions, 420*w*, 420*m*, 420*u* defined by a hypothetical pair of planes compartmentalizing the enclosure 108 into an upper region 420*u*, a lower region 420*w* and a middle region 420*m* sandwiched by the upper region 420*u* and the lower region 420*w*. The linear array of LED chips 102 is disposed exclusively in one of the regions of the enclosure 108. Alternatively, the linear array of LED chips 102 is absent from at least one of the regions of the enclosure 108. Alternatively, the linear array of LED chips 102 is disposed in all regions of the enclosure 108. In FIG. 20B, the linear array of LED chips 102 is disposed exclusively in the middle region 420*m* of the enclosure 108 and is spaced apart by the middle region 420*m* from the top region 420*u* and the lower region 420*w*. In an embodiment, the middle region 420*m* includes a wavelength converter for converting blue light emitting from the LED chip 102 into white light. The upper region 420*u* includes a cylindrical lens for aligning the light beaming upwards. The lower region 420*w* includes a cylindrical lens for aligning the light beaming downwards. In another embodiment, the middle region 420*m* is made harder than the upper region 420*u*, the lower region 420*w* or both by, for example, embedding a greater concentration of phosphor particles in the middle region 420*m* than in the upper region 420*u*, the lower region 420*w* or both. The middle region 420*m*, because it is harder, is thus configured to better protect the linear array of LED chips 102 from malfunctioning when the LED filament 100 is bent to maintain a desired posture in a light bulb. The upper region 420*u* (or the lower region 420*w*) is made softer for keeping the entire LED filament 100 as bendable in the light bulb as it requires for generating omnidirectional light with preferably exactly one LED filament 100. In yet another embodiment, the middle region 420*m* has greater thermal conductivity than the upper region 420*u*, the lower region 420*w* or both by, for example, doping a greater concentration of nanoparticles in the middle region 420*m* than in the upper region 420*u*, the lower region 420*w* or both. The middle region 420*m*, having greater thermal conductivity, is thus configured to better protect the linear array of LED chips 102 from degrading or burning by removing excess heat from the LED chip 102. The upper region 420*u* (or the lower region 420*w*), because it is spaced apart from the linear array of LED chips 102, plays a lesser role than the middle region 420*m* in cooling the LED chip 102. The cost for making the LED filament 100 is thus economized when the upper region 420*u* (or the lower region 420*w*) is not as heavily doped with nanoparticles as the middle region 420*m*. The dimension of the middle region 420*m*, in which the linear array of LED chips 102 is exclusively disposed, in relation to the entire enclosure 108 is determined by a desired totality of considerations such as light conversion capability, bendability and thermal conductivity. Other things equal, the bigger the middle region 420*m* in relation to the entire enclosure 108, the LED filament 100 has greater light conversion capability and thermal conductivity but will be less bendable. A cross section perpendicular to the longitudinal axis of the LED filament 100 reveals the middle region 420*m* and other regions of the enclosure. R1 is a ratio of the area of the middle region 420*m* to the overall area of the cross section. Preferably, R1 is from 0.2 to 0.8. Most preferably, R1 is from 0.4 to 0.6.

In an embodiment, the middle region 420*m*, the top region 420*u*, and the lower region 420*w* can function as converters for converting color temperature. For example, the light emitted from the LED chips 102 may have a first color temperature, and the light passing through the middle region 420*m* may have a second color temperature. The second color temperature is less than the first color temperature, meaning that the color temperature of the light emitted from the LED chips 102 is converted by the middle region 420*m*. To achieve the conversion of the color temperature, the middle region 420*m* may contain certain phosphors or other optical particles. In addition, the light from the middle region 420m passing through the top region 420u or the lower region 420w may have a third color temperature. The third color temperature is less than the second color temperature, meaning that the color temperature of the light passing through the middle region 420m is further converted by the top region 420u or the lower region 420w. The first, second, and third color temperatures are different from one another. In other words, the light emitted from the LED chips 102 may have a main wavelength, the light passing through the middle region 420m may have another main wavelength, and the light further passing through the top region 420u or the lower region 420w may have yet another main wavelength. In the embodiment, most of the light may pass through the middle region 420m and then pass through the upper region 420u or the lower region 420w along the light illuminating direction of the linear array of LED chips 102; however, a lateral portion of the middle region 420m is exposed from the enclosure 108, and thus a part of the light may directly pass through the lateral portion of the middle region 420m to outside without passing through the top region 420u or the lower region 420w. In the embodiment, the lateral portion of the middle region 420m is not on the light illuminating direction of the linear array of LED chips 102; therefore, a trace amount of the light directly pass through the lateral portion of the middle region 420m to outside. The overall color temperature measured from outside of the LED filament 100 may be slightly greater than the third color temperature due to the trace amount of the light directly passing through the lateral portion of the middle region 420m.

Figure 20C:
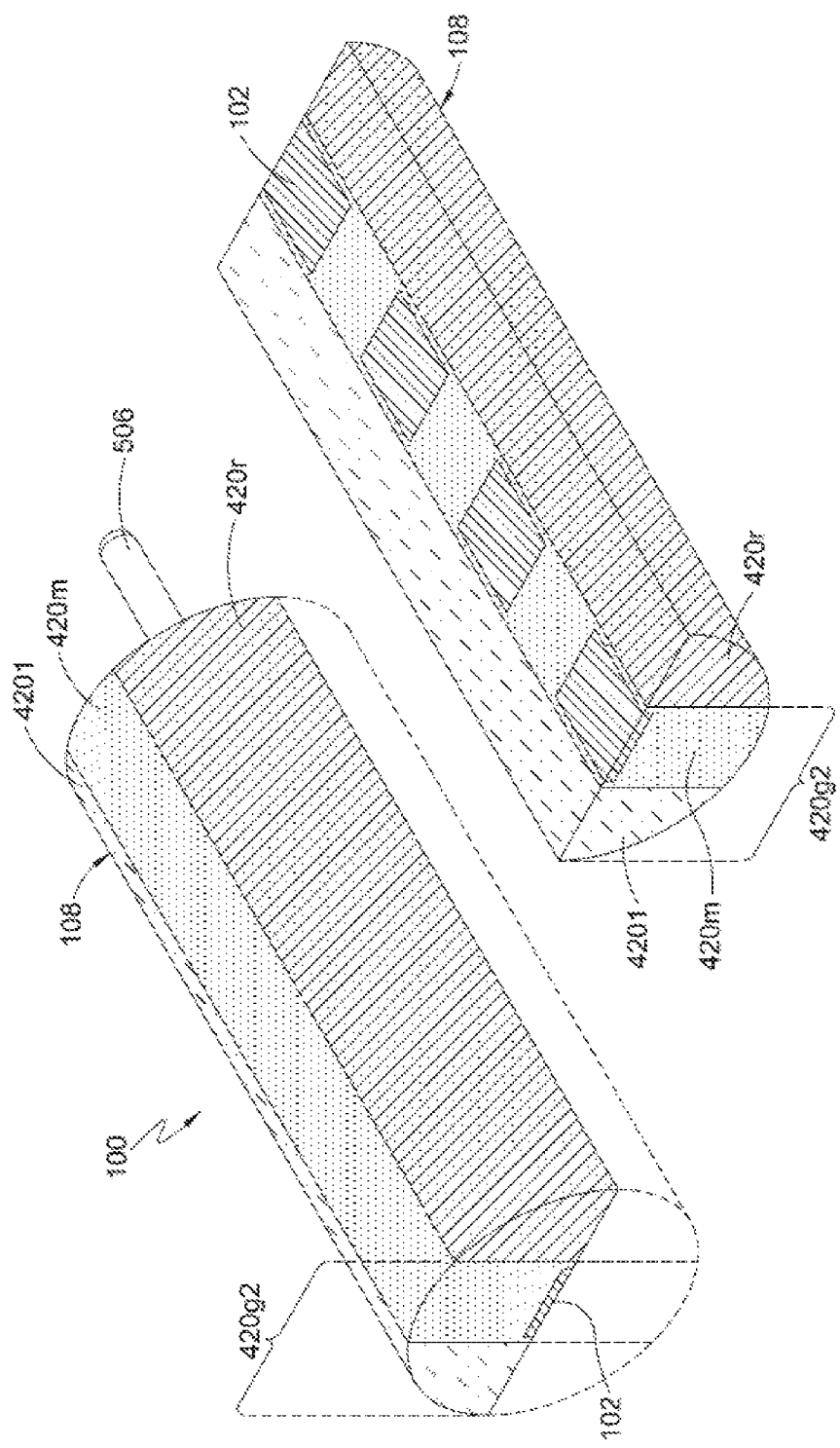

In FIG. 20C, the truncated LED filament 100 is further sliced horizontally—i.e. perpendicular to the light illuminating direction of the linear array of LED chips 102—into equal halves along the longitudinal axis of the LED filament 100 to show its internal structure. The regions of the enclosure 108 are defined by a hypothetical plane parallel to the light illuminating direction of the linear array of LED chips 102. For example, the enclosure 108 includes three regions 420l, 420m, 420r defined by a hypothetical pair of planes compartmentalizing the enclosure 108 into a right region 420r, a left region 420l and a middle region 420m sandwiched by the right region 420r and the left region 420l. The linear array of LED chips 102 is disposed exclusively in one of the regions of the enclosure 108. Alternatively, the linear array of LED chips 102 is absent from at least one of the regions of the enclosure 108. Alternatively, the linear array of LED chips 102 is disposed in all regions of the enclosure 108. In FIG. 20C, the linear array of LED chips 102 is disposed exclusively in the middle region 420m of the enclosure 108 and is spaced apart by the middle region 420m from the right region 420r and the left region 420l. In an embodiment, the middle region 420m includes a wavelength converter for converting blue light emitting from the LED chip 102 into white light. The right region 420r includes a cylindrical lens for aligning the light beaming rightwards. The left region 420l includes a cylindrical lens for aligning the light beaming leftwards. In another embodiment, the middle region 420m is made harder than the right region 420r, the left region 420l or both by, for example, embedding a greater concentration of phosphor particles in the middle region 420m than in the right region 420r, the left region 420l or both. The middle region 420m, because it is harder, is thus configured to better protect the linear array of LED chips 102 from malfunctioning when the LED filament 100 is bent to maintain a desired posture in a light bulb. The right region 420r (or the left region 420l) is made softer for keeping the entire LED filament 100 as bendable in the light bulb as it requires for generating omnidirectional light with, preferably, exactly one LED filament 100. In yet another embodiment, the middle region 420m has greater thermal conductivity than the right region 420r, the left region 420l or both by, for example, doping a greater concentration of nanoparticles in the middle region 420m than in the right region 420r, the left region 420l or both. The middle region 420m, having greater thermal conductivity, is thus configured to better protect the linear array of LED chips 102 from degrading or burning by removing excess heat from the LED chip 102. The right region 420r (or the left region 420l), because it is spaced apart from the linear array of LED chips 102, plays a lesser role than the middle region 420m in cooling the LED chip 102. The cost for making the LED filament 100 is thus economized when the right region 420r (or the left region 420l) is not as heavily doped with nanoparticles as the middle region 420m. The dimension of the middle region 420m, in which the linear array of LED chips 102 is exclusively disposed, in relation to the entire enclosure 108 is determined by a desired totality of considerations such as light conversion capability, bendability and thermal conductivity. Other things equal, the bigger the middle region 420m in relation to the entire enclosure 108, the LED filament 100 has greater light conversion capability and thermal conductivity but will be less bendable. A cross section perpendicular to the longitudinal axis of the LED filament 100 reveals the middle region 420m and other regions of the enclosure 108. R2 is a ratio of the area of the middle region 420m to the overall area of the cross section. Preferably, R2 is from 0.2 to 0.8. Most preferably, R2 is from 0.4 to 0.6.

In an embodiment, the middle region 420m, the right region 420r, and the left region 420l can function as converters for converting color temperature. For example, the light emitted from the LED chips 102 may have a first color temperature, and the light passing through the middle region 420m may have a second color temperature. The second color temperature is less than the first color temperature, meaning that the color temperature of the light emitted from the LED chips 102 is converted by the middle region 420m. To achieve the conversion of the color temperature, the middle region 420m may contain certain phosphors or other optical particles. In addition, the light from the middle region 420m passing through the right region 420r or the left region 420l may have a third color temperature. The third color temperature is less than the second color temperature, meaning that the color temperature of the light passing through the middle region 420m is further converted by the right region 420r or the left region 420l. The first, second, and third color temperatures are different from one another. In other words, the light emitted from the LED chips 102 may have a main wavelength, the light passing through the middle region 420m may have another main wavelength, and the light further passing through the right region 420r or the left region 420l may have yet another main wavelength. In the embodiment, less of the light may pass through the middle region 420m and then pass through the upper region 420u or the left region 420l along the light illuminating direction of the linear array of LED chips 102 comparing to the above embodiment shown in FIG. 20B. A lateral portion of the middle region 420m is exposed from the enclosure 108, and thus a part of the light may directly pass through the lateral portion of the middle region 420m to outside without passing through the right region 420r or the left region 420l. In the embodiment, the lateral portion of the middle region 420m is exactly on the light illuminating direction of the linear array of LED chips 102; therefore, a large amount of the light directly pass through the lateral portion of the middle region 420m to outside. The overall color temperature measured from outside of the LED filament 100 may be significantly greater than the third color temperature due to the large amount of the light directly passing through the lateral portion of the middle region 420m.

Figure 20D:
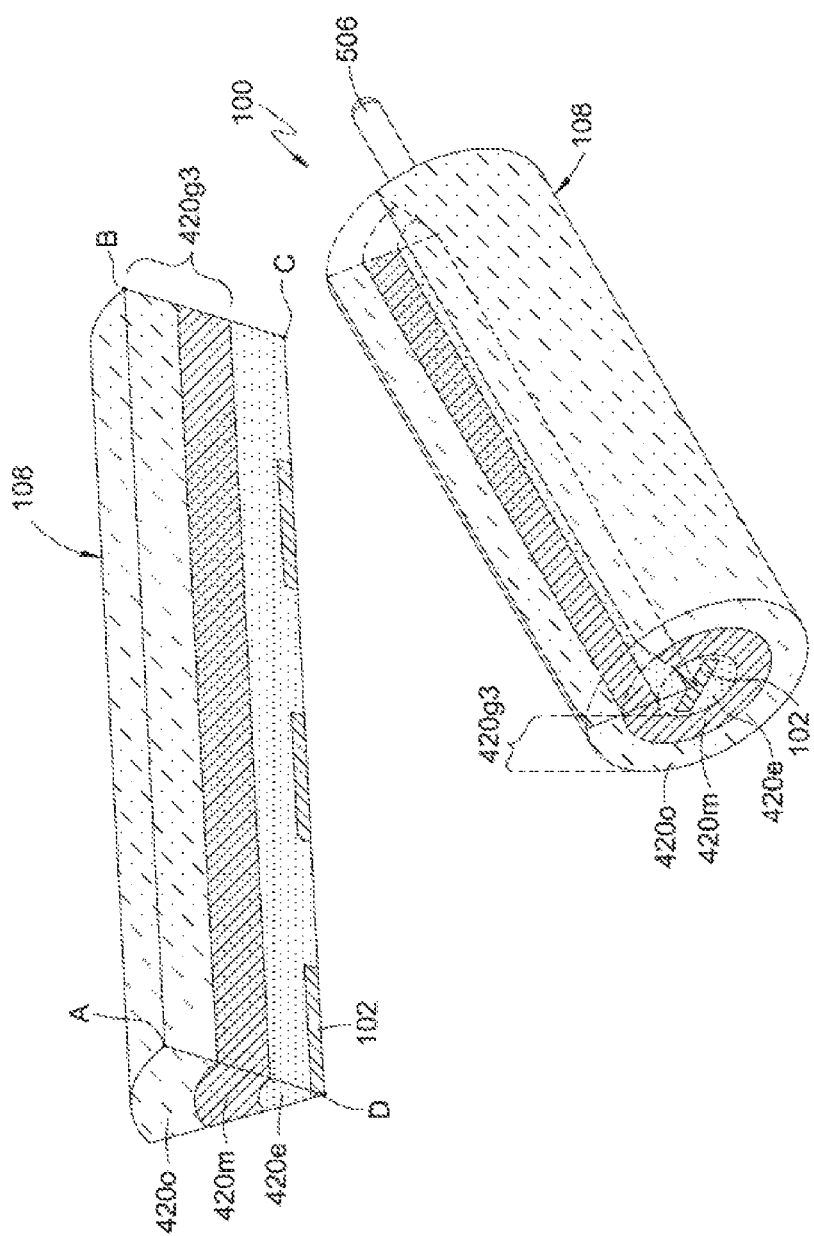
FIG. 20D and FIG. 20E respectively illustrate a truncated LED filaments carved into two portions according to an embodiment of the present disclosure.

In FIG. 20D, the truncated LED filament 100 is further carved into a small portion and a big portion to show its internal structure. The small portion is defined by revolving the rectangle ABCD around the line CD (i.e. the central axis of the LED filament 100) for a fraction of 360 degrees. Likewise, the big portion is defined by revolving the rectangle ABCD around the line CD but for the entirety of 360 degrees except for the space taken by the small portion. The regions of the enclosure 108 are defined by a hypothetical cylindrical surface having the central axis of the LED filament 100 as its central axis. For example, the enclosure 108 includes three regions 420e, 420m, 420o defined by a hypothetical pair of coaxial cylindrical surfaces compartmentalizing the enclosure 108 into a core region 420e, an outer region 420o and a middle region 420m sandwiched by the core region 420e and the outer region 420o. The linear array of LED chips 102 is disposed exclusively in one of the regions of the enclosure 108. Alternatively, the linear array of LED chips 102 is absent from at least one of the regions of the enclosure 108. Alternatively, the linear array of LED chips 102 is disposed in all regions of the enclosure 108. In FIG. 20D, the linear array of LED chips 102 is disposed exclusively in the core region 420e of the enclosure 108 and is spaced apart by the core region 420e from the middle region 420m and the outer region 420o. In an embodiment, the outer region 420o includes a light scatterer for increasing light extraction from the LED chip 102 by reducing total internal reflection. The middle region 420m includes a wavelength converter for converting blue light emitting from the LED chip 102 into white light. The core region 420e includes a spacer. The spacer prevents heat coming from the LED chip 102 from quickly degrading the phosphor particle in the wavelength converter by keeping the phosphor particle apart from the LED chip 102. Moreover, the spacer enables a uniform thickness of the middle region 420m, which includes the wavelength converter, to produce uniform white light, which entails a proper combination of blue light and the phosphor light. In another embodiment, the middle region 420m is made harder than the core region 420e, the outer region 420o or both by, for example, embedding a greater concentration of phosphor particles in the middle region 420m than in the core region 420e, the outer region 420o or both. The middle region 420m, because it is harder, is thus configured to better protect the linear array of LED chips 102 from malfunctioning when the LED filament 100 is bent to maintain a desired posture in a light bulb. The core region 420e (or the outer region 420o) is made softer for keeping the entire LED filament 100 as bendable in the light bulb as it requires for generating omnidirectional light with, preferably, exactly one LED filament 100. In yet another embodiment, the core region 420e has greater thermal conductivity than the middle region 420m, the outer region 420o or both by, for example, doping a greater concentration of such particles as nanoparticles, aluminium oxide, aluminium nitride and boron nitride in the core region 420e than in the middle region 420m, the outer region 420o or both. These particles are electrical insulators while having greater heat conductivity than phosphor particles. The core region 420e, having greater thermal conductivity, is thus configured to better protect the linear array of LED chips 102 from degrading or burning by removing excess heat from the LED chip 102. The middle region 420m (or the outer region 420o), because it is spaced apart from the linear array of LED chips 102, plays a lesser role than the core region 420e in cooling the LED chip 102 through heat conduction. The cost for making the LED filament 100 is thus economized when the outer region 420o (or the middle region 420m) is not as heavily doped with nanoparticles as the core region 420e. In still another embodiment, the outer region 420o has greater thermal radiation power than the middle region 420m, the core region 420e or both by, for example, doping a greater concentration of such particles as nanoparticles, graphene, nano-silver, carbon nanotube and aluminium nitride in the outer region 420o than in the middle region 420m, the core region 420e or both. These particles have greater thermal radiation power than the optically transmissive binder and greater thermal conductivity than phosphor particles. The outer region 420o, having greater thermal conductivity, is thus configured to better protect the linear array of LED chips 102 from degrading or burning by removing excess heat from the LED chip 102. The core region 420e (or the outer region 4200), because of their weaker thermal radiation power, plays a lesser role than the outer region 420o in cooling the LED chip 102 through thermal radiation. The cost for making the LED filament 100 is thus economized when the core region 420m (or the middle region 420m) is not as heavily doped with nanoparticles as the outer region 420o. These particles are electrical insulators while having greater heat conductivity than phosphor particles. The core region 420e, having greater thermal conductivity, is thus configured to better protect the linear array of LED chips 102 from degrading or burning by removing excess heat from the LED chip 102. The middle region 420m (or the outer region 420o), because it is spaced apart from the linear array of LED chips 102, plays a lesser role than the core region 420e in cooling the LED chip 102 through heat conduction. The cost for making the LED filament 100 is thus economized when the outer region 420o (or the middle region 420m) is not as heavily doped with nanoparticles as the core region 420e. To enhance the ability of the LED filament 100 to reveal colors of objects faithfully in comparison with an ideal or natural light source, in still another embodiment, the core region 420e has an excitation spectrum (and/or emission spectrum) induced at shorter wavelengths than the middle region 420m, the outer region 420o or both by, for example, doping a greater concentration of such particles as phosphors in the core region 420e than in the middle region 420m, the outer region 420o or both. The core region 420e is responsible for converting light coming from the LED chip 102 at the ultraviolet range into the visible spectrum. Other regions 420m, 420o of the LED filament 100 are responsible for, by contrast, further converting light coming from the core region 420e into light having even longer wavelengths. In an embodiment, the core region 420e is doped with a greater concentration of phosphor particles than the middle region 420m, the outer region 420o or both. The middle region 420m, which is optional in some embodiments, includes a luminescent dye for converting light coming from the core region 420e into light having longer wavelengths and a lesser concentration of phosphor particles than the core region 420e. The outer region 420o includes a luminescent dye for converting light coming from the core region 420e into light having longer wavelengths but includes no phosphor particles for keeping high flexibility of the LED filament 100. The dimension of the core region 420e, in which the linear array of LED chips 102 is exclusively disposed, in relation to the entire enclosure 108 is determined by a desired totality of considerations such as light conversion capability, bendability and thermal conductivity. Other things equal, the bigger the core region 420e in relation to the entire enclosure 108, the LED filament 100 has less light conversion capability and thermal conductivity but will be more bendable. A cross section perpendicular to the longitudinal axis of the LED filament 100 reveals the core region 420e and other regions of the enclosure 108. R3 is a ratio of the area of the core region 420e to the overall area of the cross section. Preferably, R3 is from 0.1 to 0.8. Most preferably, R3 is from 0.2 to 0.5. The dimension of the middle region 420m, which includes the wavelength converter, in relation to the entire enclosure 108 is determined by a desired totality of considerations such as light conversion capability, bendability and thermal conductivity. Other things equal, the bigger the middle region 420m in relation to the entire enclosure 108, the LED filament 100 has greater light conversion capability and thermal conductivity but will be less bendable. A cross section perpendicular to the longitudinal axis of the LED filament 100 reveals the middle region 420m and other regions of the enclosure 108. R4 is a ratio of the area of the middle region 420m to the overall area of the cross section. Preferably, R4 is from 0.1 to 0.8. Most preferably, R4 is from 0.2 to 0.5.

In an embodiment, the middle region 420m, the core region 420e, and the outer region 420o can function as converters for converting color temperature. For example, the light emitted from the LED chips 102 may have a first color temperature, and the light passing through the core region 420e may have a second color temperature. The second color temperature is less than the first color temperature, meaning that the color temperature of the light emitted from the LED chips 102 is converted by the core region 420e. To achieve the conversion of the color temperature, the core region 420m may contain certain phosphors or other optical particles. In addition, the light from the core region 420e passing through the middle region 420m may have a third color temperature. The third color temperature is less than the second color temperature, meaning that the color temperature of the light passing through the core region 420e is further converted by the middle region 420m. The light from the middle region 420m passing through the outer region 420o may have a fourth color temperature. The fourth color temperature is less than the third color temperature, meaning that the color temperature of the light passing through the middle region 420m is further converted by the outer region 420o. The first, second, third, and fourth color temperatures are different from one another. In other words, the light emitted from the LED chips 102 may have a first main wavelength, the light passing through the core region 420e may have a second main wavelength, the light further passing through the middle region 420m may have a third main wavelength, and the light eventually passing through the outer region 420o may have a fourth main wavelength. In the embodiment, the core region 420e completely encloses the LED chips 102, the middle region 420m completely encloses the core region 420e, and the outer region 420o completely encloses the middle region 420m. As a result, all of the light passes through the core region 420e, the middle region 420m, and the outer region 420o in sequence. The overall color temperature measured from outside of the LED filament 100 may be substantially equal to the fourth color temperature.

Figure 20E:
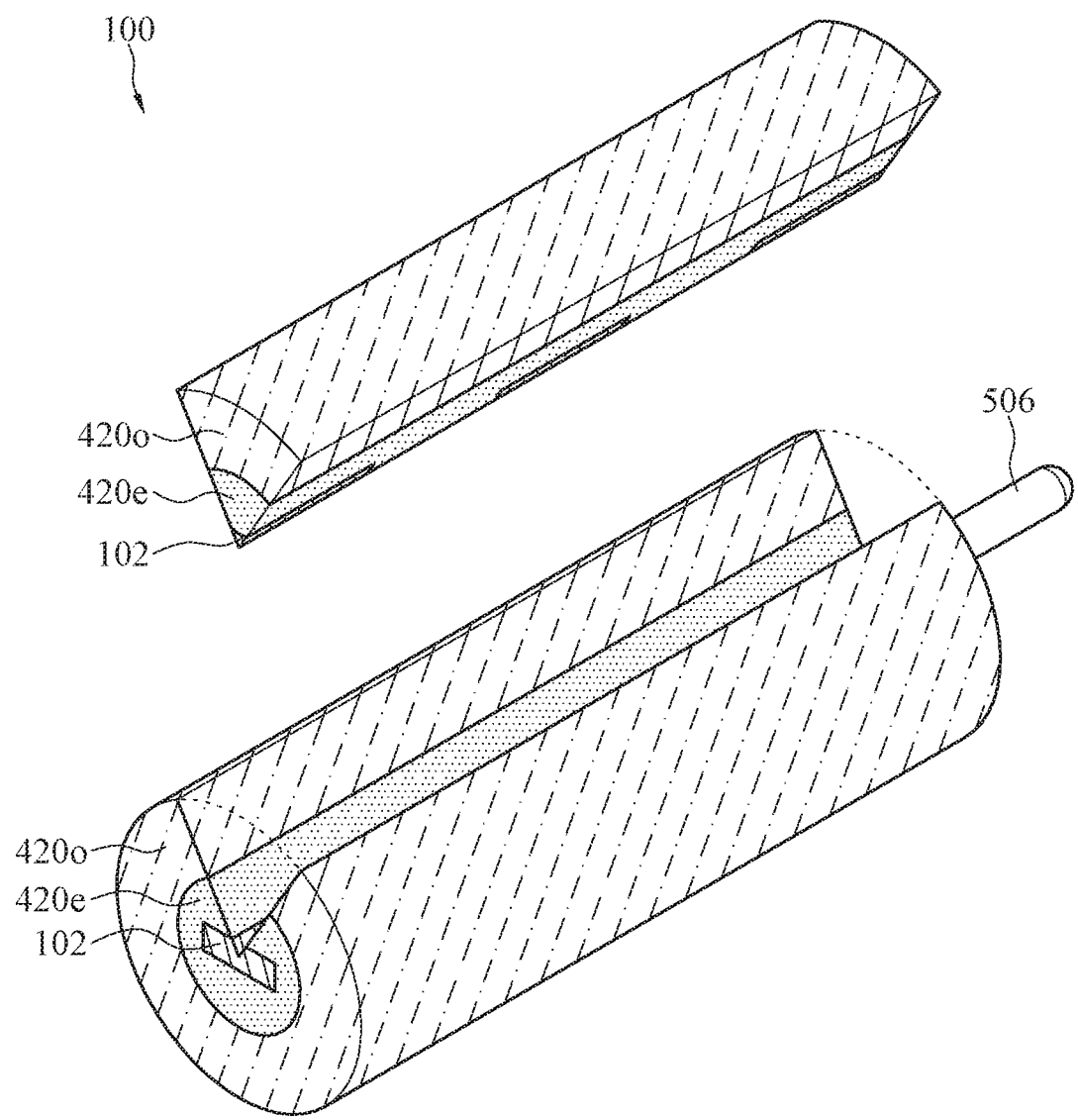

As shown in FIG. 20E, a difference between the enclosure 108 in FIG. 20E and the enclosure 108 in FIG. 20D is that the enclosure 108 in FIG. 20E includes two regions 420e, 420o defined by a hypothetical pair of coaxial cylindrical surfaces compartmentalizing the enclosure 108 into a core region 420e and an outer region 420o. The linear array of LED chips 102 is disposed exclusively in the core region 420e of the enclosure 108 and is spaced apart by the core region 420e from the outer region 420o. In an embodiment, the outer region 420o includes a light scatterer for increasing light extraction from the LED chip 102 by reducing total internal reflection and a wavelength converter for converting blue light emitting from the LED chip 102 into white light. In another embodiment, the outer region 420o is made harder than the core region 420e for protecting the LED chips 102. In yet another embodiment, the core region 420e has greater thermal conductivity than the outer region 420o. The core region 420e, having greater thermal conductivity, is thus configured to better protect the linear array of LED chips 102 from degrading or burning by removing excess heat from the LED chip 102. The outer region 420o, because it is spaced apart from the linear array of LED chips 102, plays a lesser role than the core region 420e in cooling the LED chip 102 through heat conduction. In still another embodiment, the outer region 420o has greater thermal radiation power than the core region 420e. The outer region 420o, having greater thermal conductivity, is thus configured to better protect the linear array of LED chips 102 from degrading or burning by removing excess heat from the LED chip 102. The core region 420e, because of their weaker thermal radiation power, plays a lesser role than the outer region 420o in cooling the LED chip 102 through thermal radiation. The core region 420e, having greater thermal conductivity, is thus configured to better protect the linear array of LED chips 102 from degrading or burning by removing excess heat from the LED chip 102. To enhance the ability of the LED filament 100 to reveal colors of objects faithfully in comparison with an ideal or natural light source, in still another embodiment, the core region 420e has an excitation spectrum (and/or emission spectrum) induced at shorter wavelengths than the outer region 420o. The core region 420e is responsible for converting light coming from the LED chip 102 at the ultraviolet range into the visible spectrum. The outer region 420o of the LED filament 100 is responsible for, by contrast, further converting light coming from the core region 420e into light having even longer wavelengths. In an embodiment, the core region 420e is doped with a greater concentration of phosphor particles than the outer region 420o. The outer region 420o, which is optional in some embodiments, includes a luminescent dye for converting light coming from the core region 420e into light having longer wavelengths and a lesser concentration of phosphor particles than the core region 420e. The outer region 420o also includes a luminescent dye for converting light coming from the core region 420e into light having longer wavelengths but includes no phosphor particles for keeping high flexibility of the LED filament 100. The dimension of the core region 420e, in which the linear array of LED chips 102 is exclusively disposed, in relation to the entire enclosure 108 is determined by a desired totality of considerations such as light conversion capability, bendability and thermal conductivity. Other things equal, the bigger the core region 420e in relation to the entire enclosure 108, the LED filament 100 has less light conversion capability and thermal conductivity but will be more bendable.

The LED bulb lamps according to various different embodiments of the present invention are described as above. With respect to an entire LED bulb lamp, the features including "having an electrical isolation assembly disposed on the LED lamp substrate", "adopting an electrical isolation unit covering the LED lamp substrate for electrically isolating", "having a light processing unit disposed on the electrical isolation unit for converting the outputting direction of the light emitted by the LED light sources", "having an extending portion outwardly extended from the circumferential of the bottom portion of the light processing unit", "coating an adhesive film on the inside surface or outside surface of the lamp housing or both", "coating a diffusion film on the inside surface or outside surface of the lamp housing or both", and "coating a reflecting film on the inside surface of the lamp housing", may be applied in practice singly or integrally such that only one of the features is practiced or a number of the features are simultaneously practiced.

It should be understood that the above described embodiments are merely preferred embodiments of the invention, but not intended to limit the invention. Any modifications, equivalent alternations and improvements, or any direct and indirect applications in other related technical field that are made within the spirit and scope of the invention described in the specification and the figures should be included in the protection scope of the invention.

What is claimed is:

1. An LED filament comprising:
    a plurality of LED chips arranged in an array and electrically connected with one another;
    two conductive electrodes disposed corresponding to the LED chips at two ends of the array, respectively;
    a plurality of conductive wires comprising a plurality of first conductive wires and two second conductive wires, the plurality of the first conductive wires respectively electrically connecting every two adjacent LED chips of the array, and the two second conductive wires respectively connecting the two conductive electrodes with the LED chips at the two ends of the array;
    an enclosure coating on at least two sides of the array and the two conductive electrodes, a portion of each of the two conductive electrodes being exposed from the enclosure; and
    at least one auxiliary piece disposed in the enclosure coating and overlapping at least one of the two second conductive wires on a radial direction of the LED filament.

2. The LED filament of claim 1, wherein each of the two conductive electrodes comprises a connecting region electrically connected to the corresponding LED chip at the end of the array via one of the two second conductive wires, and the at least one auxiliary piece extends from a side of the corresponding connecting region along an axial direction of the LED filament.

3. The LED filament of claim 2, wherein the at least one auxiliary piece is connected to a side of the corresponding connecting region.

4. The LED filament of claim 2, wherein the at least one auxiliary piece further overlaps at least a portion of the corresponding connecting region and at least a portion of the corresponding LED chip at the end of the array on the radial direction of the LED filament.

5. The LED filament of claim 2, wherein a width of the connecting region on the radial direction of the LED filament is equal to a width of the enclosure on the radial direction of the LED filament.

6. The LED filament of claim 2, wherein a width of the at least one auxiliary piece on the radial direction of the LED filament is less than a width of the connecting region on the radial direction of the LED filament.

7. The LED filament of claim 1, wherein the at least one auxiliary piece further overlaps one or more of the LED chips on the radial direction.

8. The LED filament of claim 1, wherein the at least one auxiliary piece further overlaps all of the first conductive wires on the radial direction.

9. The LED filament of claim 1, wherein the number of the at least one auxiliary piece is two, and the two auxiliary pieces respectively overlap the two second conductive wires on the radial direction.

10. The LED filament of claim 1, wherein the number of the at least one auxiliary piece is two, and each of the two auxiliary pieces overlaps all of the first conductive wires on the radial direction.

11. The LED filament of claim 1, wherein the at least one auxiliary piece is divided into a plurality of segments, and the segments of the at least one auxiliary piece respectively overlap the first and second conductive wires on the radial direction.

12. The LED filament of claim 1, wherein the second conductive wire is shorter than the first conductive wire.

13. An LED filament comprising:
    a plurality of LED chips arranged in an array and electrically connected with one another;
    two conductive electrodes disposed corresponding to the LED chips at two ends of the array, respectively;
    a plurality of conductive wires comprising a plurality of first conductive wires and two second conductive wires, the plurality of the first conductive wires respectively electrically connecting every two adjacent LED chips of the array, and the two second conductive wires respectively connecting of the two conductive electrodes with the LED chips at the two ends of the array;
    an enclosure coating on at least two sides of the array and the two conductive electrodes, a portion of each of the two conductive electrodes being exposed from the enclosure; and
    at least one auxiliary piece disposed in the enclosure coating, the at least one auxiliary piece disposed at a side of at least one of the two second conductive wires and a side of the conductive electrode connecting to the at least one of the two second conductive wires.

14. The LED filament of claim 13, wherein each of the two conductive electrodes comprises a connecting region electrically connected to the corresponding LED chip at the end of the array via one of the two second conductive wires, and the at least one auxiliary piece extends from a side of the corresponding connecting region along the axial direction of the LED filament.

15. The LED filament of claim 14, wherein the at least one auxiliary piece is connected to a side of the corresponding connecting region.

16. The LED filament of claim 14, wherein a width of the connecting region on a radial direction of the LED filament is equal to a width of the enclosure on the radial direction of the LED filament.

17. The LED filament of claim 14, wherein a width of the at least one auxiliary piece on a radial direction of the LED filament is less than a width of the connecting region on the radial direction of the LED filament.

18. The LED filament of claim 13, wherein the at least one auxiliary piece overlaps one or more of the LED chips on a radial direction of the LED filament.

19. The LED filament of claim 13, wherein the at least one auxiliary piece overlaps all of the first conductive wires on a radial direction of the LED filament.

20. The LED filament of claim 13, wherein the number of the at least one auxiliary piece is two, and the two auxiliary pieces respectively overlap the two second conductive wires on a radial direction of the LED filament.

21. The LED filament of claim 13, wherein the number of the at least one auxiliary piece is two, and each of the two auxiliary pieces overlaps all of the first conductive wires on a radial direction of the LED filament.

22. The LED filament of claim 13, wherein the at least one auxiliary piece is divided into a plurality of segments, and the segments of the at least one auxiliary piece respectively overlap the first conductive wires on a radial direction of the LED filament.

23. The LED filament of claim 13, wherein the second conductive wire is shorter than the first conductive wire.

24. An LED light bulb, comprising:
a bulb shell;
a bulb base connected with the bulb shell;
two conductive supports disposed in the bulb shell;
a driving circuit electrically connected with the two conductive supports and the bulb base; and
an LED filament, comprising:
a plurality of LED chips arranged in an array and electrically connected with one another;
two conductive electrodes disposed corresponding to the LED chips at two ends of the array, respectively, wherein the two conductive electrodes are respectively connected to the two conductive supports;
a plurality of conductive wires comprising a plurality of first conductive wires and two second conductive wires, the plurality of the first conductive wires respectively electrically connecting every two adjacent LED chips of the array, and the two second conductive wires respectively connecting the two conductive electrodes with the LED chips at the two ends of the array;
an enclosure coating on at least two sides of the array and the two conductive electrodes, a portion of each of the two conductive electrodes being exposed from the enclosure; and
at least one auxiliary piece disposed in the enclosure coating and overlapping at least one of the two second conductive wires on a radial direction of the LED filament.

25. The LED light bulb of claim 24, wherein the bulb shell comprises an adhesive film applied to inside or outside surface of the bulb shell, and the adhesive film joins fragments of the bulb shell while the bulb shell is broken.

26. The LED light bulb of claim 24, wherein the at least one auxiliary piece further overlaps one or more of the LED chips on the radial direction.

27. The LED light bulb of claim 24, wherein the at least one auxiliary piece further overlaps all of the first conductive wires on the radial direction.

28. The LED light bulb of claim 24, wherein the number of the at least one auxiliary piece is two, and the two auxiliary pieces respectively overlap the two second conductive wires on the radial direction.

29. The LED light bulb of claim 24, wherein the number of the at least one auxiliary piece is two, and each of the two auxiliary pieces overlaps all of the first conductive wires on the radial direction.

30. The LED light bulb of claim 24, wherein the at least one auxiliary piece is divided into a plurality of segments, and the segments of the at least one auxiliary piece respectively overlap the first conductive wires on the radial direction.

31. An LED light bulb, comprising:
a bulb shell;
a bulb base connected with the bulb shell;
two conductive supports disposed in the bulb shell;
a driving circuit electrically connected with the two conductive supports and the bulb base; and
an LED filament, comprising:
a plurality of LED chips arranged in an array and electrically connected with one another;
two conductive electrodes disposed corresponding to the LED chips at two ends of the array, respectively, wherein the two conductive electrodes are respectively connected to the two conductive supports;
a plurality of conductive wires comprising a plurality of first conductive wires and two second conductive wires, the plurality of the first conductive wires respectively electrically connecting every two adjacent LED chips of the array, and the two second conductive wires respectively connecting the two conductive electrodes with the LED chips at the two ends of the array;
an enclosure coating on at least two sides of the array and the two conductive electrodes, a portion of each of the two conductive electrodes being exposed from the enclosure; and
at least one auxiliary piece disposed in the enclosure coating, the at least one auxiliary piece disposed at a side of at least one of the two second conductive wires and a side of the conductive electrode connecting to the at least one of the two second conductive wires.

32. The LED light bulb of claim 31, wherein the bulb shell comprises an adhesive film applied to inside or outside surface of the bulb shell, and the adhesive film joins fragments of the bulb shell while the bulb shell is broken.

33. The LED light bulb of claim 31, wherein the at least one auxiliary piece overlaps one or more of the LED chips on a radial direction of the LED filament.

34. The LED light bulb of claim 31, wherein the at least one auxiliary piece overlaps all of the first conductive wires on a radial direction of the LED filament.

35. The LED light bulb of claim 31, wherein the number of the at least one auxiliary piece is two, and the two auxiliary pieces respectively overlap the two second conductive wires on a radial direction of the LED filament.

36. The LED light bulb of claim 31, wherein the number of the at least one auxiliary piece is two, and each of the two auxiliary pieces overlaps all of the first conductive wires on a radial direction of the LED filament.

37. The LED light bulb of claim 31, wherein the at least one auxiliary piece is divided into a plurality of segments, and the segments of the at least one auxiliary piece respectively overlap the first conductive wires on a radial direction of the LED filament.

* * * * *